(12) United States Patent
Shibata

(10) Patent No.: US 8,077,514 B2
(45) Date of Patent: Dec. 13, 2011

(54) SEMICONDUCTOR MEMORY DEVICE CAPABLE OF MEMORIZING MULTIVALUED DATA

(75) Inventor: Noboru Shibata, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/876,845

(22) Filed: Sep. 7, 2010

(65) Prior Publication Data

US 2010/0329006 A1   Dec. 30, 2010

Related U.S. Application Data

(63) Continuation of application No. 11/556,388, filed on Nov. 3, 2006, now Pat. No. 7,813,170.

(30) Foreign Application Priority Data

Nov. 11, 2005   (JP) ................................. 2005-327827

(51) Int. Cl.
*G11C 11/34*   (2006.01)

(52) U.S. Cl. ......... 365/185.03; 365/185.11; 365/185.17; 365/185.24

(58) Field of Classification Search ............. 365/185.03, 365/185.11, 185.17, 185.24
See application file for complete search history.

(56) References Cited

U.S. PATENT DOCUMENTS

| | | | |
|---|---|---|---|
| 5,504,709 A | 4/1996 | Yabe et al. | |
| 5,959,319 A | 9/1999 | Iwasa | |
| 6,004,825 A | 12/1999 | Seyyedy | |
| 6,016,407 A | 1/2000 | Tsukahara | |
| 6,038,165 A | 3/2000 | Miwa et al. | |
| 6,134,140 A * | 10/2000 | Tanaka et al. ............ | 365/185.03 |
| 6,166,407 A | 12/2000 | Ohta | |
| 6,188,611 B1 | 2/2001 | Endoh et al. | |
| 6,266,270 B1 | 7/2001 | Nobukata | |
| 6,549,464 B2 | 4/2003 | Tanaka et al. | |
| 6,657,891 B1 | 12/2003 | Shibata et al. | |
| 6,744,670 B2 * | 6/2004 | Tamada et al. ........... | 365/185.19 |
| 6,804,164 B2 | 10/2004 | Fujino et al. | |
| 6,876,578 B2 * | 4/2005 | Shibata et al. ........... | 365/185.03 |
| 7,016,226 B2 * | 3/2006 | Shibata et al. ........... | 365/185.03 |
| 7,120,052 B2 * | 10/2006 | Shibata et al. ........... | 365/185.03 |
| 7,245,528 B2 * | 7/2007 | Shibata et al. ........... | 365/185.03 |
| 7,295,468 B2 * | 11/2007 | Shibata .................... | 365/185.03 |
| 7,376,009 B2 * | 5/2008 | Shibata et al. ........... | 365/185.03 |
| 7,388,790 B2 | 6/2008 | Maejima et al. | |
| 7,394,691 B2 * | 7/2008 | Shibata et al. ........... | 365/185.09 |
| 7,411,824 B2 * | 8/2008 | Shibata et al. ........... | 365/185.11 |
| 7,443,724 B2 * | 10/2008 | Shibata et al. ........... | 365/185.03 |
| 7,460,402 B2 * | 12/2008 | Shibata .................... | 365/185.17 |
| 7,471,580 B2 | 12/2008 | Henzler et al. | |
| 7,505,335 B2 * | 3/2009 | Shibata .................... | 365/189.17 |

FOREIGN PATENT DOCUMENTS

| | | |
|---|---|---|
| JP | 9-326197 | 12/1997 |
| JP | 10-3792 | 1/1998 |
| JP | 2000-276887 | 10/2000 |
| JP | 2001-167590 | 6/2001 |
| JP | 2004-192789 | 7/2004 |

* cited by examiner

*Primary Examiner* — Viet Q Nguyen

(74) *Attorney, Agent, or Firm* — Oblon, Spivak, McClelland, Maier & Neustadt, L.L.P.

(57) ABSTRACT

In a memory cell array, a plurality of memory cells connected to word lines and bit lines are arranged in a matrix. A data storage circuit is connected to the bit lines and stores write data. The data storage circuit includes at least one static latch circuit and a plurality of dynamic latch circuits when setting $2^k$ threshold voltages (k is a natural number equal to 3 or more) in each memory cell in the memory cell array. A control circuit refreshes data by moving the data in one of the plurality of dynamic latch circuits to the static latch circuit and further moving the data in the static latch circuit to one of the plurality of dynamic latch circuits.

8 Claims, 39 Drawing Sheets

| | | | | | | | | | | | | | | | | |
|---|---|---|---|---|---|---|---|---|---|---|---|---|---|---|---|---|
| Top page | 1 | 0 | 0 | 1 | 1 | 0 | 0 | 1 | 1 | 0 | 0 | 1 | 1 | 0 | 0 | 1 |
| Higher page | 1 | 1 | 0 | 0 | 0 | 0 | 1 | 1 | 1 | 1 | 0 | 0 | 0 | 0 | 1 | 1 |
| Upper page | 1 | 1 | 1 | 1 | 0 | 0 | 0 | 0 | 0 | 0 | 0 | 0 | 1 | 1 | 1 | 1 |
| Lower page | 1 | 1 | 1 | 1 | 1 | 1 | 1 | 1 | 0 | 0 | 0 | 0 | 0 | 0 | 0 | 0 |

| | | | | | | | | | | | | | | | | |
|---|---|---|---|---|---|---|---|---|---|---|---|---|---|---|---|---|
| R & V level | 0 | 1 | 2 | 3 | 4 | 5 | 6 | 7 | 8 | 9 | A | B | C | D | E | F |
| VL(3) | 0 | 0 | 0 | 0 | 0 | 0 | 0 | 0 | 1 | 1 | 1 | 1 | 1 | 1 | 1 | 1 |
| VL(2) | 0 | 0 | 0 | 0 | 1 | 1 | 1 | 1 | 0 | 0 | 0 | 0 | 1 | 1 | 1 | 1 |
| VL(1) | 0 | 0 | 1 | 1 | 0 | 0 | 1 | 1 | 0 | 0 | 1 | 1 | 0 | 0 | 1 | 1 |
| VL(0) | 0 | 1 | 0 | 1 | 0 | 1 | 0 | 1 | 0 | 1 | 0 | 1 | 0 | 1 | 0 | 1 |

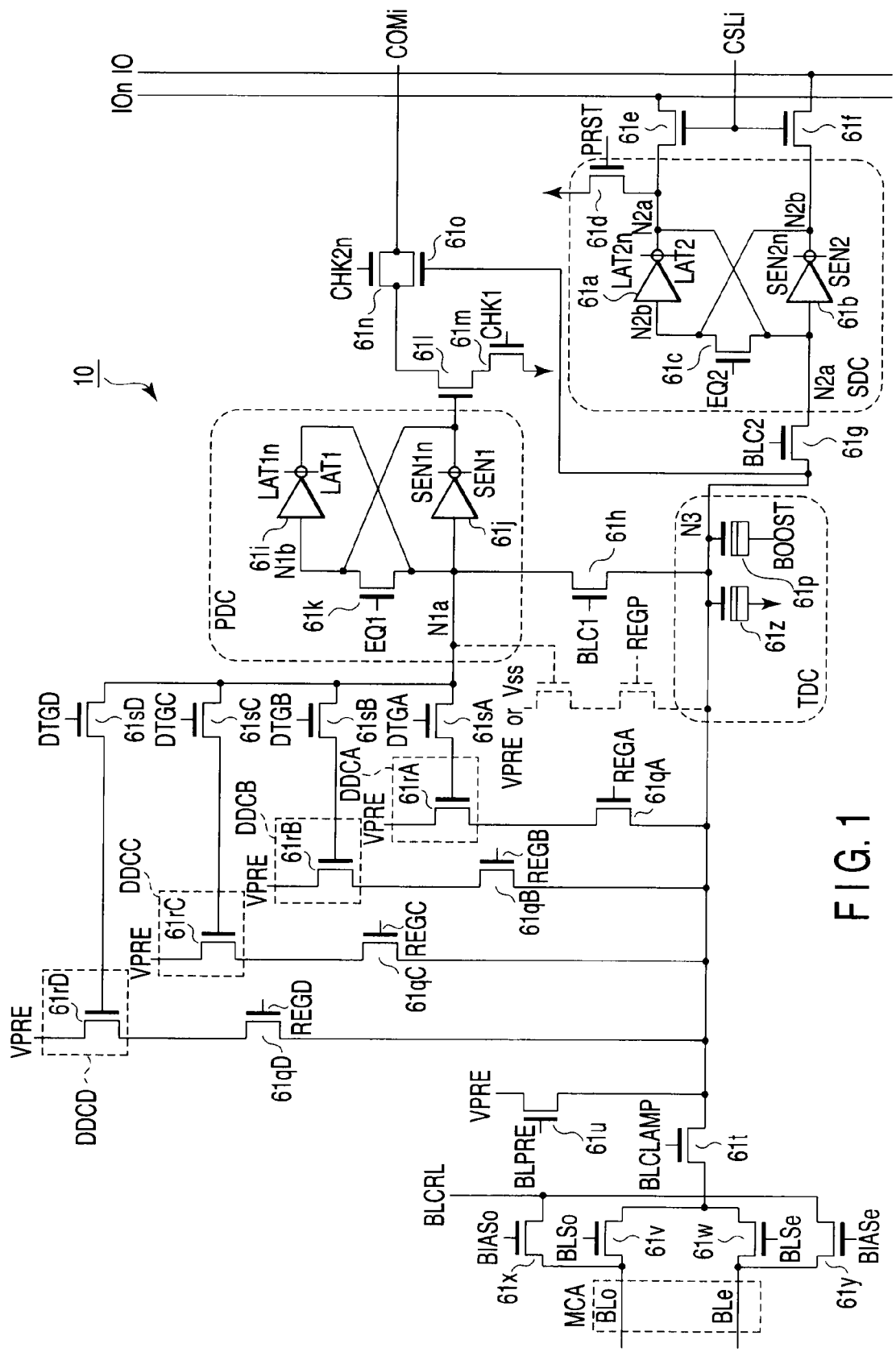
F I G. 1

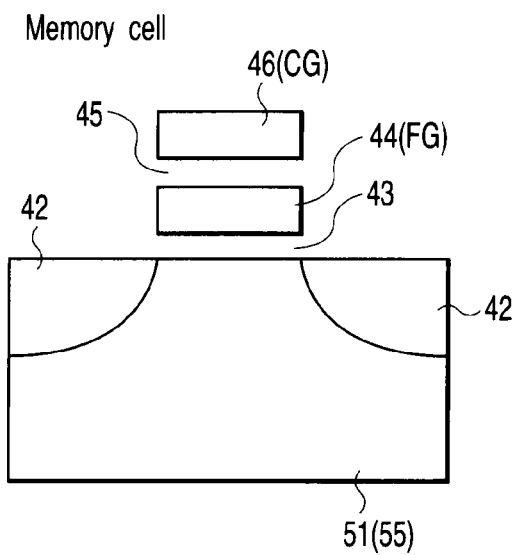
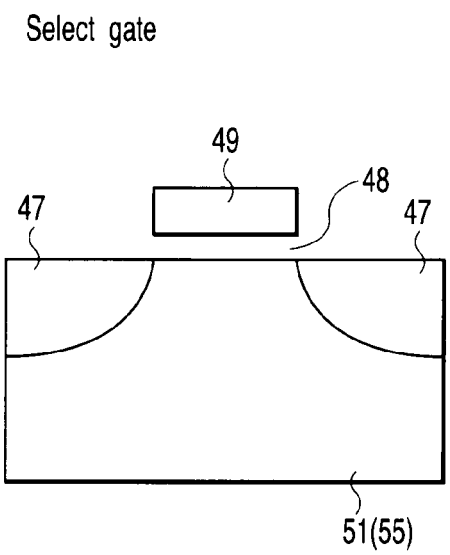
FIG. 4A
FIG. 4B

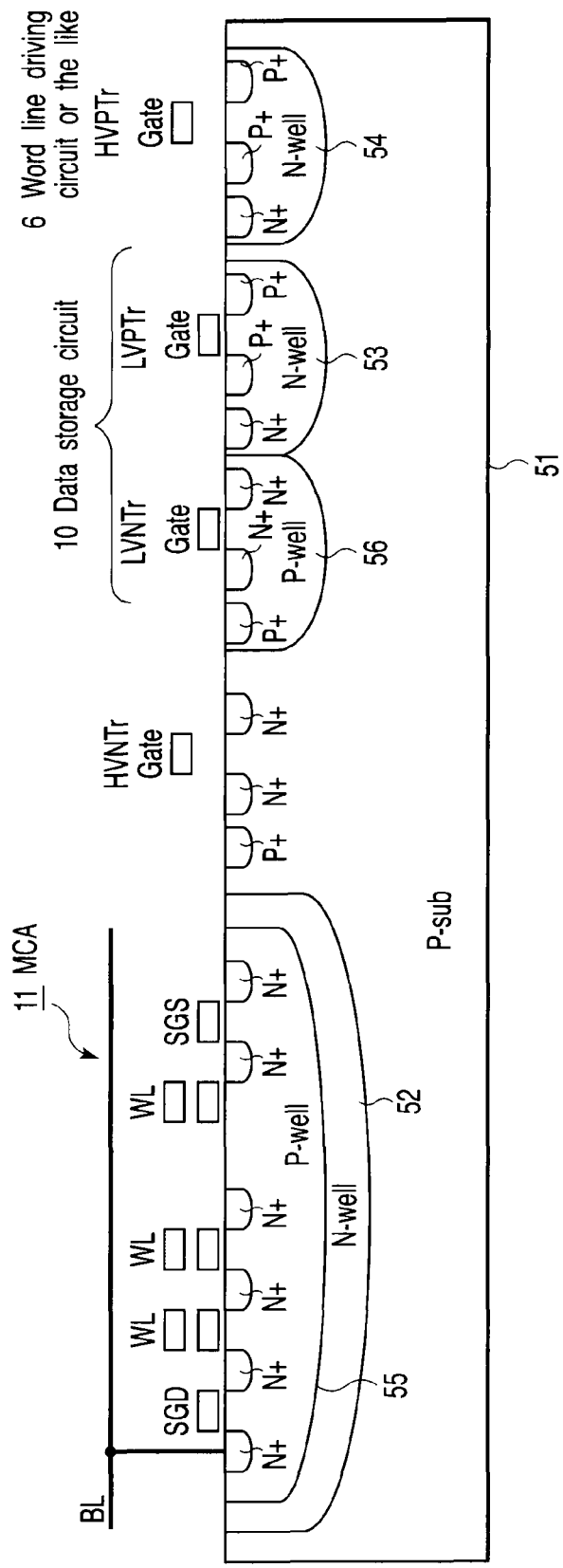
F I G. 5

|  | Cell (P-well) | Cell (N-well) | H.V.Tr (P-sub) | L.V.Nch (P-well) | L.V.Pch (N-well) | H.V.Pch (N-well) |
|---|---|---|---|---|---|---|
| Erase | Vera (20V) | Vera (20V) | Vss (0V) | Vss (0V) | Vdd (2.5V) | Vdd (2.5V) |
| Program | Vss (0V) | Vss (0V) | Vss (0V) | Vss (0V) | Vdd (2.5V) | Vdd (2.5V) / Vpgmh |
| Read | Vfix (1.6V) | Vfix (1.6V) | Vss (0V) | Vss (0V) | Vdd (2.5V) | Vdd (2.5V) / Vreadh |

F I G. 6

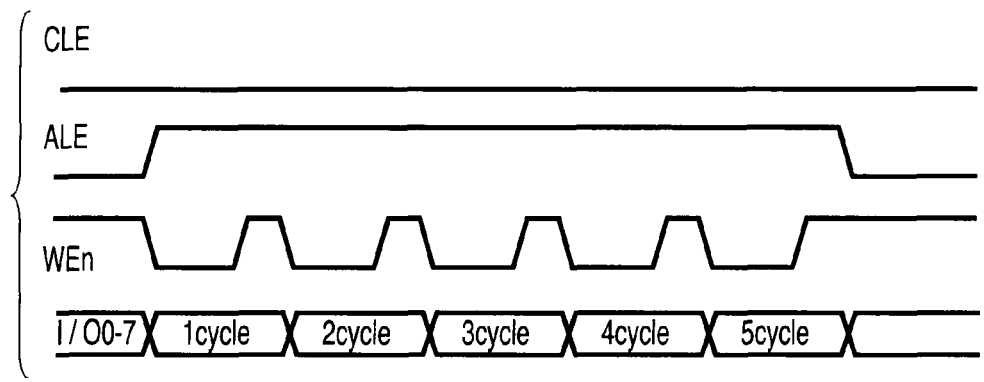
FIG. 7
| I/O Input cycle | I/O0 | I/O1 | I/O2 | I/O3 | I/O4 | I/O5 | I/O6 | I/O7 |
|---|---|---|---|---|---|---|---|---|
| 1 | A0 | A1 | A2 | A3 | A4 | A5 | A6 | A7 |
|   | A0-A11 : Column address ||||||||
| 2 | A8 | A9 | A10 | A11 | A12 | A13 | A14 | A15 |
|   | A0-A11 : Column address |||| Don't Care ||||
| 3 | A16 | A17 | A18 | A19 | A20 | A21 | A22 | A23 |
|   | MLC address || BL e/o | W.L address |||||
| 4 | A24 | A25 | A26 | A27 | A28 | A29 | A30 | A31 |
|   | Block address ||||||||
| 5 | A32 | A33 | A34 | A36 |  |  |  |  |
|   | Block address ||| P.B. address |  |  |  |  |
FIG. 8
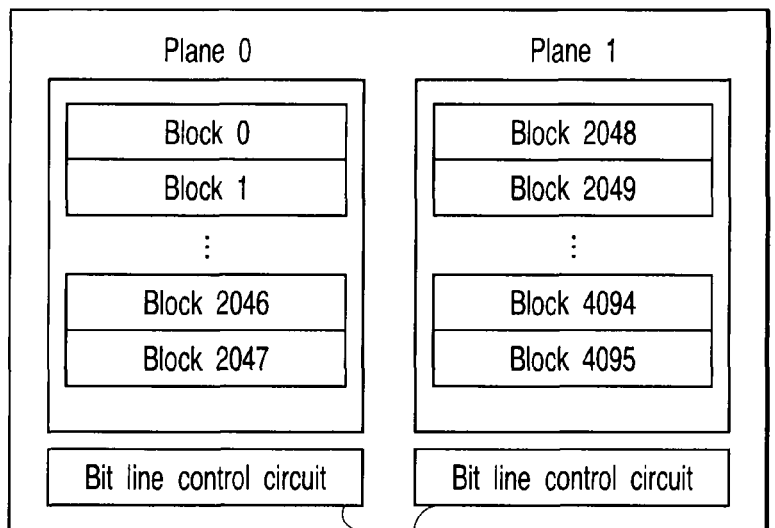
FIG. 9

| Figure | Command sequence (col 1) | Command sequence (col 2) | LV | Stage |
|---|---|---|---|---|
| FIG. 19A | 80h-Add (lower page)-Data-1Ah- | 80h-Add (upper page)-Data-10h/15h | 4LV | First stage |
| FIG. 19B | 80h-Add (lower page)-Data-10h/15h | | 2LV | |
| FIG. 19C | 80h-Add (lower page)-Data-1Ah- / 80h-Add (higher page)-Data-10h/15h | 80h-Add (upper page)-Data-10h/15h | 8LV | |
| FIG. 19D | 80h-Add (upper page)-Data-1Ah- | 80h-Add (lower page)-Data-10h/15h | 4LV | |
| FIG. 19E | 80h-Add (upper page)-Data-10h/15h | | 4LV Lower page internal data load | |
| FIG. 19F | 0Dh-80h-Add (lower page)-Data-1Ah- / 80h-Add (higher page)-Data-1Ah- | 80h-Add (upper page)-Data-1Ah- / 80h-Add (top page)-Data-10h/15h | 16LV-P | Second stage |
| FIG. 19G | 0Dh-80h-Add (higher page)-Data-1Ah- | 80h-Add (top page)-Data-10h/15h | 16LV-P Lower/upper page internal data load | |
| FIG. 19H | 80h-Add (lower page)-Data-1Ah- / 80h-Add (higher page)-Data-1Ah- | 80h-Add (upper page)-Data-1Ah- / 80h-Add (top page)-Data-10h/15h | 16LV | Third stage |
| FIG. 19I | 80h-Add (top page)-Data-1Ah- / 80h-Add (upper page)-Data-1Ah- | 80h-Add (higher page)-Data-1Ah- / 80h-Add (lower page)-Data-10h/15h | 16LV | |
| FIG. 19J | 80h-Add (lower page:Plane0)-Data-1Ah- / 80h-Add (upper page:Plane0)-Data-1Ah- / 80h-Add (higher page:Plane0)-Data-1Ah- / 80h-Add (top page:Plane0)-Data-1Ah- | 80h-Add (lower page:Plane1)-Data-1Ah- / 80h-Add (upper page:Plane1)-Data-1Ah- / 80h-Add (higher page:Plane1)-Data-1Ah- / 80h-Add (top page:Plane1)-Data-10h/15h | 16LV | |
| FIG. 19K | 80h-Add (lower page:Plane0)-Data-1Ah- / 80h-Add (higher page:Plane0)-Data-1Ah- / 80h-Add (lower page:Plane1)-Data-1Ah- / 80h-Add (higher page:Plane1)-Data-1Ah- | 80h-Add (upper page:Plane0)-Data-1Ah- / 80h-Add (top page:Plane0)-Data-1Ah- / 80h-Add (upper page:Plane1)-Data-1Ah- / 80h-Add (top page:Plane1)-Data-10h/15h | 16LV | |

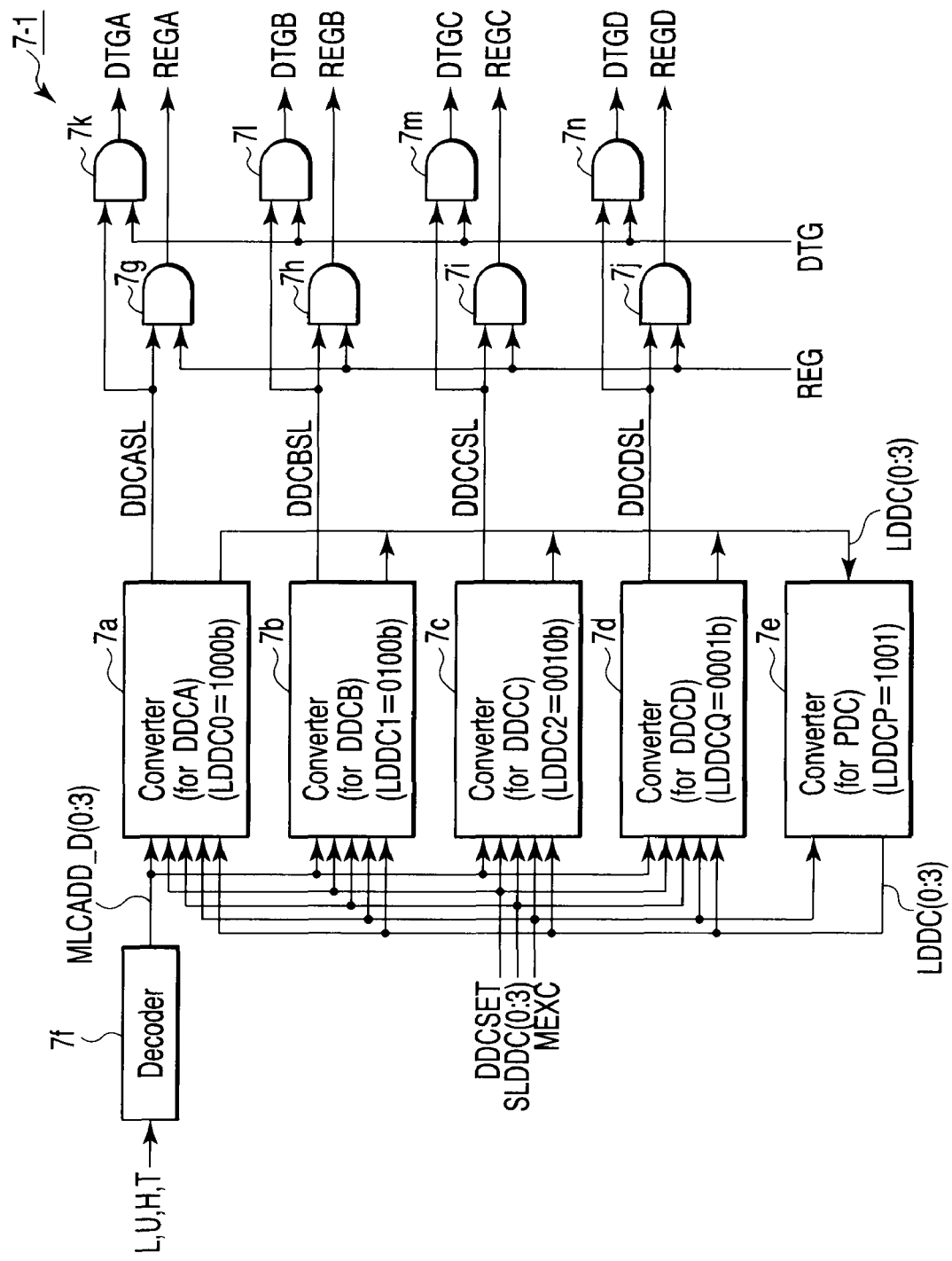
F I G. 20

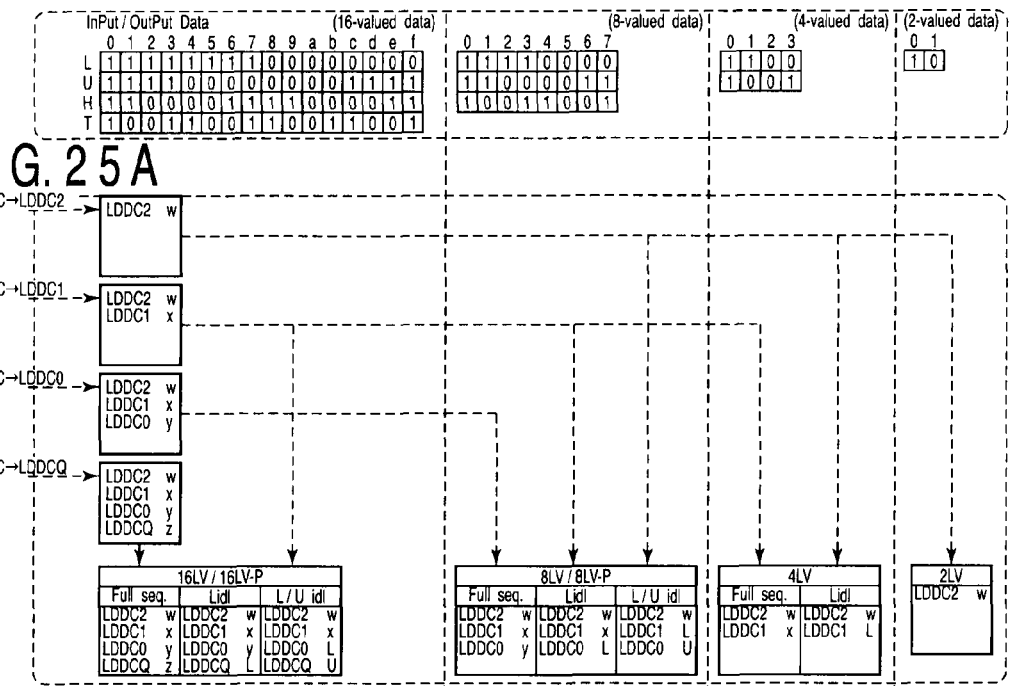
FIG. 25A
FIG. 25B
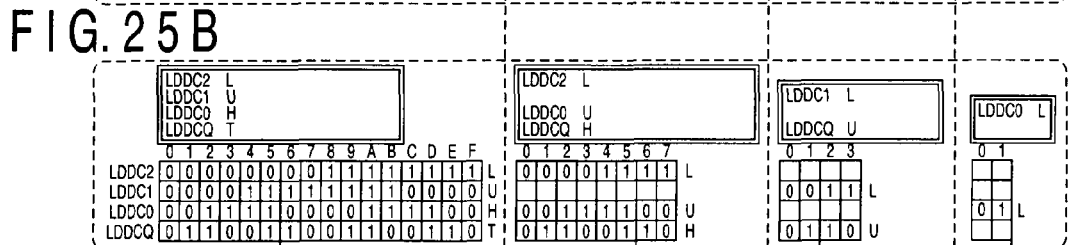
FIG. 25C
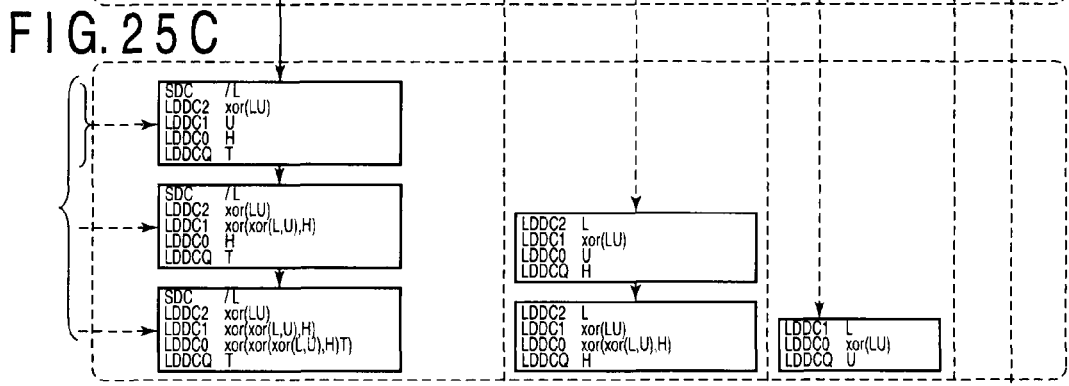
FIG. 25D
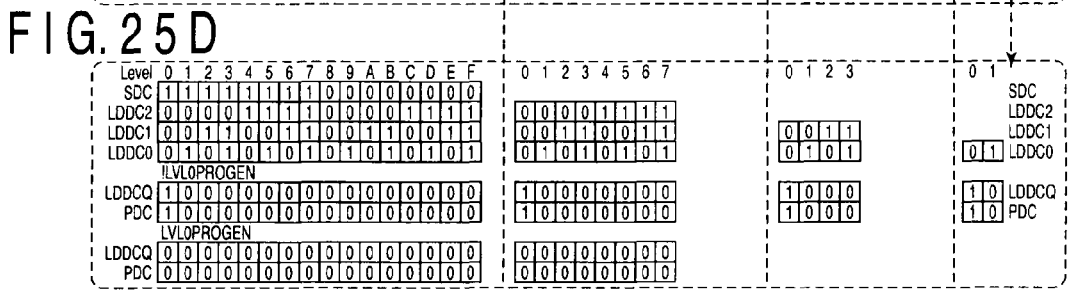
FIG. 25E

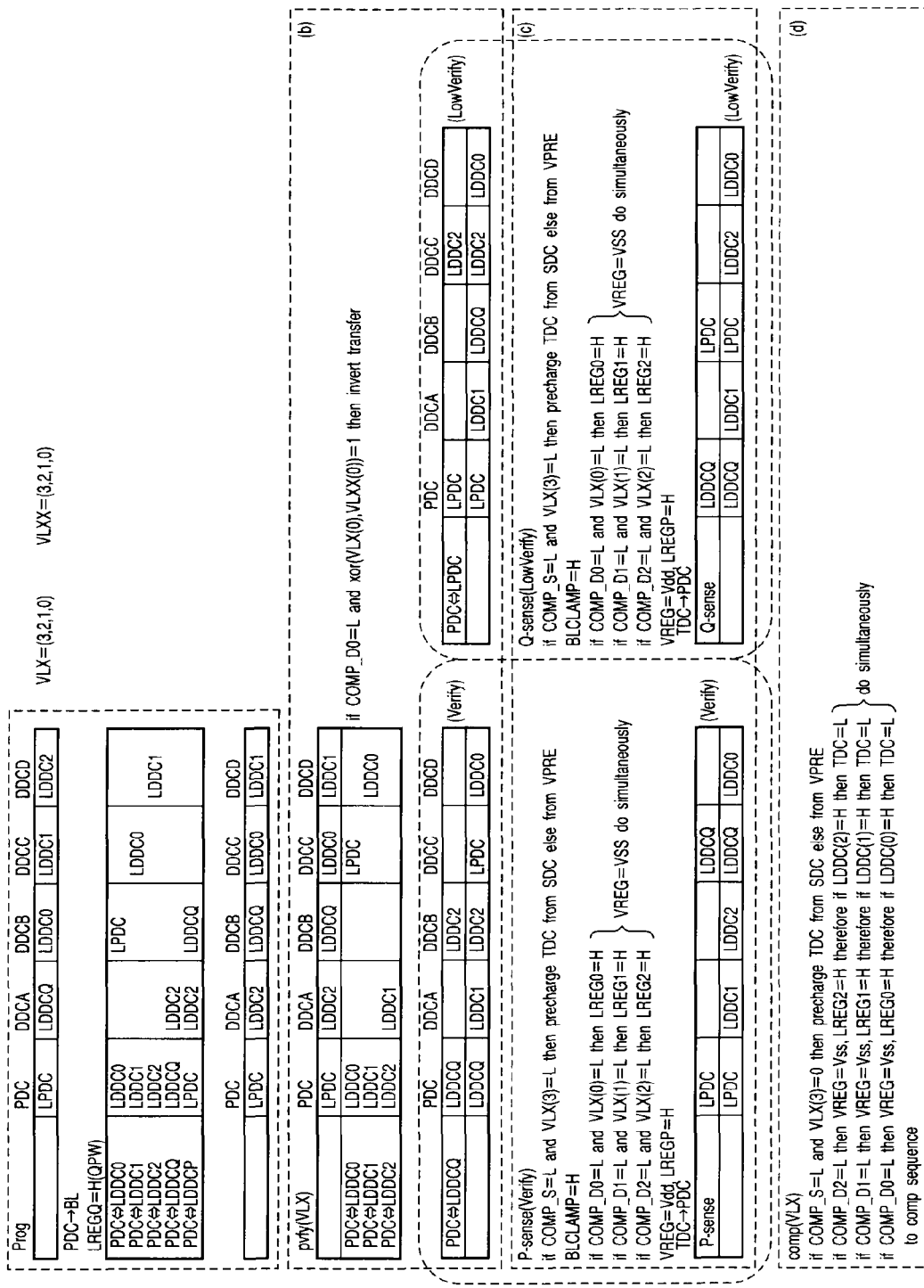

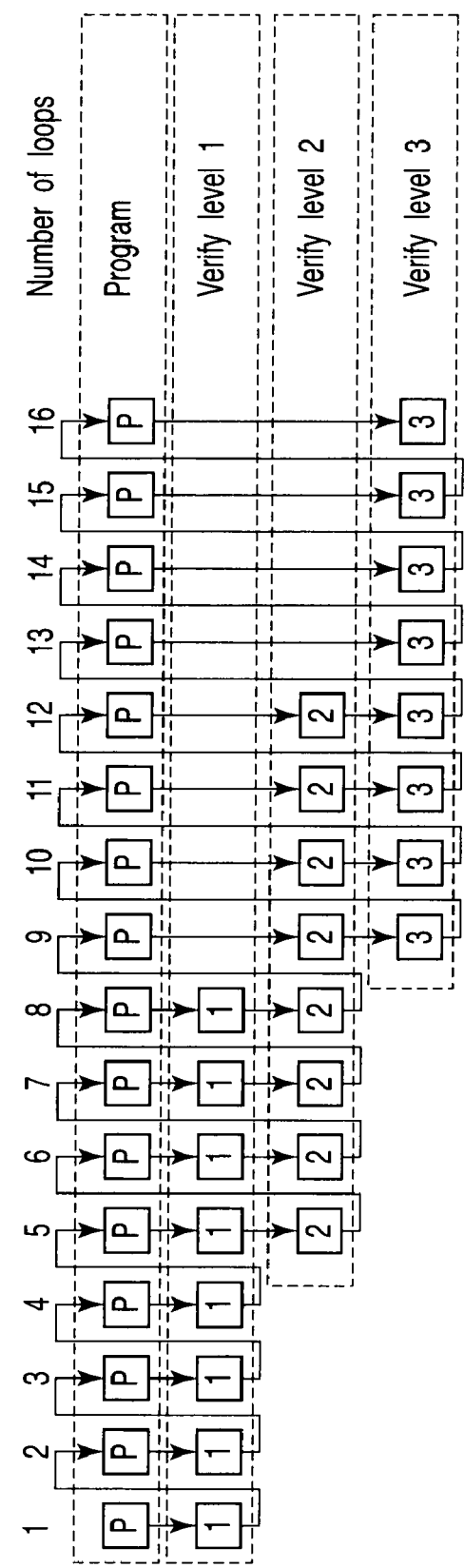
F I G. 27

FIG. 31A Third stage (15-level program)

| Level | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| SDC | 1 | 1 | 1 | 1 | 1 | 1 | 1 | 1 | 0 | 0 | 0 | 0 | 0 | 0 | 0 | 0 |
| LDDC2 | 0 | 0 | 0 | 0 | 1 | 1 | 1 | 1 | 0 | 0 | 0 | 0 | 1 | 1 | 1 | 1 |
| LDDC1 | 0 | 0 | 1 | 1 | 0 | 0 | 1 | 1 | 0 | 0 | 1 | 1 | 0 | 0 | 1 | 1 |
| LDDC0 | 0 | 1 | 0 | 1 | 0 | 1 | 0 | 1 | 0 | 1 | 0 | 1 | 0 | 1 | 0 | 1 |
| PDC | 1 | 0 | 0 | 0 | 0 | 0 | 0 | 0 | 0 | 0 | 0 | 0 | 0 | 0 | 0 | 0 |

Inversion refreshment

FIG. 31B In level-1 verify operation

| Level | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| SDC | 1 | 1 | 1 | 1 | 1 | 1 | 1 | 1 | 0 | 0 | 0 | 0 | 0 | 0 | 0 | 0 |
| LDDC2 | 0 | 0 | 0 | 0 | 1 | 1 | 1 | 1 | 0 | 0 | 0 | 0 | 1 | 1 | 1 | 1 |
| LDDC1 | 0 | 0 | 1 | 1 | 0 | 0 | 1 | 1 | 0 | 0 | 1 | 1 | 0 | 0 | 1 | 1 |
| LDDC0 | 1 | 0 | 1 | 0 | 1 | 0 | 1 | 0 | 1 | 0 | 1 | 0 | 1 | 0 | 1 | 0 |
| PDC | 1 | 0 | 0 | 0 | 0 | 0 | 0 | 0 | 0 | 0 | 0 | 0 | 0 | 0 | 0 | 0 |

Inversion refreshment

FIG. 31C In level-2 verify operation

| Level | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| SDC | 1 | 1 | 1 | 1 | 1 | 1 | 1 | 1 | 0 | 0 | 0 | 0 | 0 | 0 | 0 | 0 |
| LDDC2 | 0 | 0 | 0 | 0 | 1 | 1 | 1 | 1 | 0 | 0 | 0 | 0 | 1 | 1 | 1 | 1 |
| LDDC1 | 1 | 1 | 0 | 0 | 1 | 1 | 0 | 0 | 1 | 1 | 0 | 0 | 1 | 1 | 0 | 0 |
| LDDC0 | 0 | 1 | 0 | 1 | 0 | 1 | 0 | 1 | 0 | 1 | 0 | 1 | 0 | 1 | 0 | 1 |
| PDC | 1 | 0 | 0 | 0 | 0 | 0 | 0 | 0 | 0 | 0 | 0 | 0 | 0 | 0 | 0 | 0 |

FIG. 32A Third stage (15-level program)

| Level | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| SDC | 1 | 1 | 1 | 1 | 1 | 1 | 1 | 1 | 0 | 0 | 0 | 0 | 0 | 0 | 0 | 0 |
| LDDC2 | 0 | 0 | 0 | 0 | 1 | 1 | 1 | 1 | 0 | 0 | 0 | 0 | 1 | 1 | 1 | 1 |
| LDDC1 | 0 | 0 | 1 | 1 | 0 | 0 | 1 | 1 | 0 | 0 | 1 | 1 | 0 | 0 | 1 | 1 |
| LDDC0 | 0 | 1 | 0 | 1 | 0 | 1 | 0 | 1 | 0 | 1 | 0 | 1 | 0 | 1 | 0 | 1 |
| PDC | 1 | 0 | 0 | 0 | 0 | 0 | 0 | 0 | 0 | 0 | 0 | 0 | 0 | 0 | 0 | 0 |

Inversion refreshment

FIG. 32B In level-B verify operation

| Level | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| SDC | 1 | 1 | 1 | 1 | 1 | 1 | 1 | 1 | 0 | 0 | 0 | 0 | 0 | 0 | 0 | 0 |
| LDDC2 | 0 | 0 | 0 | 0 | 1 | 1 | 1 | 1 | 0 | 0 | 0 | 0 | 1 | 1 | 1 | 1 |
| LDDC1 | 1 | 1 | 0 | 0 | 1 | 1 | 0 | 0 | 1 | 1 | 0 | 0 | 1 | 1 | 0 | 0 |
| LDDC0 | 1 | 0 | 1 | 0 | 1 | 0 | 1 | 0 | 1 | 0 | 1 | 0 | 1 | 0 | 1 | 0 |
| PDC | 1 | 0 | 0 | 0 | 0 | 0 | 0 | 0 | 0 | 0 | 0 | 0 | 0 | 0 | 0 | 0 |

FIG. 33A

| PDC⇔LDDC0 | LDDCQ | LDDC1 | LPDC | LDDC2 | LDDC0 |
|---|---|---|---|---|---|
| PDC⇔LDDC1 | LDDC0 | | | | LDDCQ |
| PDC⇔LDDC2 | LDDC1 | LDDC0 | | LDDC1 | |
| | LDDC2 | | | | |

FIG. 33B

| PDC⇔LDDC0 | LDDC0 | LDDC2 | | | | (S) (D2) (D1) |
| --- | --- | --- | --- | --- | --- | --- |
| PDC⇔LDDC1 | LDDC1 | | | LDDC0 | | (S) (D2) |
| PDC⇔LDDC2 | LDDC2 | LDDC1 | | | | (S) |

FIG. 33C

| PDC⇔LDDCQ | LDDCQ | LDDC1 | LDDCQ | LDDC0 | LDDC2 |
| --- | --- | --- | --- | --- | --- |
| PDC⇔LPDC | LPDC | LPDC | LDDC1 | LDDC0 | LDDC2 |

In the case of 15-level writing

| Level | 0 | 1 | 2 | 3 | 4 | 5 | 6 | 7 | 8 | 9 | a | b | c | d | e | f |
|---|---|---|---|---|---|---|---|---|---|---|---|---|---|---|---|---|
| SDC | 1 | 1 | 1 | 1 | 1 | 1 | 1 | 1 | 0 | 0 | 0 | 0 | 0 | 0 | 0 | 0 |
| LDDC2 | 0 | 0 | 0 | 0 | 1 | 1 | 1 | 1 | 0 | 0 | 0 | 0 | 1 | 1 | 1 | 1 |
| LDDC1 | 0 | 0 | 1 | 1 | 0 | 0 | 1 | 1 | 0 | 0 | 1 | 1 | 0 | 0 | 1 | 1 |
| LDDC0 | 0 | 1 | 0 | 1 | 0 | 1 | 0 | 1 | 0 | 1 | 0 | 1 | 0 | 1 | 0 | 1 |
| PDC | 1 | 0 | 0 | 0 | 0 | 0 | 0 | 0 | 0 | 0 | 0 | 0 | 0 | 0 | 0 | 0 |

↰ Unwriting

Unwriting and rather low verify Pass → "1", rather low verify NG → "0"

FIG. 43

In the case of 7-level writing

| Level | 0 | 1 | 2 | 3 | 4 | 5 | 6 | 7 |
|---|---|---|---|---|---|---|---|---|
| SDC | 1 | 1 | 1 | 1 | 0 | 0 | 0 | 0 |
| LDDC1 | 0 | 0 | 1 | 1 | 0 | 0 | 1 | 1 |
| LDDC0 | 0 | 1 | 0 | 1 | 0 | 1 | 0 | 1 |
| PDC | 1 | 0 | 0 | 0 | 0 | 0 | 0 | 0 |

↰ Unwriting

Unwriting and rather low verify Pass → "1", rather low verify NG → "0"

FIG. 44

In the case of 3-level writing

| Level | 0 | 1 | 2 | 3 |
|---|---|---|---|---|
| SDC | 1 | 1 | 0 | 0 |
| LDDC0 | 0 | 1 | 0 | 1 |
| PDC | 1 | 0 | 0 | 0 |

↰ Unwriting

Unwriting and rather low verify Pass → "1", rather low verify NG → "0"

FIG. 45

| Level | Verify level | Difference | | Correction value | Corrected difference |
|---|---|---|---|---|---|
| 0 | -1.7 | 0.61 | | 0.1 | 0.71 |
| 1 | -1.09 | 0.4 | Neutral threshold voltage | 0.09 | 0.49 |
| 2 | -0.69 | 0.41 | | 0.08 | 0.49 |
| 3 | -0.28 | 0.41 | | 0.07 | 0.48 |
| 4 | 0.13 | 0.41 | | 0.06 | 0.47 |
| 5 | 0.54 | 0.42 | | 0.05 | 0.47 |
| 6 | 0.96 | 0.43 | | 0.04 | 0.47 |
| 7 | 1.39 | 0.43 | | 0.03 | 0.46 |
| 8 | 1.82 | 0.43 | | 0.02 | 0.45 |
| 9 | 2.25 | 0.44 | | 0.01 | 0.45 |
| A | 2.69 | 0.45 | | 0 | 0.45 |
| B | 3.14 | 0.45 | | 0 | 0.45 |
| C | 3.59 | 0.46 | | 0 | 0.46 |
| D | 4.05 | 0.46 | | 0 | 0.46 |
| E | 4.51 | 0.47 | | 0 | 0.47 |
| F | 4.98 | | | | |

SEMICONDUCTOR MEMORY DEVICE CAPABLE OF MEMORIZING MULTIVALUED DATA

CROSS-REFERENCE TO RELATED APPLICATIONS

This application is a continuation of and claims the benefit of priority under 35 U.S.C. §120 from U.S. Ser. No. 11/556,388 filed Nov. 3, 2006, now U.S. Pat. No. 7,813,170 and claims the benefit of priority under 35 U.S.C. §119 from Japanese Patent Application No. 2005-327827 filed Nov. 11, 2005, the entire contents of each which are incorporated herein by reference.

BACKGROUND OF THE INVENTION

1. Field of the Invention

This invention relates to, for example, NAND flash EEPROM, and more particularly to a semiconductor memory device capable of storing multivalued data in a single memory cell.

2. Description of the Related Art

In a NAND flash memory, all of or half of a plurality of cells arranged in the row direction are connected to bit lines in a one-to-one correspondence. A write and read latch circuit is connected to each bit line. Data is simultaneously written into or read from all of or half of the cells arranged in the row direction. With the recent trend toward larger memory capacity, a multivalued memory which stores 2 bits or more of data in a cell has been developed (for example, Jpn. Pat. Appln. KOKAI Publication No. 2004-192789). In the multivalued memory, to store 2 bits in a cell, 4 threshold voltages have to be set in the memory cell. To store 3 bits in the memory cell, 8 threshold voltages have to be set in the cell. To store 4 bits in the memory cell, 16 threshold voltages have to be set in the cell.

As described above, when a plurality of bits of data is stored in a memory cell, a data storage circuit has to be connected to the bit line to store write data or read-out data. The data storage circuit is composed of a plurality of latch circuits.

As the number of threshold voltages stored in a single memory cell increases, the number of latch circuits constituting the data storage circuit increases, causing the problem of decreasing the writing speed. Accordingly, a semiconductor memory device capable of storing multivalued data, while suppressing the increase of latch circuits, and of high-speed writing has been desired.

BRIEF SUMMARY OF THE INVENTION

According to a first aspect of the invention, there is provided a semiconductor memory device comprising: a memory cell array in which a plurality of memory cells connected to word lines and bit lines are arranged in a matrix; a first control circuit which controls the potentials of the word lines and bit lines; and a data storage circuit which is connected to the bit lines and stores write data for setting $2^k$ threshold voltages (k is a natural number) in memory cells in the memory cell array and which includes a k number of latch circuits each storing at least 1-bit data.

According to a second aspect of the invention, there is provided a semiconductor memory device comprising: a memory cell array in which a plurality of memory cells connected to word lines and bit lines are arranged in a matrix; a first control circuit which controls the potentials of the word lines and bit lines; and a second control circuit which sets $2^k$ threshold voltages (k is a natural number) in the memory cells and, when storing a plurality of bits of data as a first page and a second page to a k-th page and when an externally input address is an address for the k-th page, writes to $2^k$ levels.

According to a third aspect of the invention, there is provided a semiconductor memory device comprising: a memory cell array in which a plurality of memory cells connected to word lines and bit lines are arranged in a matrix; a first control circuit which controls the potentials of the word lines and bit lines; a data storage circuit which is connected to the bit lines and which includes at least one static latch circuit for storing write data and a plurality of dynamic latch circuits when setting $2^k$ threshold voltages (k is a natural number) in each memory cell in the memory cell array; and a second control circuit which controls the position of data stored in the dynamic latch circuits by transferring input data to said plurality of dynamic latch circuits sequentially according to a command.

BRIEF DESCRIPTION OF THE SEVERAL VIEWS OF THE DRAWING

FIG. 1 is a circuit diagram of a data storage circuit according to the present invention;

FIG. 4A is a sectional view of a memory cell and

FIG. 4B is a sectional view of a select transistor;

FIG. 5 is a sectional view of a NAND flash memory;

FIG. 6 is a table showing voltages applied to various regions shown in FIG. 5;

FIG. 7 is a timing chart to help explain an address input cycle of the memory shown in FIG. 2;

FIG. 8 is a table showing the allocation of input cycles and addresses;

FIG. 9 is a schematic structural diagram showing the relationship between the memory cell array (plane 0, plane 1) and a block;

FIGS. 19A to 19K show the relationship between commands and data in the first to third stage;

FIG. 20 is a circuit diagram of an example of the DDC control circuit shown in FIG. 2;

FIGS. 25A, 25B, 25C, 25D, and 25E show the relationship between 16-valued, 8-valued, 4-valued, and 2-valued input data and write levels in the write sequence shown in FIG. 24;

FIGS. 26A, 26B, 26C, and 26D are diagrams to help explain a program operation and a refresh operation;

FIG. 27 is a diagram to help explain a program verify operation in a first stage;

FIGS. 31A, 31B, and 31C show a level-1 and a level-2 verify operation in the third stage shown in FIG. 29;

FIGS. 32A and 32B show the relationship between write levels in a verify operation at level B in the third stage and the data stored in each data cache;

FIGS. 33A, 33B, and 33C are diagrams to help explain the sequence of setting data in the data caches;

FIG. 43 shows the relationship between the data caches to reduce the number of data caches and data in a fifth embodiment of the present invention;

FIG. 44 shows the relationship between the data caches to reduce the number of data caches and data in a modification of the fifth embodiment;

FIG. 45 shows the relationship between the data caches to reduce the number of data caches and data in another modification of the fifth embodiment;

DETAILED DESCRIPTION OF THE INVENTION

Hereinafter, referring to the accompanying drawings, embodiments of the present invention will be explained.

First Embodiment

Figure 2:
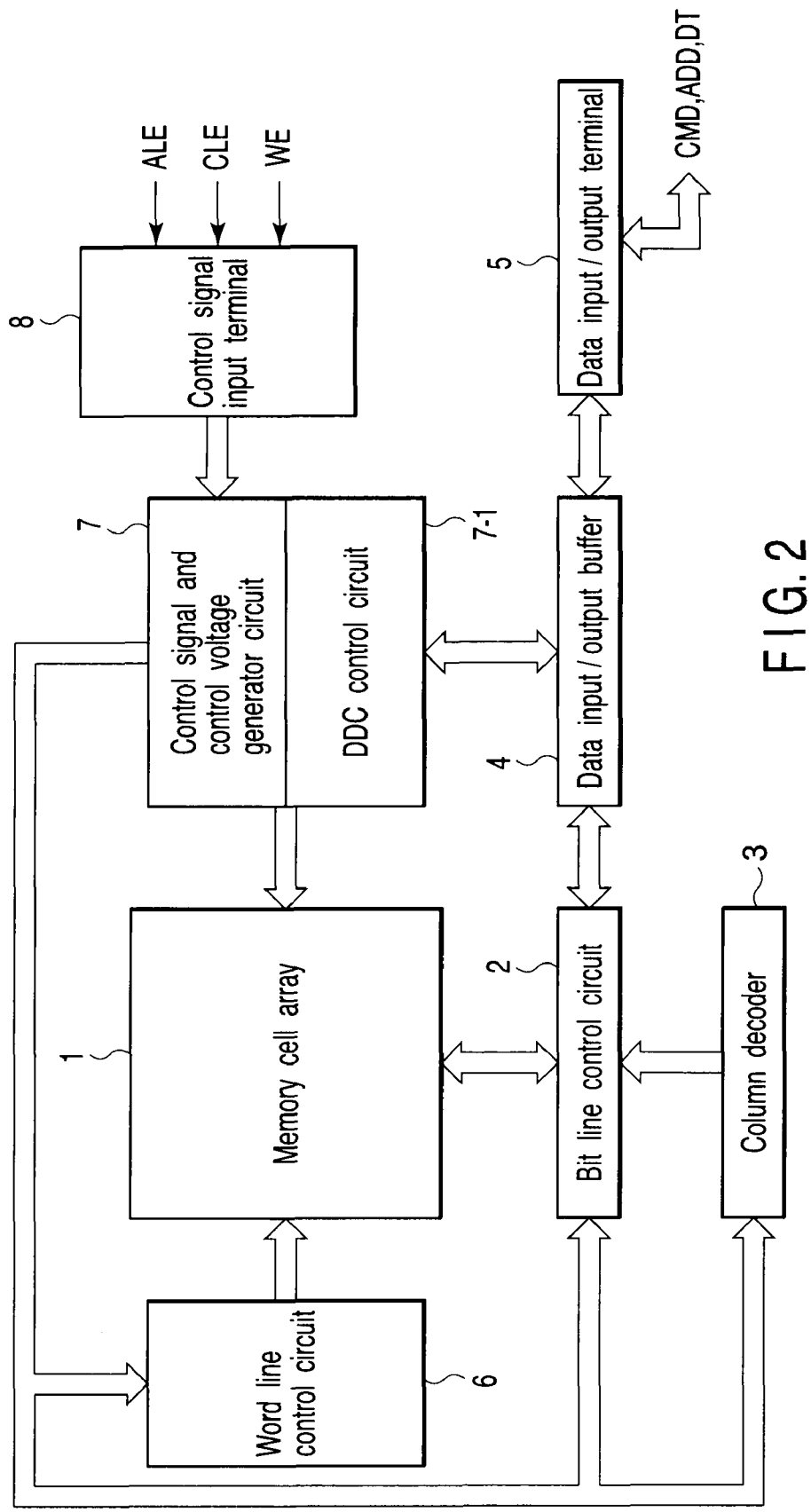
FIG. 2 is a diagram schematically showing the configuration of a NAND flash memory according to the invention.

FIG. 2 shows a schematic configuration of a NAND flash memory which stores, for example, 4-bit, 16-valued data.

A memory cell array 1 includes a plurality of bit lines, a plurality of word lines, and a common source line. In the memory cell array 1, electrically rewritable memory cells made up of, for example, EEPROM cells are arranged in a matrix. A bit line control circuit 2 for controlling bit lines and a word line control circuit 6 are connected to the memory cell array 1.

The bit line control circuit 2 reads the data in a memory cell of the memory cell array 1 via a bit line, detects the state of a memory cell of the memory cell array 1 via a bit line, and writes data into a memory cell of the memory cell array 1 by applying a write control voltage to the memory cell via a bit line. A column decoder 3 and a data input/output buffer 4 are connected to the bit line control circuit 2. A data storage circuit in the bit line control circuit 2 is selected by the column decoder 3. The data in the memory cell read into the data storage circuit is output via the data input/output buffer 4 at a data input/output terminal to the outside.

The write data externally input to the data input/output terminal 5 is input via the data input/output buffer 4 to the data storage circuit selected by the column decoder 3.

The word line control circuit 6 is connected to the memory cell array 1. The word line control circuit 6 selects a word line in the memory cell array 1 and applies to the selected word line a voltage necessary for a read, write, or erase operation.

The memory cell array 1, bit line control circuit 2, column decoder 3, data input/output buffer 4, and word line control circuit 6 are connected to and controlled by a control signal and control voltage generator circuit 7. The control signal and control voltage generator circuit 7 is connected to a control signal input terminal 8 and is controlled by control signals ALE (Address Latch Enable), CLE (Command Latch Enable), and WE (Write Enable) input via the control signal input terminal 8 from the outside.

The bit line control circuit 2, column decoder 3, word line control circuit 6, and control signal and control voltage generator circuit 7 constitute a write circuit and a read circuit.

The control signal and control voltage generator circuit 7 has a dynamic data cache (DDC) control circuit 7-1. As described later, the DDC control circuit 7-1 generates a control signal for controlling the refresh operation of a plurality of DRAMs acting as a dynamic latch circuit included in the data storage circuit.

Figure 3:
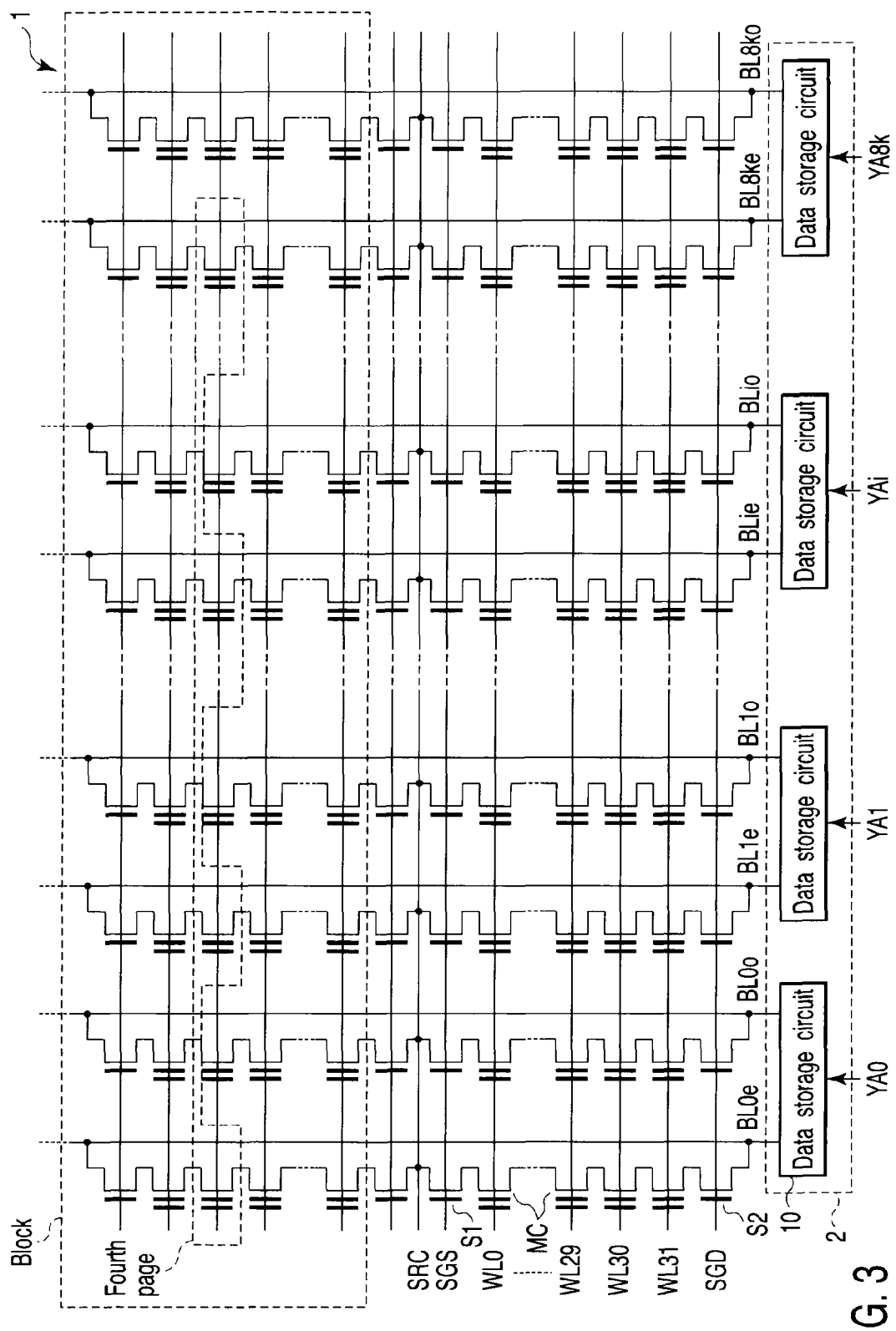
FIG. 3 is a circuit diagram showing a configuration of the memory cell array and bit line control circuit shown in FIG. 2.

FIG. 3 shows a configuration of the memory cell array 1 and bit line control circuit 2 shown in FIG. 2. In the memory cell array 1, a plurality of NAND cells are arranged. A NAND cell is composed of, for example, a memory cell MC made up of, for example, 32 EEPROMs connected in series and select gates S1, S2. Select gate S2 is connected to bit line BL0e and select gate S1 is connected to a source line SRC. The control gates of the memory cells MC arranged in each row are connected equally to word lines WL0 to WL29, WL30, WL31. Select gates S2 are connected equally to select line SGD. Select gates S1 are connected equally to select line SGS.

The bit line control circuit 2 has a plurality of data storage circuits 10. Pairs of bit lines (BL0e, BL0o), (BL1e, BL1o), ..., (BLie, BLio), (BL8ke, BL8ko) are connected to the individual data storage circuits 10.

The memory cell array 1 includes a plurality of blocks as shown by a broken line. Each block is composed of a plurality of NAND cells. In the memory cell array 1, data is erased in, for example, blocks. In addition, an erase operation is carried out simultaneously on the two bit lines connected to the data storage circuit 10.

A plurality of memory cells (or the memory cells enclosed by a broken line) arranged for every other bit line and connected to a single word line constitute one sector. Data is written or read in sectors.

In a read operation, a program verify operation, and a program operation, one of the two bit lines (BLie, BLio) connected to the data storage circuit 10 is selected according to the address signal (YA0, YA1, . . . , YAi, . . . , YA8k) supplied from the outside. Furthermore, one word line is selected according to an external address and a fourth page indicated by a broken line is selected. The changing of the fourth page is done using an address.

FIGS. 4A and 4B show a sectional view of a memory cell and that of a select transistor, respectively. FIG. 4A shows a memory cell. In a substrate 51 (or a p-well region 55 described later), an n-type diffused layer 42 acting as the source and drain of a memory cell is formed. Above the p-well region 55, a floating gate (FG) 44 is formed via a gate insulating film 43. Above the floating gate 44, a control gate (CG) 46 is formed via an insulating film 45. FIG. 4B shows a select gate. In the p-well region 55, an n-type diffused layer 47 acting as a source and a drain is formed. Above the p-well well region 55, a control gate 49 is formed via a gate insulating film 48.

FIG. 5 is a sectional view of a NAND flash memory. For example, in a p-type semiconductor substrate 51, n-well regions 52, 53, 54 and a p-well region 56 are formed. In the n-well region 52, the p-well region 55 is formed. In the p-well region 55, low-voltage n-channel transistors LVNTr constituting the memory cell array 1 are formed. In the n-well region 53 and p-well region 56, a low-voltage p-channel transistor LVPTr and a low-voltage n-channel transistor LVNTr constituting a data storage circuit 10 are formed respectively. In the substrate 51, a high-voltage n-channel transistor HVNTr connecting a bit line and the data storage circuit 10 is formed. In the n-well region 54, a high-voltage p-channel transistor HVPTr constituting, for example, a word-line driving circuit or the like is formed. As shown in FIG. 5, the high-voltage transistors HVNTr, HVPTr have, for example, a thicker gate insulating film than that of the low-voltage transistors LVNTr, LVPTr.

FIG. 6 shows an example of voltages supplied to various regions shown in FIG. 5. in an erase operation, a program operation, and a read operation, the voltages as shown in FIG. 6 are supplied to various regions. Vera is a voltage applied to the substrate in erasing data. Vss is the ground voltage. Vdd is a power supply voltage. Vpgmh is a voltage Vpgm+Vth supplied to a word line in writing data. Vfix is a voltage supplied to a well in which memory cells have been formed, in reading data. Vreadh is a voltage Vread+Vth supplied to a word line in reading data.

FIG. 1 is a circuit diagram of the data storage circuit 10 shown in FIG. 3.

FIG. 1 shows a case where, for example, 4-bit, 16-valued data is written and read. The data storage circuit 10 includes a primary data cache (PDC), a secondary data cache (SDC), dynamic data caches (DDCA, DDCB, DDCC, DDCD), and a temporally data cache (TDC). The SDC, PDC, DDCA, DDCB, DDCC, and DDCD hold the input data in a write operation, hold the read-out data in a read operation, hold the data temporarily in a verify operation, and is used for the manipulation of internal data in storing multivalued data. The TDC amplifies the data on a bit line and holds the data temporarily in a data read operation, and is used for the manipulation of internal data in storing multivalued data.

The SDC is composed of clocked inverter circuits 61a, 61b constituting a static latch circuit and transistors 61c, 61d. The transistor 61c is connected between the input end of the clocked inverter circuit 61a and the input end of the clocked inverter circuit 61b. A signal EQ2 is supplied to the gate of the transistor 61c. The transistor 61d is connected between the output end of the clocked inverter circuit 61a and the ground. A signal PRST is supplied to the gate of the transistor 61d. Node N2a of the SDC is connected via a column select transistor 61e to an input/output data line IOn. Node N2b of the SDC is connected via a column select transistor 61f to an input/output data line IO. A column select signal CSLi is supplied to the gates of the transistors 61e, 61f. Node N2a of the SDC is connected to node N1a of the PDC via transistors 61g, 61h. A signal BLC2 is supplied to the gate of the transistor 61g. A signal BLC1 is supplied to the gate of the transistor 61h.

The PDC is composed of clocked inverter circuits 61i, 61j constituting a static latch circuit and a transistor 61k. The transistor 61k is connected between the input end of the clocked inverter circuit 61i and the input end of the clocked inverter circuit 61j. A signal EQ1 is supplied to the gate of the transistor 61k. Node N1b of the PDC is connected to the gate of the transistor 61l. One end of the current path of the transistor 61l is connected to the ground via a transistor 61m. A signal CHK1 is supplied to the gate of the transistor 61m. The other end of the current path of the transistor 61l is connected to one end of the current path of transistors 61n, 61o constituting a transfer gate. A signal CHK2n is supplied to the gate of the transistor 61n. The gate of the transistor 61o is connected to node N3. The other end of the current path of the transistors 61n, 61o is connected to a signal line COMi. The signal line COMi is connected equally to all of the data storage circuits 10. On the basis of the level of the signal line COMi, whether all of the data storage circuits 10 have been verified can be determined. Specifically, as described later, if the verification has been completed, node Nib of the PDC goes low (or node N1a goes high). In this state, when the signals CHK1, CHK2n are made high, if the verification has been completed, the signal line COMi goes high.

Furthermore, the TDC is composed of, for example, a MOS capacitor 61p. One end of the capacitor 61p is connected to a junction node N3 of the transistors 61g, 61h. A signal BOOST described later is supplied to the other end of the capacitor 61p. The DDCA, DDCB, DDCC, and DDCD are connected to the junction node N3 via transistors 61qA to 61qD. Signals REGA to REGD are supplied to the gates of the transistors 61qA to 61qD.

The DDCA, DDCB, DDCC, and DDCD are composed of transistors 61rA to 61rD, 61sA to 61sD, respectively. Signal VPRE is supplied to one end of the current path of each of the transistors 61rA to 61rD. The other ends of the transistors 61rA to 61rD are connected to the current paths of the transistors 61qA to 61qD, respectively. The gates of the transistors 61rA to 61rD are connected to node N1a of the PDC via transistors 61sA to 61sD. Signals DTGA to DTGD are supplied to the gates of the transistors 61sA to 61sD, respectively.

Furthermore, one end of the current path of each of transistors 61t, 61u is connected to the junction node N3. A signal VPRE is supplied to the other end of the current path of the transistor 61u. A signal BLPRE is supplied to the gate of the transistor 61u. A signal BLCLAMP is supplied to the gate of the transistor 61t. The other end of the current path of the transistor 61t is connected to one end of bit line BLo via a transistor 61v and to one end of bit line BLe via a transistor 61w. One end of bit line BLo is connected to one end of the current path of a transistor 61x. A signal BIASo is supplied to the gate of the transistor 61x. One end of bit line BLe is connected to one end of the current path of a transistor 61y. A signal BIASe is supplied to the gate of the transistor 61y. A signal BLCRL is supplied to the other ends of the current paths of these transistors 61x, 61y. The transistors 61x, 61y are turned on according to signals BlASo, BlASe so as to be complementary to the transistors 61v, 61w, thereby supplying the potential of the signal BLCRL to the unselected bit lines.

Between node N3 and the ground, for example, a MOS capacitor 61z is connected. The capacitor 61z adjusts the potential at node N3 so as to prevent the potential at node N3 from rising too much by coupling in raising the voltage of the capacitor 61p of the TDC described later by the signal BOOST. Hereinafter, suppose data in the PDC is the potential at node N1a, data in the SDC is the potential at node N2a, data in the TDC is the potential at node N3, and data in the DDCA to DDCD are the potentials of the gates of the transistors 61rA to 61rD.

The individual signals and voltages are generated by the control signal and control voltage generator circuit 7 shown in FIG. 2. Under the control of the control signal and control voltage generator circuit 7, a data write operation, a verify operation, and a read operation are controlled. Moreover, the DDCA to DDCD are refreshed by the control signal generated by the DDC control circuit 7-1.

The memory stores, 4 bits of data in a single cell using 16 threshold voltages. The switching between the 4 bits is controlled using addresses (or a first page, a second page, a third page, and a fourth page).

FIG. 7 is a timing chart to help explain an address input cycle. When a command latch enable signal CLE is set at the low level (hereinafter, referred to as the L level or L) and an address latch enable signal ALE is set at the high level (hereinafter, referred to as the H level or H) in FIG. 7. In this state, when a write enable signal WEn is changed from the L level to the H level, I/O 0-7 externally input are read as an address.

FIG. 8 shows the allocation of input cycles and addresses. As shown in FIG. 8, a first and a second cycle are for a column address. I/O 0-1 (A16, A17) in a third cycle are for an MLC (Multi Level Cell) address for changing page addresses as follows: when (A16, A17)=(L, L), a lower page appears; when (A16,A17)=(H, L), an upper page appears; when (A16, A17)=(L, H), a higher page appears; and when (A16, A17)=(H, H), a top page appears. I/O3 (A18) in the third cycle is for selecting one of the two bit lines (BLie, BLio). I/O 3-7 (A19 to A23) in the third cycle are for selecting one of the 32 word lines in a NAND cell. A fourth and a fifth cycle are for a block address.

FIG. 9 shows the relationship between the memory cell array (plane 0, plane 1) and a block. As shown in FIG. 9, the NAND flash memory has two planes 1, 2. Each of the planes 0, 1 includes, for example, the memory cell array 1, bit line control circuit 2, column decoder 3, and word line control circuit 6 shown in FIG. 2. The control signal and control voltage generator circuit 7, control input terminal 8, data input/output buffer 4, and data input/output terminal 5 are shared by the individual planes. In FIG. 9, only the bit line control circuit 2 is shown.

In plane 0, blocks 0 to 2047 are arranged. In plane 1, blocks 2048 to 4095 are arranged. Since a plurality of blocks are arranged in each of plane 1 and plane 0 in this way, either plane is selected by I/O 3 (A36) in the fifth cycle. Moreover, a read operation, a program operation, or an erase operation can be carried out by selecting an arbitrary block in each plane, a total of two blocks, at the same time.

Figure 49:
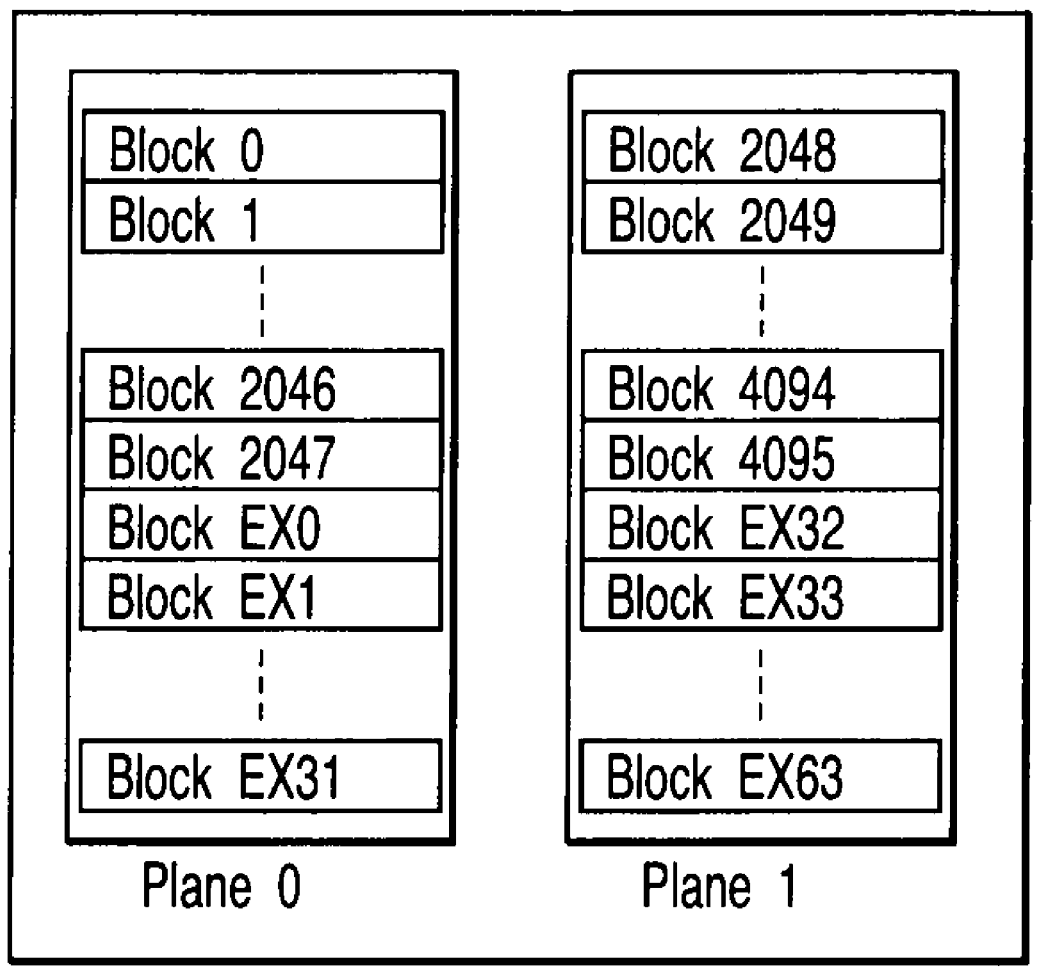
FIG. 49 shows a schematic configuration of a modification of the memory cell array.

An ordinary memory includes not only block 0 to block 4095 in FIG. 9 but also a redundancy block. If there is a defective block in block 0 to block 4095, when the defective block is accessed, the redundancy block is selected. However, a redundancy switching circuit is large, block EX0 to block EX31 are added to increase the original number of blocks as shown in FIG. 49. When there is a defective block in block 0 to block 4095 and block EX0 to EX31, the defective block is prevented from being used. Since extra blocks are provided, there are required minimum good blocks. In this case, when a defective block is accessed, the block is made unselected and no word line is selected. For example, in a read operation, since the bit line is charged but not discharged, the highest level data is read out, enabling the defective block to be distinguished.

However, the user wants to store important data into a specific block, for example, block 0, block 2048, or the like. Therefore, these specific blocks have to be nondefective. For example, block 0 is defective, block 0 is replaced with block EX31. When block 0 is accessed, block EX31 (good block) is selected. When EX31 is accessed, an attempt is made to select block 0. However, since block 0 is defective, no word line is selected. Moreover, for example, in a read operation, the bit lines are charged, but not discharged. Therefore, the highest level data is read out, enabling the defective block to be distinguished. A specific block, such as block 0 or block 2048, may be provided with a dedicated redundancy block.

Figure 10:
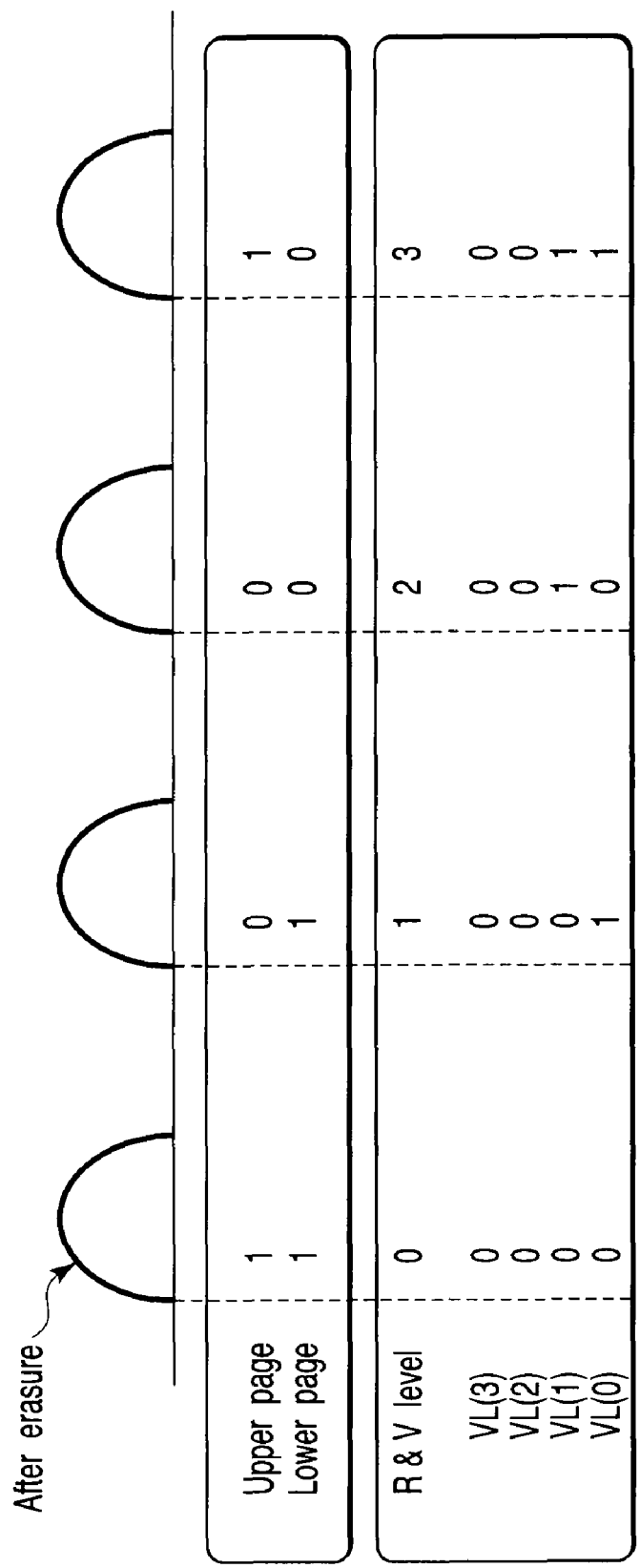
FIG. 10 shows the relationship between the data in a memory cell and the threshold values of the memory cell.

FIG. 10 shows the relationship between the data in a memory cell and the threshold values of the memory cell. After erasing is done, the data in the memory cell has a threshold voltage distribution shown in the leftmost part of FIG. 10. After this, 4-bit (16-valued) data is stored in a single cell according to a write operation. Specifically, first, as shown in FIG. 10, in a first stage writing operation, four threshold voltages, "0" to "3" are set in the memory cell using 2-bit data for the lower page and upper page.

Figure 11:
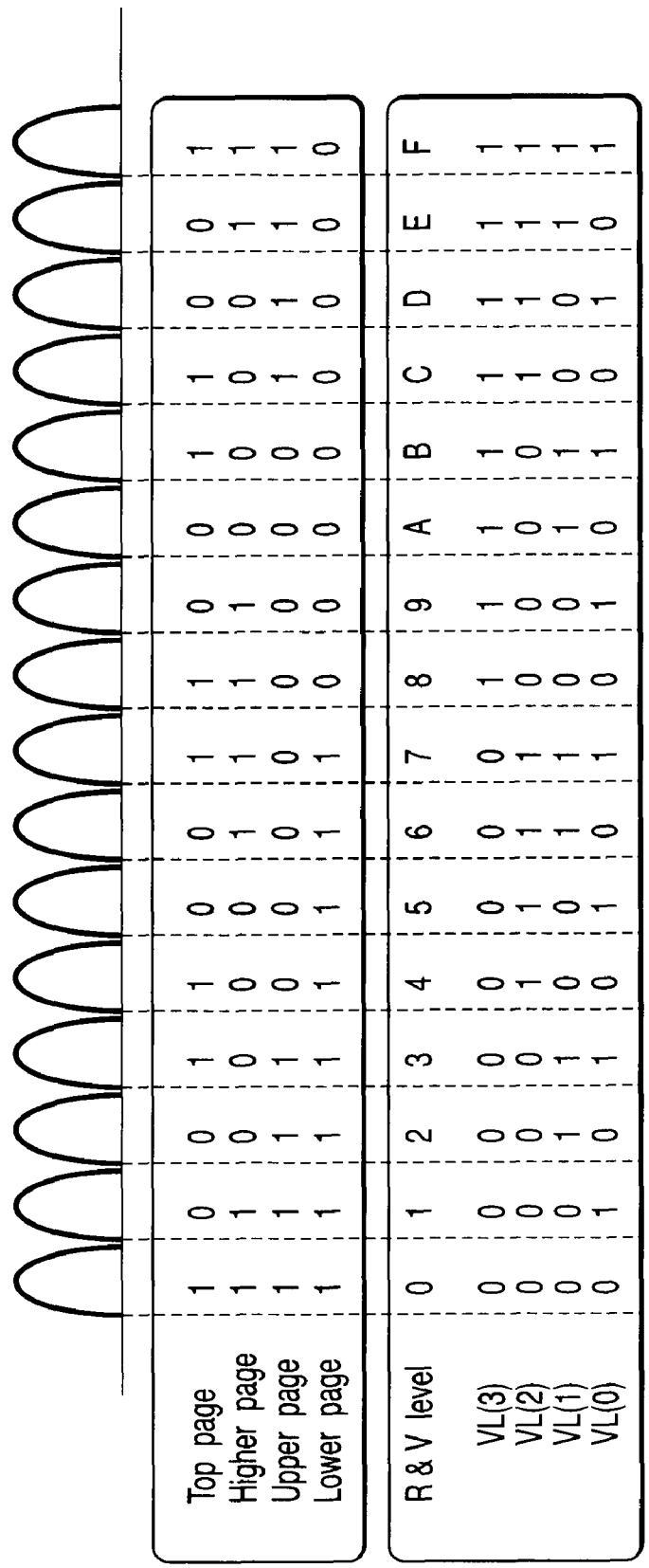
FIG. 11 shows the relationship between the data in a memory cell and the threshold values of the memory cell.

Next, as shown in FIG. 11, 16 threshold voltages, "0" to "F" are set in the memory cell using 4-bit data for the lower page, upper page, higher page, and top page in a second and a third stage writing operation.

In FIGS. 10 and 11, R & V levels represent read and verify levels. VL(3) to VL(0) represent level 0 to level F in bits. That is, level 0 is expressed as (0000), level 1 is expressed as (0001), level 2 is expressed as (0010), . . . , level F is expressed as (1111).

(Program and Program Verify)
(Program Sequence)

Figure 12:
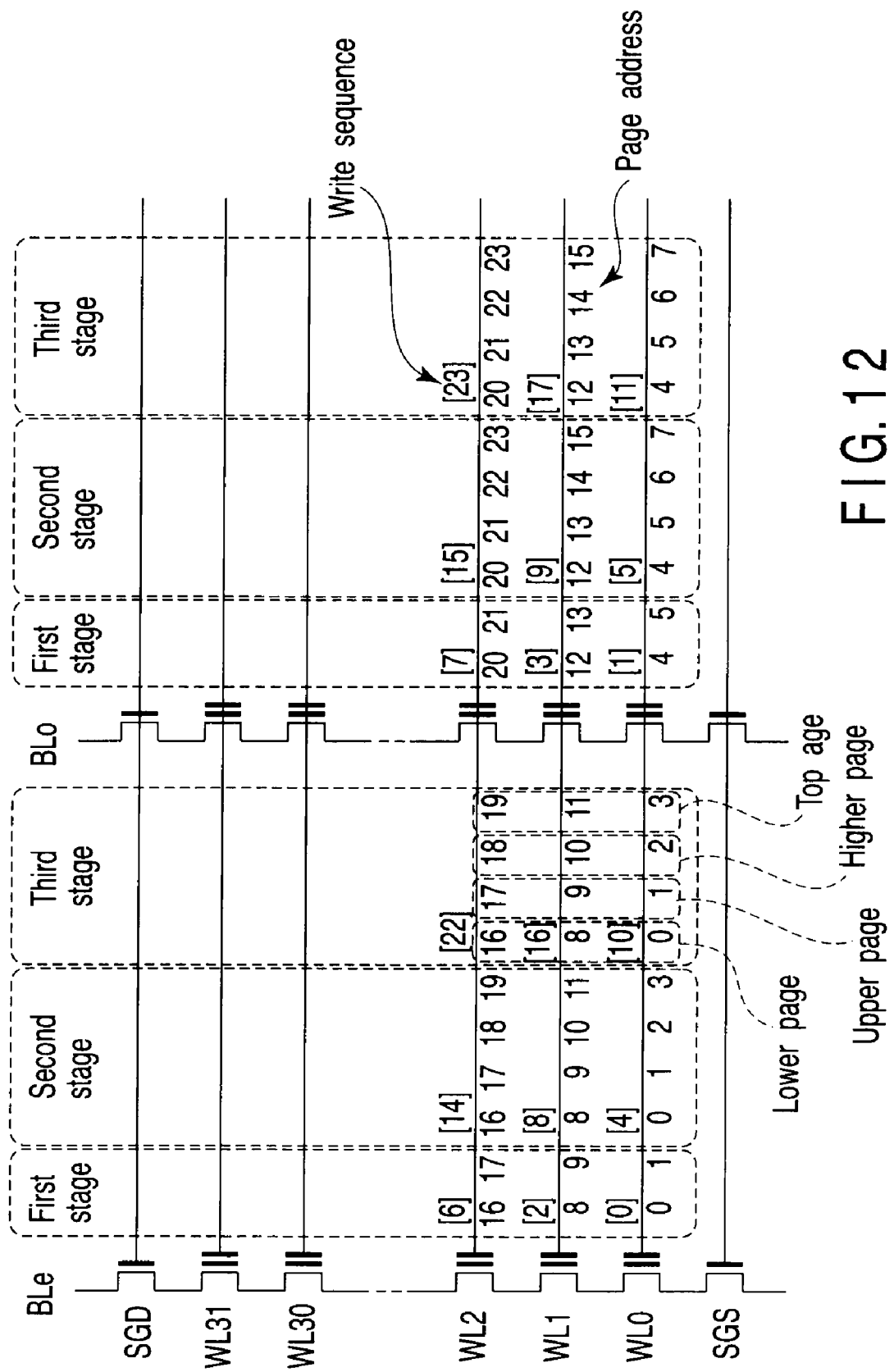
FIG. 12 is a diagram to help explain the order in which data is written into a memory cell in the embodiment.

FIG. 12 shows the order in which data is written into a memory cell in the embodiment. A write operation is carried out page by page in a block, starting with the memory cell close to the source line. At this time, the threshold voltage is prevented from changing as a result of adjacent memory cells being written into. That is, to reduce the effect of the threshold voltage of the memory cell written into later on the threshold voltage of the memory cell written into earlier, a write operation is carried out in a specific order.

FIGS. 13A to 13F show the transition of the threshold voltages of the memory cell in a write operation. As a result of a first, a second, and a third stage write operation, a total of three write operations, 4-bit (16-valued) data is written into a single cell.

Figures 13A, 13B, 13C, 13D, 13E, 13F:
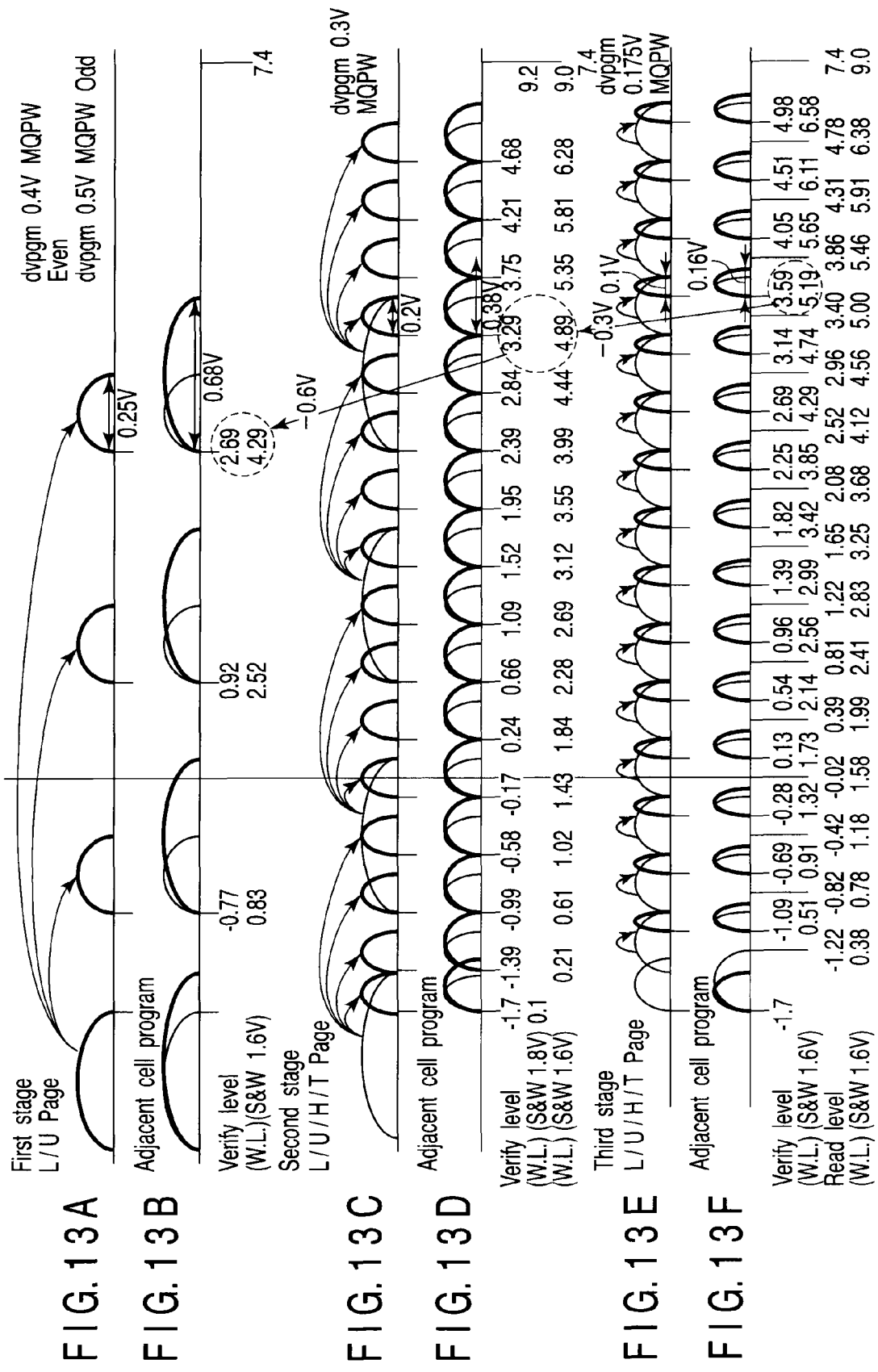
FIGS. 13A to 13F are diagrams to help explain the transition of the threshold voltages of the memory cell in a write operation.

First, in a first write operation [0] shown in FIG. 12, a memory cell is selected by word line WL0 and even-numbered bit line BLe. In this memory cell, 2-bit (3-valued) data for the lower page and upper page are written by the first stage write operation. As a result, the threshold voltages are as shown in FIG. 13A.

Next, in a second write operation [1], a memory cell is selected by word line WL0 and odd-numbered bit line BLo. In this memory cell, 2-bit (3-valued) data for the lower page and upper page are written by the first stage write operation.

Next, in a third write operation [2], a memory cell is selected by word line WL1 and even-numbered bit line BLe. In this memory cell, 2-bit (3-valued) data for the lower page and upper page are written by the first stage write operation.

Next, in a fourth write operation [3], a memory cell is selected by word line WL1 and odd-numbered bit line BLo. In this memory cell, 2-bit (3-valued) data for the lower page and upper page are written by the first stage write operation.

As described above, when data has been written in adjacent cells, for example, the threshold value distribution in the memory cell selected by word line WL0 and bit line BLe spreads as a result of being affected by changes in the threshold voltages of the adjacent cells as shown in FIG. 13B.

Next, in a fifth write operation [4], a memory cell is selected by word line WL0 and bit line BLe. In this memory cell, 4-bit (16-valued) data for the lower page, upper page, higher page, and top page are written by the second stage write operation. As a result, the distribution of threshold voltages is as shown in FIG. 13A.

Next, in a sixth write operation [5], a memory cell is selected by word line WL0 and bit line BLo. In this memory cell, 4-bit (16-valued) data for the lower page, upper page, higher page, and top page are written by the second stage write operation.

Next, in a seventh write operation [6], a memory cell is selected by word line WL2 and bit line BLe. In this memory cell, 2-bit (3-valued) data for the lower page and upper page are written by the first stage write operation.

Next, in an eighth write operation [7], a memory cell is selected by word line WL2 and bit line BLo. In this memory cell, 2-bit (3-valued) data for the lower page and upper page are written by the first stage write operation.

Next, in a ninth write operation [8], a memory cell is selected by word line WL1 and bit line BLe. In this memory cell, 4-bit (16-valued) data for the lower page, upper page, higher page, and top page are written by the second stage write operation.

Next, in a tenth write operation [9], a memory cell is selected by word line WL1 and bit line BLo. In this memory cell, 4-bit (16-valued) data for the lower page, upper page, higher page, and top page are written by the second stage write operation.

Then, for example, the threshold voltage distribution in the memory cell selected by word line WL0 and bit line BLe spreads due to changes in the threshold voltages of the adjacent cells as shown in FIG. 13D.

Next, in an eleventh write operation [10], a memory cell is selected by word line WL0 and bit line BLe. In this memory cell, 4-bit (15-valued) data for the lower page, upper page, higher page, and top page are written. Then, as shown in FIG. 11E, each threshold voltage distribution becomes narrower.

Next, in a twelfth write operation [11], a memory cell is selected by word line WL0 and bit line BLo. In this memory cell, 4-bit (15-valued) data for the lower page, upper page, higher page, and top page are written by the third stage write operation.

Next, in a thirteenth write operation [12], a memory cell is selected by word line WL3 and bit line BLe. In this memory cell, 2-bit (3-valued) data for the lower page and upper page are written by the first stage write operation.

Next, in a fourteenth write operation [13], a memory cell is selected by word line WL3 and bit line BLo. In this memory cell, 2-bit (3-valued) data for the lower page and upper page are written by the first stage write operation.

Next, in a fifteenth write operation [14], a memory cell is selected by word line WL2 and bit line BLe. In this memory cell, 4-bit (16-valued) data for the lower page, upper page, higher page, and top page are written by the second stage write operation.

Next, in a sixteenth write operation [15], a memory cell is selected by word line WL2 and bit line BLo. In this memory cell, 4-bit (16-valued) data for the lower page, upper page, higher page, and top page are written by the second stage write operation.

Next, in a seventeenth write operation [16], a memory cell is selected by word line WL1 and bit line BLe. In this memory cell, 4-bit (15-valued) data for the lower page, upper page, higher page, and top page are written by the third stage write operation.

Next, in an eighteenth write operation [17], a memory cell is selected by word line WL1 and bit line BLo. In this memory cell, 4-bit (15-valued) data for the lower page, upper page, higher page, and top page are written by the third stage write operation.

Then, for example, the threshold voltage distribution in the memory cell selected by word line WL0 and bit line BLe spreads a little due to changes in the threshold voltages of the adjacent cells as shown in FIG. 13F.

Writing data in such an order makes it possible to prevent the threshold voltages in the cell from spreading due to changes in the threshold voltages of the adjacent cells and make the threshold voltage distribution narrower.

Figure 14:
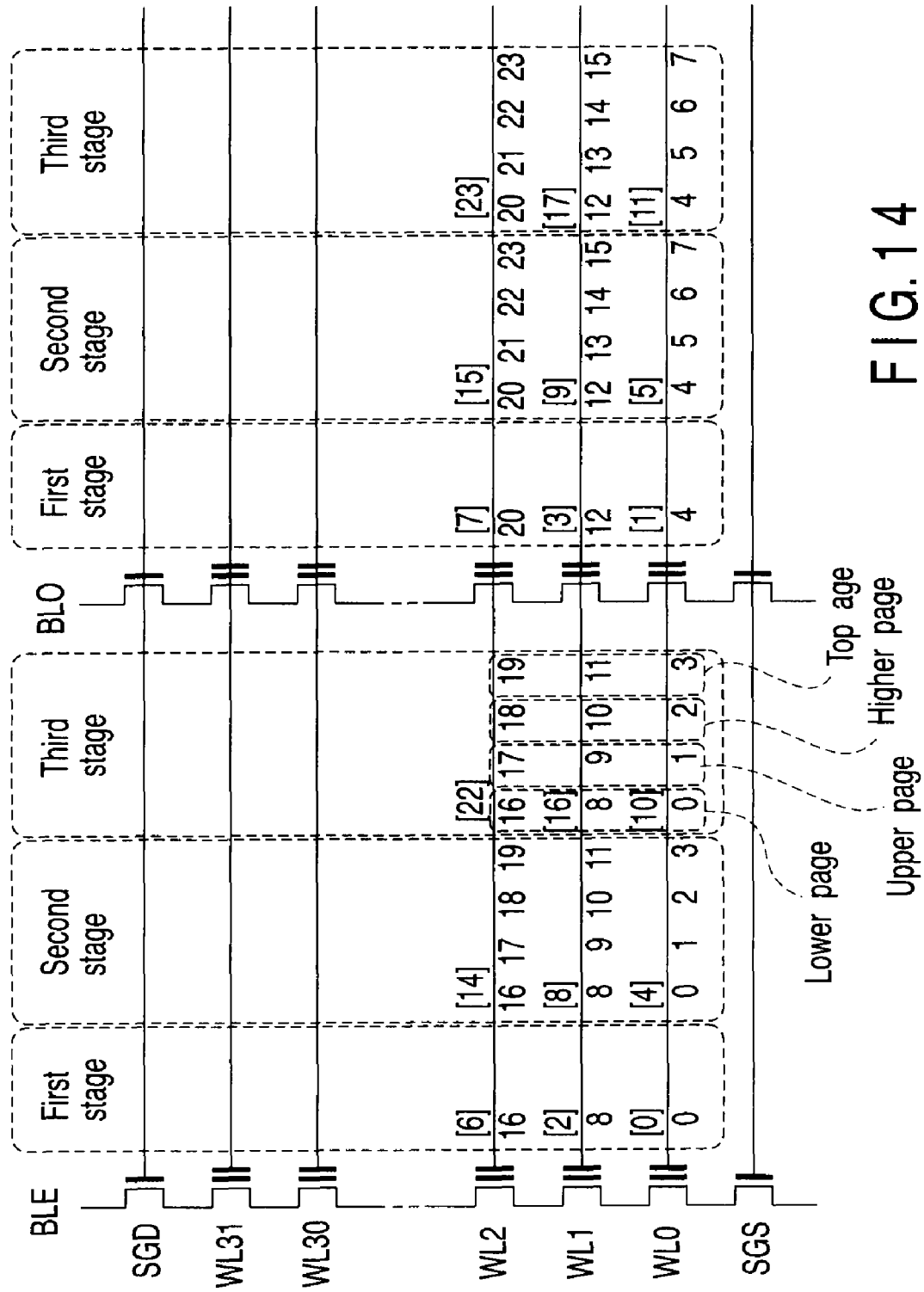
FIG. 14 shows a first modification of FIG. 12.
Figure 15:
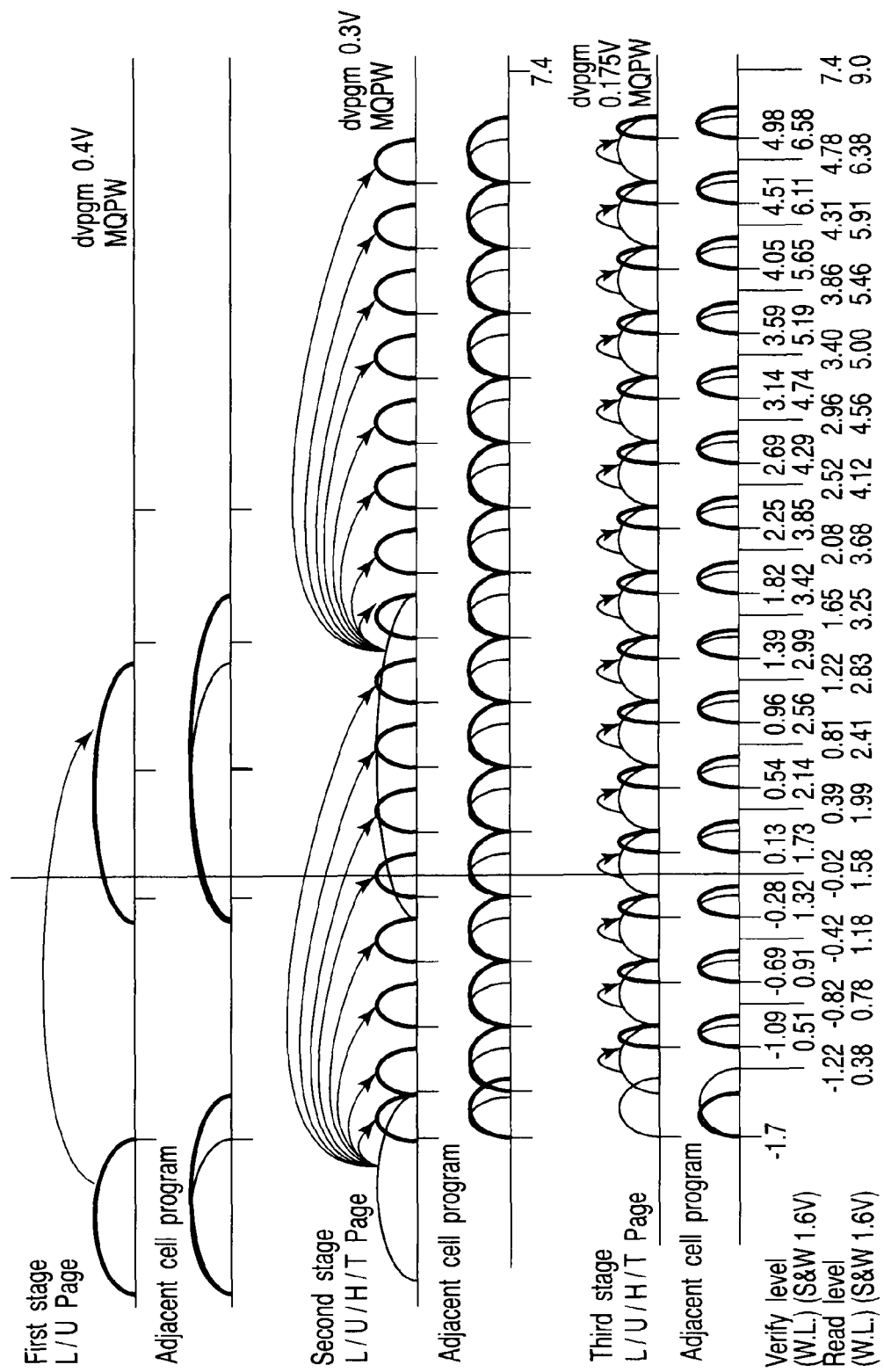
FIG. 15 shows a first modification of FIGS. 13A to 13F.

FIGS. 14 and 15 show a first modification of FIG. 12 and FIGS. 13A to 13F.

In the first modification shown in FIGS. 14 and 15, only 1-bit (2-valued) data for the lower page is written in the first stage write operation. This writing method is effective when the coupling capacity between adjacent cells is low and a change in the threshold voltage is small.

Figure 16:
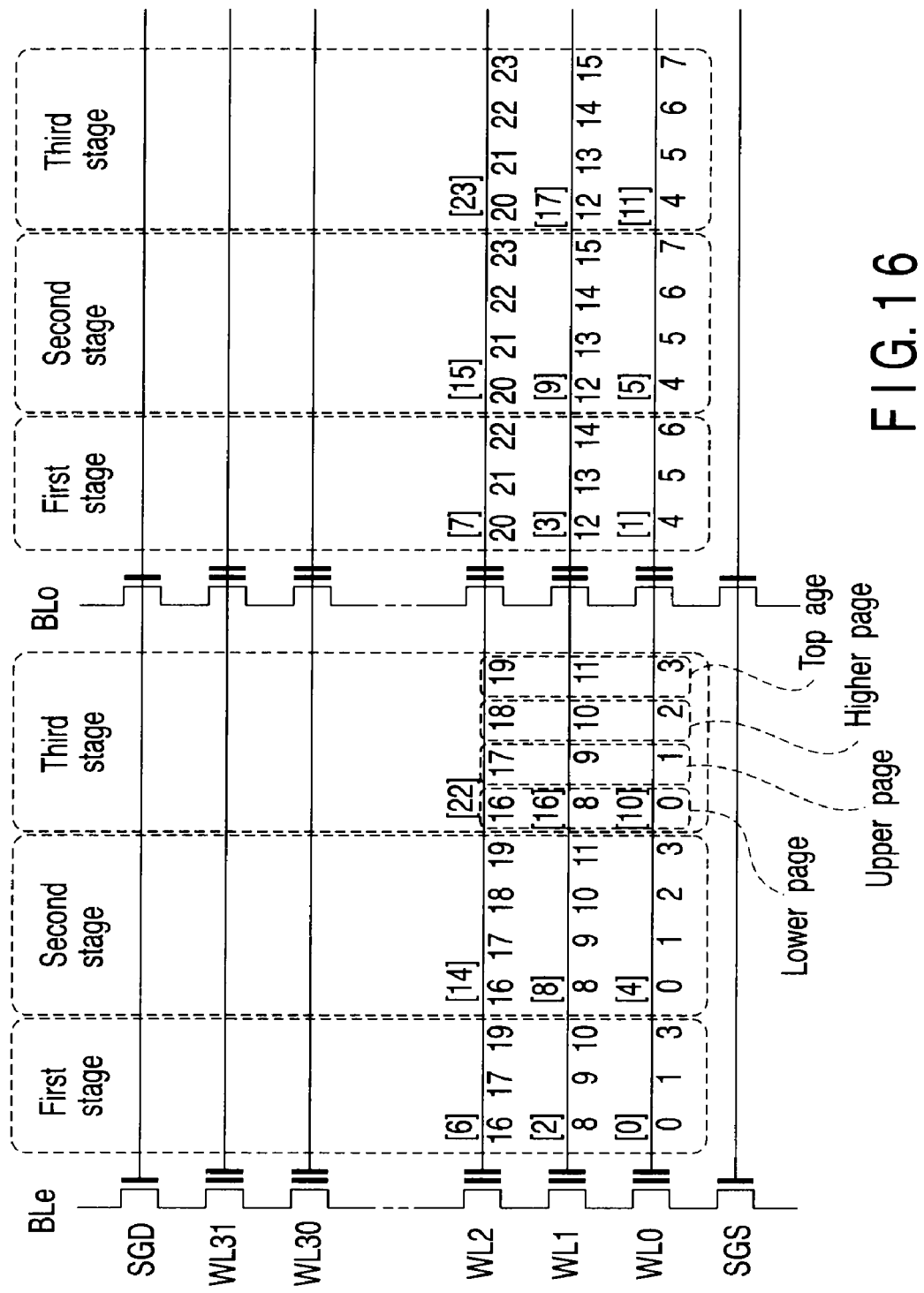
FIG. 16 is a second modification of FIG. 12.
Figure 17:
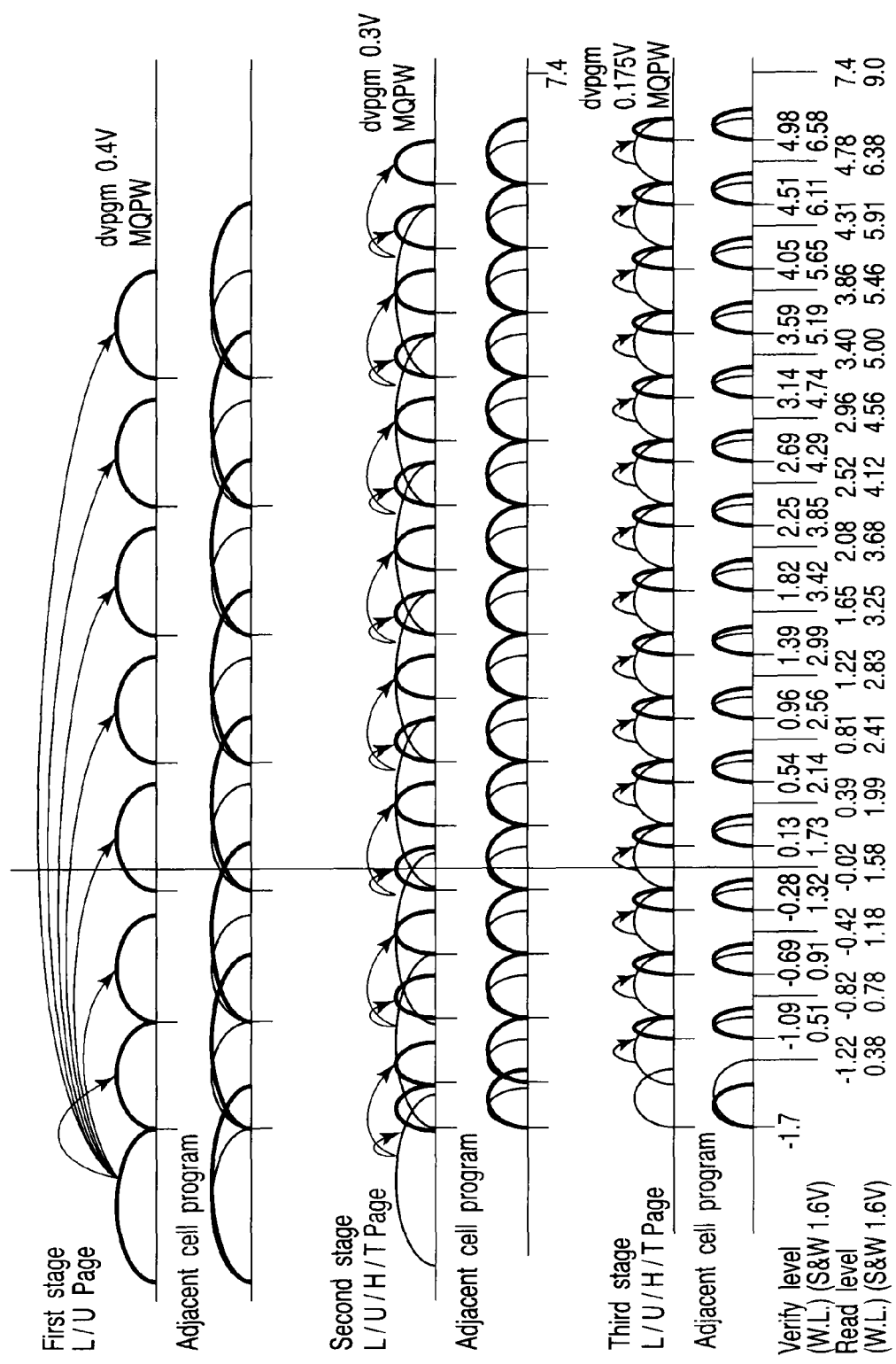
FIG. 17 is a second modification of FIGS. 13A to 13F.

FIGS. 16 and 17 show a second modification of FIG. 12 and FIGS. 13A to 13F.

In the second modification shown in FIGS. 16 and 17, 3-bit (8-valued) data for the lower page, upper page, and higher page are written in the first stage write operation. This writing method is effective when the coupling capacity between adjacent cells is high and a change in the threshold voltage is large.

(Address Input and Data Input)

In the embodiment, as shown in FIGS. 13A to 13F and FIG. 17, first, 2-bit (4-valued), 1-bit (2-valued), or 3-bit (8-valued) data is written in a memory cell in a first stage write operation. Thereafter, data is similarly written in an adjacent cell. Then, in a second stage write operation, 4-bit (16-valued) data is roughly written to a level lower than the original verify level. Thereafter, data is further written into the adjacent cell. In a third stage write operation, 4-bit (16-valued) data is written to the original verify level.

Figure 18:
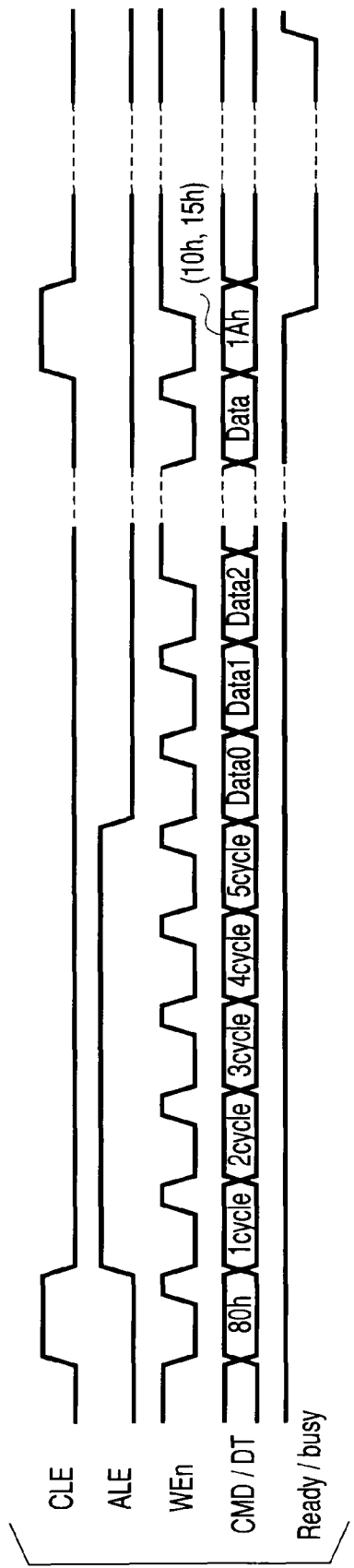
FIG. 18 is a timing chart to help explain a third stage write operation.

FIG. 18 is a timing chart to help explain a third stage write operation. First, as shown in FIG. 18, in the control signals supplied to the control signal input terminal 8 of FIG. 2, the command latch enable signal CLE is made high, the address latch enable signal ALE is made low, and the write enable signal WEn is made low, thereby taking in a data load command (80h, h represents hexadecimal). Thereafter, the command latch enable signal CLE is made low, the address latch enable signal ALE is made high, and the write enable signal WEn is made low, thereby inputting the address and write data as described above. The write data is stored in the SDC (shown in FIG. 1) of the data storage circuit (see FIG. 9) corresponding to the plane specified by the address. Thereafter, when a write command (15h or 10h) or a data transfer command (1Ah) is input, the data in the SDC of the data storage circuit 2 in the selected plane is transferred to the PDC and further transferred to the DDCA to DDCD. When data "1" (unwriting) is externally input, node N1a of the PDC goes high. When data "0" (writing) is input, node N1a of the PDC goes low. Thereafter, let data in the PDC be the potential at node N1a and the data in the SDC be the potential at node N2a.

FIGS. 19A to 19I show the relationship between commands and data in the first to third stages.

FIG. 19A shows a case where 2-bit (4-valued) data is written in the first stage. First, after an address and data for the lower page are input and a data transfer command (1Ah) is input, an address and data for the upper page are input and then a write command (10h or 15h) is input. In the circuit, since the address for the upper page has been input, it is seen that 4-valued data is to be written.

FIG. 19B shows a case where 1-bit (2-valued) data is written in the first stage. First, an address and data for the lower page are input and then a write command (10h or 15h) is input. In the circuit, since only the address for the lower page has been input, it is seen that 2-valued data is to be written.

FIG. 19C shows a case where 3-bit (8-valued) data is written in the first stage. First, an address and data for the lower page are input and then a data transfer command (1Ah) is input. Thereafter, an address and data for the upper page are input and a data transfer command (1Ah) is input. Then, an address and data for the higher page are input and a write command (10h or 15h) is input. In the circuit, since the address for the higher page has been input, it is seen that 8-valued data is to be written.

FIG. 19D shows a case where 2-bit (4-valued) data is written in the first stage. Even if the lower page is replaced with the upper page, since the upper page has been input, it is possible to recognize that 4-bit data is to be written. Specifically, FIG. 19E shows a case where 2-bit (4-valued) data is written in the first stage. First, as shown in FIG. 19B, 1-bit (2-valued) data is written. Then, as shown in FIG. 19E, an address and data for only the upper page are input. When a write command (10h or 15h) has been input, since an address for the upper page has been input, it is possible to recognize that 4-valued data is to be written. In this case, although data for the lower page has not been input, the data for the lower page previously written inside the circuit may be internally read in a read operation (or in an internal data load operation).

FIG. 19F shows a case where 4-bit (16-valued) data is written in the second stage. First, an address and data for the lower page are input and then a data transfer command (1Ah) is input. Thereafter, an address and data for the upper page are input and then a data transfer command (1Ah) is input. Then, after an address and data for the higher page are input and a data transfer command (1Ah) is input, an address and data for the top page are input and a write command (10h or 15h) are input. In this case, since the address for the top page has been input, it is possible to recognize that 4-bit (16-valued) data is to be written. However, this sequence is the same as in a case where 4-bit (16-valued) data is written in the third stage. Therefore, to distinguish between the second stage and third stage, for example, command 0Dh is input before writing in the case of the second stage.

FIG. 19G shows a case where only the address and data for the higher page and the address and data for the top page are input and the previously input data are internally loaded as the data for the lower page and upper page.

FIG. 19H shows a case where 4-bit (16-valued) data is written in the third stage. First, the address and data for the lower page are input and a data transfer command (1Ah) is input. Thereafter, the address and data for the upper page are input and a data transfer command (1Ah) is input. Then, the address and data for the higher page are input and a data transfer command (1Ah) is input. Then, the address and data for the top page are input and a write command (15h or 10h) is input. Since the address for the top page has been input, it is possible to recognize 4-bit (16-valued) data is to be written. In the third stage operation, the order of the address and data to be input may be changed as shown in FIG. 19I.

FIG. 19J shows a case where two planes are written into simultaneously in FIG. 19H. Moreover, as shown in FIG. 19K, data may be input in an arbitrary sequence. Although short busy is output by inputting command 11h, the command may be omitted.

In the second stage write operation, the erased cells are also written into to level 0. In the case of an REASB (Erased Area Self Boost) write operation, the selected word line is set at Vpgm (24V). The word line adjacent to the selected word line on the source side is set at Vpass or an intermediate potential. The potential of the word line adjacent to the word line is set at Vss (ground potential), thereby turning off the cell. In this way, erroneous writing is prevented. However, when the threshold voltage of the erased cell is too low, the cell cannot be turned off. Therefore, the erased cells are also written into to level 0.

FIG. 20 shows an example of the DDC control circuit 7-1 shown in FIG. 2. The DDC control circuit 7-1 generates signals DTGA to DTGD and signals REGA to REGD shown in FIG. 1 in sequence and controls the operations of the DDCA, DDCB, DDCC, and DDCD. Moreover, the DDC control circuit 7-1 changes the relationship between the data stored in the DDCA, DDCB, DDCC, and DDCD and the page addresses. Specifically, write data is supplied to the data storage circuit in an arbitrary order and is stored via the SDC and PDC into any one of the DDCA, DDCB, DDCC, and DDCD. Therefore, it is necessary to recognize to which page addresses the data stored in the DDCA, DDCB, DDCC, and DDCD correspond. Moreover, the DDCA to DDCD, which are dynamic caches, have to refresh the stored data periodically. At this time, the data stored in the DDCA to DDCD and PDC are transferred using the DDCA to DDCD, TDC, and PDC, thereby refreshing the data. To carry out the refresh operation, it is necessary to recognize which data has been transferred to the DDCA to DDCD and PDC. The DDC control circuit 7-1 stores the data for which page has been stored in the DDCA, DDCB, DDCC, DDCD, and PDC, which makes it possible to control the positions of a plurality of items of data accurately.

In FIG. 20, converters 7a to 7e correspond to the DDCA, DDCB, DDCC, DDCD, and PDC, respectively. These converters 7a to 7d hold data representing logical cache names, LDDC0, LDDC1, LDDC2, LDDCQ, LDDCP according to the lower page, upper page, higher page, top page, and PDC. These items of data can be transferred between the converters 7a to 7e.

Each of the converters 7a to 7d has a first to a fifth input end and a first and a second output end. The converter 7e has an input end and an output end. To the first input end of each of the converters 7a to 7d, any one of the lower page (L), upper page (U), higher page (H), and top page (T) converted into 4-bit data by, for example, a decoder 7f is supplied. The decoder 7f sequentially decodes the page address input according to a command. To the second input end, DDC set signal DDCSET is supplied. The DDC set signal DDCSET sets a DDC set mode that permits the decoder 7f to input a page address. To the third input of each of the converters 7a to 7d, for example, a 4-bit select signal SLDDC (0:3) to select the DDCA to DDCD is supplied. To the fourth input end of each of the converters 7a to 7d, a mode change signal MEXC is supplied. The mode change signal MEXC sets a refresh mode. The fifth input end of each of the converters 7a to 7d is connected to the output end of the converter 7e. In the refresh mode, the output signal of the converter 7e is transferred to one of the converters 7a to 7d.

The first output end of each of the converters 7a to 7d is connected to one input end of the corresponding one of AND circuits 7g to 7j that selectively output signals REGA to REGD and further to one input end of the corresponding one of AND circuits 7k to 7n that selectively output signals DTGA to DTGD. A signal REG is supplied to the other input ends of the AND circuits 7g to 7j. A signal DTG is supplied to the other input ends of the AND circuits 7k to 7n. When a signal SLDDC for selecting the DDCA to DDCD is supplied and the signals DDCASL to DDCDSL are output from one or more first output ends of the converters 7a to 7d, the AND circuit 7g to 7j output signals REGA to REGD according to the output signals. When a signal SLDDC for selecting the DDCA to DDCD is supplied and the signals DDCASL to DDCDSL are output from one or more first output ends of the converters 7a to 7d, the AND circuit 7k to 7n output signals DTGA to DTGD according to the output signals.

The second output ends of the converters 7a to 7d are connected to the input end of the converter 7e. When the DDCA to DDCD are refreshed, data LDDC output at the second output end of one of the converters 7a to 7d is supplied to the input end of the converter 7e according to the mode change signal MEXC. Data LDDC output from the converter 7e is supplied to one of the converters 7a to 7d. The refresh operation will be explained in detail later.

Figure 21:
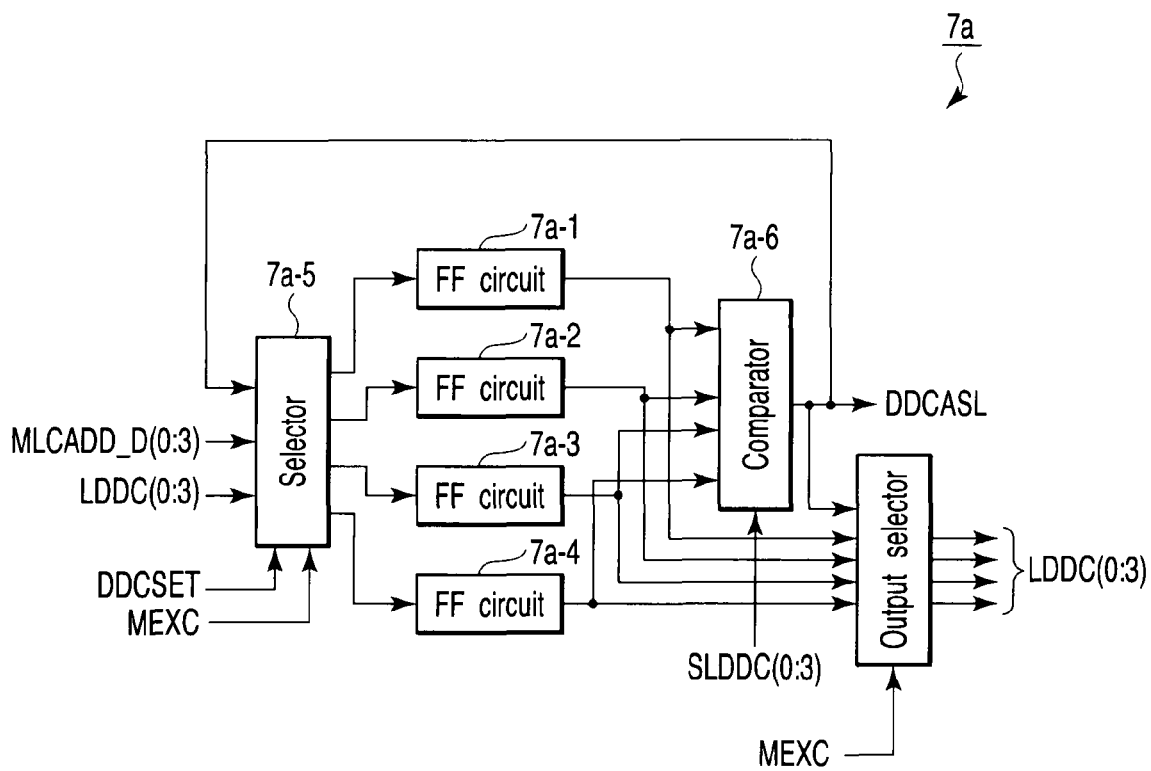
FIG. 21 is a configuration diagram of a converter shown in FIG. 20.

FIG. 21 shows a configuration of the converter 7a. The converters 7a to 7d have almost the same configuration, except for the input signals. Accordingly, only the configuration of the converter 7a will be explained.

The converter 7a includes four flip-flop circuits 7a-1 to 7a-4 constituting a register, a selector 7a-5 for selecting an input signal to each of the flip-flop circuits 7a-1 to 7a-4, and a comparator 7a-6. Each of the flip-flop circuits 7a-1 to 7a-4 stores one of 4-bit data items. Default data can be preset in each of the flip-flop circuits 7a-1 to 7a-4. The output signal of each of the flip-flop circuits 7a-1 to 7a-4 is supplied to not only the comparator 7a-6 but also to an output selector (not shown). According to the mode change signal MEXC, the output selector causes the one of the converters 7a to 7d corresponding to the DDCA to DDCD now in a refresh operation to supply an LDDC signal to the output converter 7e.

The comparator 7a-6 compares the output signal of one of the flip-flop circuits 7a-1 to 7a-4 with select signal SLDDC (0:3). If they coincide with each other, the comparator 7a-6 brings the select signal DDCASL into the active state, or to the high level.

The selector 7a-5 switches between the input signals of the flip-flop circuits 7a-1 to 7a-4 according to the mode change signal MEXC. Specifically, the selector 7a-5 selects the page address supplied from the decoder 7f when the DDC set signal DDCSET is in the active state, for example, at the high level, and selects data LDDC (0:3) supplied from the converter 7e when the mode change signal MEXC is in the active state, for example, at the high level and the output signal of the comparator 7a-6 is in the active state. Therefore, data LDDC (0:3) output from the converter 7e is supplied to the selected converter.

Figure 22:
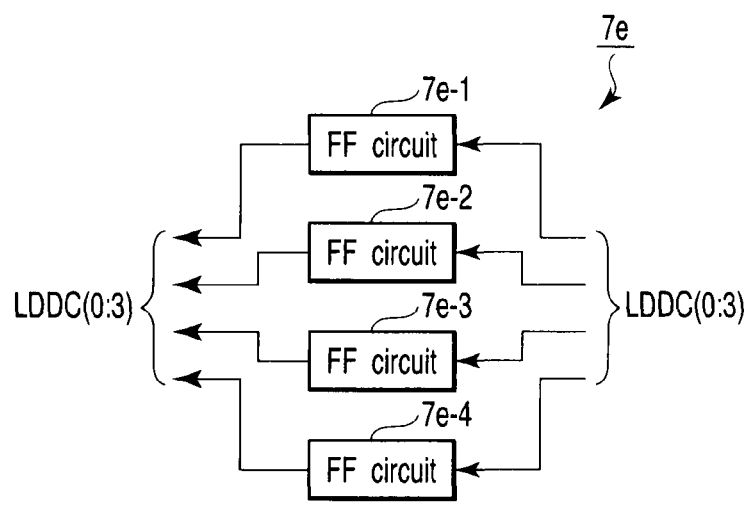
FIG. 22 is a configuration diagram of another converter shown in FIG. 20.

FIG. 22 shows an example of the converter 73. The converter 7e is composed of flip-flop circuits 7e-1 to 7e-4. According to the mode change signal MEXC, data LDDC (0:3) output from the one of the converters 7a to 7d corresponding to the DDCA to DDCD now in a refresh operation is supplied to each of the flip-flop circuits 7e-1 to 7e-4. The data stored in each of the flip-flop circuits 7e-1 to 7e-4 is supplied to any one of the converters 7a to 7d corresponding to the DDCA o DDCD now in a refresh operation.

With the above configuration, the operation of the DDC control circuit 7-1 will be explained. The converters 7a to 7d correspond to the DDCA to DDCD. In the default state, LDDC0, LDDC1, LDDC2, and LDDCQ are set in the converters 7a, 7b, 7c, and 7d, respectively, and LDDCP is set in the converter 7e. When the address and data to be written are input, the select signal SLDDC (0:3) goes into the active state in this order: SLDDC2, SLDDC1, SLDDC0, and SLDDCQ. Therefore, the input condition for the comparator 7a-6 of FIG. 21 is satisfied in the order of comparators 7c, 7b, 7a, and 7d. Consequently, the select signal from the comparator 7a-6 in each of the comparators 7c, 7b, 7a, 7d is output in this order: DDCCSL, DDCBSL, DDCASL, and DDCDSL. As this time, the signal DTG of FIG. 20 is in the active state, or, for example, at the high level. The input conditions for the AND circuits are satisfied in the order of 7m, 7l, 7k, and 7n and the signals are output in the order of DTGC, DTGB, DTGA, and DTGD. Therefore, according to a data transfer command, the data transferred from the SDC to PDC in FIG. 1 is stored in this order: DDCC, DDCB, DDCA, and DDCD.

Thereafter, after a write command is input, when the DDC set signal DDCSET of FIG. 20 is in the active state, or, for example, at the high level, the page address supplied from the decoder 7f is supplied to the converters 7a to 7d. At this time, according to the select signal SLDDC (0:3), the converters are selected in the order of 7c, 7b, 7a, 7d. Consequently, the data in the decoder 7f is supplied to the converters 7c, 7b, 7a, 7d in that order. Therefore, for example, as shown in FIG. 20, if the page data supplied from the decoder 7f is for the top page (T), higher page (H), upper page (U), and lower page (L), the data for the top page (T), higher page (H), upper page (U), and lower page (L) are set in the flip-flop circuits in the converters 7c, 7b, 7a, and 7d, respectively.

In this way, the data stored in the DDCA to DDCD shown in FIG. 1 coincide with the page addresses.

(Refreshing)

Next, a refresh operation will be explained.

When data transfer command 1Ah is input, the data in the SDC in the data storage circuit 2 in the selected plane is transferred to the PDC and further to the DDCA to DDCD. Since each of the DDCA to DDCD is a capacitance for storing data by the gate capacity of the transistor, a refresh operation is needed. Therefore, after transfer command 1Ah has been input, when the transfer of data to the DDCA to DDCD has been completed, the chip changes from the busy state to the ready state to wait for the next data to be input. However, inside the data storage circuit 2, a refresh operation is repeated.

For example, when the data in the DDCA is refreshed in FIG. 1, first, signal VPRE is set at Vss (ground potential) (VPRE=Vss) and signal BLPRE is set at Vss (BLPRE=Vss), thereby turning on the transistor 61u, which sets node N3 of the TDC at Vss. Thereafter, signal VPRE is set at Vdd (VPRE=Vdd) and signal PEGA is set at the high level (REGA=H level), thereby turning on the transistor 61qD. Then, when DDCA=H level, the TDC goes to the H level. When DDCA=L level, the TDC remains at the L level. Thereafter, signal DTGA is set at the H level temporarily and the data in the PDC is copied into the DDCA. Then, BLC1 is set at the high level (BLC1=H level), thereby transferring the data in the TDC to the PDC. By these operations, the data in the DDCA moves to the PDC and the data in the PDC moves to the DDCA. Performing these operations once more causes the data in the DDCA to return to the original state. As described above, to refresh the data in the DDCA, two refresh operations are needed.

In the case of a memory in which 16-valued data is written in the embodiment, the data storage circuit 2 has four dynamic data latches, DDCA, DDCB, DDCC, and DDCD, as shown in FIG. 1. Therefore, when data is moved by the above operations, eight refresh operations are needed. In the first embodiment, a refresh operation can be carried out at high speed.

Figure 23:
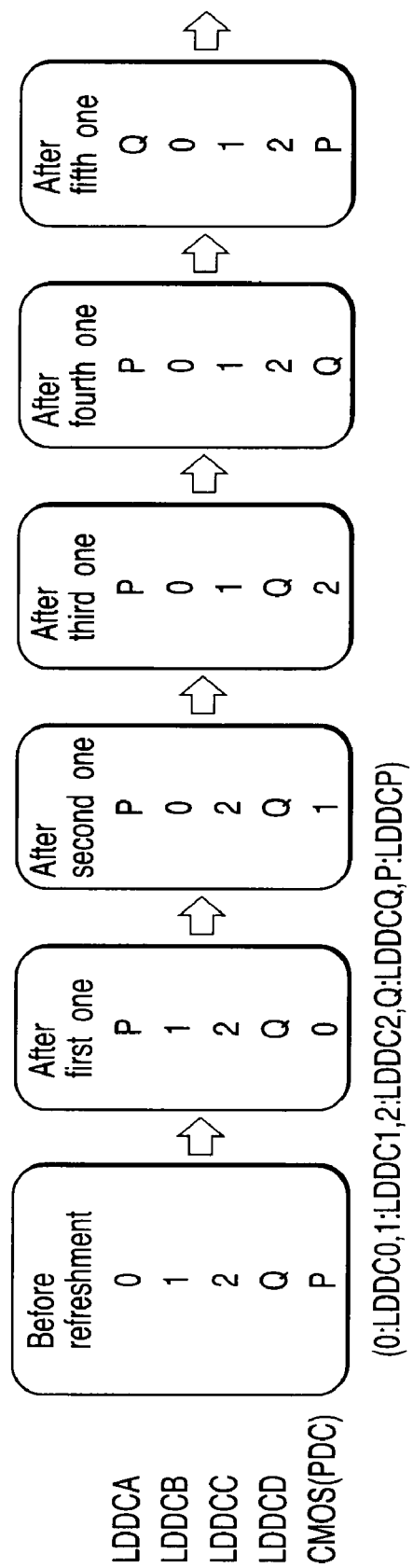
FIG. 23 is a diagram to help explain an example of a refresh operation.

FIG. 23 shows a refresh operation. As shown in FIG. 23, for example, suppose the data stored in the DDCA, DDCB, DDCC, DDCD, and PDC before refreshment are LDDC0, LDDC1, LDDC2, LDDCQ, and LDDCP, respectively (each representing a logical cache name). When these data items move through the DDCA to DDCD, and PDC (in FIG. 5, LDDC0, LDDC1, LDDC2, LDDCQ, and LDDCP are simply represented as 0, 1, 2, P, and Q, respectively), all of the data moves as a result of a fifth movement of data. Data is refreshed by one movement. Accordingly, as a result of the fifth data movement, all of the data has been refreshed. After the fifth data movement, LDDC0, LDDC1, LDDC2, LDDCQ, and LDDCP are stored in the DDCB, DDCA, DDCC, DDCD, and PDC, respectively. That is, although the data cache in which LDDC0 has been stored is the DDCA before refreshment, LDDC0 is stored in the DDCB after refreshment. The positional relationship of data in the DDCA, DDCB, DDCC, DDCD, and PDC before refreshment differs from that after refreshment. However, the refresh operation is performed using the DDC control circuit 7 shown in FIGS. 20, 21, 22, thereby making it possible to always keep the correspondence between the data items stored in the DDCA, DDCB, DDCC, DDCD, PDC and the page addresses.

Specifically, suppose the data items stored in the individual registers in the converters 7a to 7e of FIG. 20 are LDDC0, LDDC1, LDDC2, LDDCQ, and LDDCP, respectively, as before refreshment shown in FIG. 23.

In this state, if the mode change signal MEXC shown in FIGS. 20 and 21 is made active and, for example, LDDC0 is selected by select signal SLDDC (0:3), the input condition for the comparator 7a-6 of the converter 7a is satisfied. As a result, the converter 7a outputs signal DDCASL. At this time, signals REG, DTG shown in FIG. 20 are made high and signals REGA, DTGA are made high.

On the other hand, before the data in the DDCA is transferred, signal BLPRE shown in FIG. 1 is set at the H level, signal VPRE is set at the L level, for example, at Vss (ground potential), and node N3 is reset to the ground potential. Thereafter, signal VPRE is set at the H level, for example, at Vdd. When signal REGA is made high, turning on the transistor 61qA, which causes the data in the DDCA to be transferred to the TDC. That is, when the gate of the transistor 61rA is at the H level, node N3 is made high. When the gate of the transistor 61rA is at the L level, node N3 is caused to remain at the L level.

Furthermore, according to signal DTGA shown in FIG. 20, the transistor 61sA is turned on, causing the data in the PDC to be transferred to the DDCA. Thereafter, signal BLC1 is made high, causing the data in the TDC to be transferred via the transistor 61h to the PDC.

At this time, data LDDCP corresponding to the PDC of the converter 7e shown in FIG. 20 is transferred to the converter 7a and data LDDC0 corresponding to DDCA stored in the converter 7a is transferred to the converter 7e.

When the first transfer operation is carried out as described above, the result is as shown in FIG. 23. Such an operation is carried out on LDDC1, LDDC2, LDDCQ, and LDDCP in that order, which enables the data in the DDCA to DDCD to be refreshed by five transfer operations. In addition, since the positions of the data items after refreshment are stored in the converters 7a to 7e, the data items can be controlled accurately.

(Write Sequence, Data Load, Program)

Figure 24:
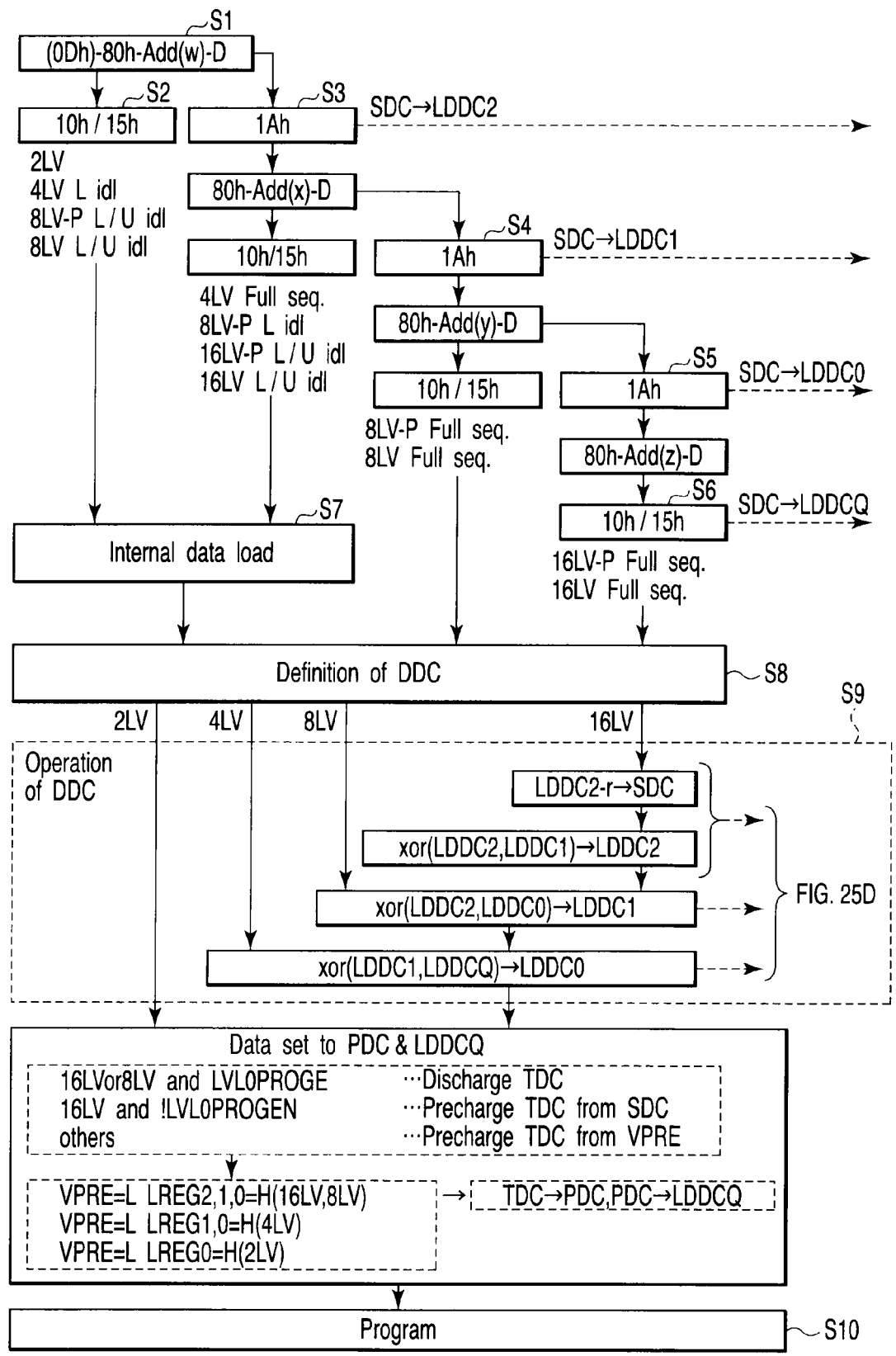
FIG. 24 is a diagram to help explain a write sequence.

FIG. 24 shows a write sequence. FIGS. 25A, 25B, 25C, 25D, and 25E show the relationship between 16-valued, 8-valued, 4-valued, and 2-valued input data and write levels in the write sequence shown in FIG. 24.

As shown in FIG. 24, according to 80h (data load command)—Add (address)—D (data), an arbitrary page (e.g., 2 kB) of data is externally input to the SDC of the data storage circuit 10 (S1 in FIG. 25A). If only one page of data is input, a write command 10h or a cache write command 15h is input (S2). If a plurality of pages of data are input, command 1Ah is input. In the case of 1Ah, the data in the SDC is transferred via the PDC to the DDCA to DDCD. As described above, in the embodiment, in the case of a first 1Ah, the data in the SDC is transferred to LDDC2 (DDCC) (S3). In the case of a second 1Ah, the data in the SDC is transferred to LDDC1 (DDCB) (S4). In the case of a third 1Ah, the data in the SDC is transferred to LDDC0 (DDCA) (S5). Thereafter, when a write command 10h or a cache-function-added write command 15h is input (S6), the data in the SDC is transferred to LDDCQ (DDCD), bringing the chip into the busy state (see FIG. 18). Moreover, when the data is transferred to the SDC, PDC, DDCA to DDCD, it is determined at which one of the 16-valued, 8-valued, 4-valued, and 2-valued (16 LV/8 LV/4 LV/2 LV) levels the write level is.

The data storage circuit 10 of FIG. 1 transfers the data in the SDC to the PDC and DDCA to DDCD according to the output signal of the DDC control circuit 7-1. Hereinafter, explanation will be given, provided that the data items stored in the DDCA to DDCD and PDC are LDDC0, LDDC1, LDDC2, LDDCP, and LDDCQ, respectively.

The data in the SDC is transferred to LDDCQ according to the data in the DDC control circuit 7-1 shown in FIG. 20. Thereafter, if the number of times data is input is small for the write level, internal data is loaded into an empty LDDC (S7). FIG. 25B shows the relationship between the data externally input and data input by an internal data load and the data stored in the data caches after the input. In FIG. 25B, data marked with L or U indicates that internal data has been loaded into an empty LDDC when the number of times data was input is small for the write level. For convenience' sake, W, X, Y, and Z show the order in which data is input arbitrarily.

Thereafter, the data caches DDCA and DDCB are defined (S8, FIGS. 25C and 25D).

That is, as described above, the correspondence between the data stored in the DDCA and DDCB and the page addresses is defined. Specifically, in the case of 16-valued data, the DDC which stores the data for the lower page is defined as LDDC2, the DDC which stores the data for the upper page is defined as LDDC1, the DDC which stores the data for the higher page is defined as LDDC0, and the DDC which stores the data for the top page is defined as LDDCQ. In the case of 8-valued data, the DDC which stores the data for the lower page is defined as LDDC2, the DDC which stores the data for the upper page is defined as LDDC0, and the DDC which stores the data for the higher page is defined as LDDCQ. In the case of 4-valued data, the DDC which stores the data for the lower page is defined as LDDC1, and the DDC which stores the data for the upper page is defined as LDDCQ.

In the case of 2-valued data, the DDC which stores the data for the lower page is defined as LDDC0.

In the embodiment, a distinction between writing and unwriting is stored in the PDC. In the case of writing, the PDC stores the low level (PDC=L level). In the case of unwriting, the PDC stores the high level (PDC=H level). A method has been proposed in which not only the original verify level but also a rather low verify level is set and, if the rather low verify level has been exceeded, an increment in a subsequent write voltage is made smaller to narrower the write distribution. A determination of whether the rather low verify level has been exceeded is stored as LDDCQ. If the rather low verify level has not been exceeded, LDDCQ is set at the low level (LDDCQ=L level). If the rather low verify level has been exceeded, LDDCQ is set at the high level (LDDCQ=H level). To write 16-valued data, 4 bits of data are required to distinguish 16 values. These data items are stored as LDDC2, LDDC1, LDDC0, and SDC. To write 8-valued data, 3 bits of data are required to distinguish 8 values. These data items are stored as LDDC2, LDDC1, LDDC0. To write 4-valued data, 2 bits of data is required to distinguish 4 values. These data items are stored as LDDC1 and LDDC0.

FIG. 25E shows the writing levels and the data set in the data caches. By the operation of the data caches DDCA, DDCB shown in FIG. 24, step S9, and FIG. 25C, the data items at each threshold voltage are rearranged. Setting data at each threshold voltage in this way makes it possible to free the SDC, LDDC2, or the like from a write operation in sequence as the writing of data progresses. Therefore, since the next data can be set in the freed SDC, LDDC2, or the like, the writing speed can be made faster. To obtain such an effect, data is set as shown in FIG. 25E.

In FIG. 25E, 0-level to f-level are defined, starting at the lowest threshold voltage to a higher one. In an erase operation, the threshold voltage of a cell goes to 0-level. In a write operation, the threshold voltage of the cell rises from 1-level to f-level.

In the course of writing data, the writing of data to a lower threshold value is completed earlier than the writing of data to a higher threshold value. Therefore, in a case where the cache-function-added write command 15h is input, when the writing of data to 0-level to 7-level has been completed in writing 16-value data, the data in the SDC becomes unnecessary. Therefore, the ready state is shown outside the chip and the next write data is input. Thereafter, command "1Ah/10h/15h" is input, thereby bringing the chip into the busy state.

In the case of command 1Ah, when the writing of data to 8-level to b-level has been completed, the data in the LDDC2 becomes unnecessary. Therefore, after the data input in the SDC is moved to the LDDC2, the ready state is shown outside the chip, thereby enabling the next write data to be input. Thereafter, command "1Ah/10h/15h" is input, thereby bringing the chip into the busy state.

In the case of command 1Ah, when the writing of data to c-level and d-level has been completed, the data in the LDDC1 becomes unnecessary. Therefore, after the data input in the SDC is moved to the LDDC1, the ready state is shown outside the chip, thereby enabling the next write data to be input. Thereafter, command "1Ah/10h/15h" is input, thereby bringing the chip into the busy state.

In the case of command 1Ah, when the writing of data to e-level has been completed, the data in the LDDC0 becomes unnecessary. Therefore, after the data input in the SDC is moved to the LDDC0, the ready state is shown outside the chip, thereby enabling the next write data to be input. Thereafter, command 15h or command 10h, a write command, is input, thereby bringing the chip into the busy state. After the preceding page has been written into, the writing of data into the next page is started.

When 8-valued data is written, since the SDC is not used from the beginning, the ready state is shown outside the chip after the data cache is operated, which makes it possible to input the next write data. Thereafter, command "1Ah/10h/15h" is input, thereby bringing the chip into the busy state.

In the case of command 1Ah, when the writing of data to 0-level to 3-level has been completed, the data in the LDDC2 becomes unnecessary. Therefore, after the data input in the SDC is moved to the LDDC2, the ready state is shown outside the chip, thereby enabling the next write data to be input. Thereafter, command "1Ah/10h/15h" is input, thereby bringing the chip into the busy state.

In the case of command 1Ah, when the writing of data to 4-level and 5-level has been completed, the data in the LDDC1 becomes unnecessary. Therefore, after the data input in the SDC is moved to the LDDC1, the ready state is shown outside the chip, thereby enabling the next write data to be input. Thereafter, command "1Ah/10h/15h" is input, thereby bringing the chip into the busy state.

In the case of command 1Ah, when the writing of data to 6-level has been completed, the data in the LDDC0 becomes unnecessary. Therefore, after the data input in the SDC is moved to the LDDC0, the ready state is shown outside the chip, thereby enabling the next write data to be input. Thereafter, command 15h or command 10h, a write command, is input, thereby bringing the chip into the busy state. After the preceding page has been written into, the writing of data into the next page is started.

When 4-valued data is written, the SDC is not used from the beginning. Therefore, after the data cache is operated, the ready state is shown outside the chip, which makes it possible to input the next write data. Thereafter, command "1Ah/10h/15h" is input, thereby bringing the chip into the busy state.

In the case of command 1Ah, when 4-valued data is written, LDDC2 is not used. Therefore, after the data input in the SDC is moved to the LDDC2, the ready state is shown outside the chip, thereby enabling the next write data to be input. Thereafter, command 1Ah is input, thereby bringing the chip into the busy state.

In the case of command 1Ah, when the writing of data to 1-level has been completed, the data in the LDDC1 becomes unnecessary. Therefore, after the data input in the SDC is moved to the LDDC1, the ready state is shown outside the chip, thereby enabling the next write data to be input. Thereafter, command "1Ah/10h/15h" is input, thereby bringing the chip into the busy state.

In the case of command 1Ah, when the writing of data to 2-level has been completed, the data in the LDDC1 becomes unnecessary. Therefore, after the data input in the SDC is moved to the LDDC1, the ready state is shown outside the chip, thereby enabling the next write data to be input. Thereafter, command 15h or command 10h, a write command, is input, thereby bringing the chip into the busy state. After the preceding page has been written into, the writing of data into the next page is started.

When 2-valued data is written, the SDC is not used from the beginning. Therefore, after the data cache is operated, the ready state is shown outside the chip, which makes it possible to input the next write data. Thereafter, command "1Ah/10h/15h" is input, thereby bringing the chip into the busy state.

In the case of command 1Ah, when 2-valued data is written, the LDDC2 is not used. Therefore, after the data input in the SDC is moved to the LDDC2, the ready state is shown outside the chip, thereby enabling the next write data to be input. Thereafter, command 1Ah is input, thereby bringing the chip into the busy state.

In the case of command 1Ah, when 2-valued data is written, the LDDC1 is not used. Therefore, after the data input in the SDC is moved to the LDDC1, the ready state is shown outside the chip, thereby enabling the next write data to be input. Thereafter, command 1Ah is input, thereby bringing the chip into the busy state.

In the case of command 1Ah, when 2-valued data is written, the LDDC0 is not used. Therefore, after the data input in the SDC is moved to the LDDC0, the ready state is shown outside the chip, thereby enabling the next write data to be input. Thereafter, command 15h or command 10h, a write command, is input, thereby bringing the chip into the busy state. After the preceding page has been written into, the writing of data into the next page is started.

The above operations can be applied to three consecutive transfer commands 1Ah, that is, to a case where the next write data is fourth-page 16-valued data. However, for example, when the next write data is 2-valued data, first-page data is input and then 10h/15h, a write command, is input. However, for instance, another write command 16h may be prepared and, after command 16h is input, the data input in the SDC may be transferred to the LDDC. Thereafter, the next data may be externally input. Since the LDDC includes 2, 1, 0, and SDC, the data stored up to four pages beyond the present page may be loaded.

Similarly, in the case of 4-valued or 8-valued data, not only the next write data but also the data after the next data or further the data after the next next data can be loaded.

(Program Operation)

After the operation of the data caches and the definition of the data caches, a program operation is carried out (S10).

In FIG. 1, with signal BLC1 set at Vdd+Vth (the threshold voltage of the transistor), if data "1" (unwriting) is stored in the PDC, the bit line is at Vdd, and if data "0" (writing) is stored in the PDC, the bit line is at Vss. The cells connected to the selected word line on the unselected pages (whose bit lines are unselected) must not be written into. Therefore, the voltage Vdd is also supplied to the bit lines connected to these cells.

Then, after signal BLC1 is set at Vss (BLC1=Vss), the DDC which has stored data LDDCQ is selected. Specifically, the DDC control circuit 7-1 of FIG. 20 makes high one of the signals REGA to REGD corresponding to the DDC which has stored LDDCQ from DDCA to DDCE. When the rather low verify level has been passed, the bit line is set at an intermediate potential. However, since no verify operation has not been carried out in a first program verify loop, the bit line is not set at the intermediate potential.

Here, Vdd is supplied to the select line SG1 of the selected block, Vpgm (24 V) is supplied to the selected word line, and Vpass (10 V) is supplied to the unselected word lines. Then, if the bit line is at Vss, the channel of the cell is at Vss and the word line is at Vpgm, which causes writing to be done. If the bit line is at Vdd, the channel of the cell is not at Vss and rises toward Vpgm and reaches about Vpgm/2 by coupling. Therefore, a program operation is not carried out. If the bit line is at the intermediate potential, writing is done a little.

(Program Operation, Write Data Detection)

Signal line COMi of FIG. 1 is connected equally to all of the data storage circuits 10. During a write operation, signal line COMi is charged temporarily, making signal CHK2n high (CHK2n=H level) and signal CHK1 high (CHK1=H level). Since node N1a of the PDC of the data storage circuit 10 now being written into is at the L level, the transistor 61l goes on, making the potential of signal line COMi low. On the other hand, if nodes N1a of all of the data storage circuits are at the H level, the potential of signal line COMi remains at the H level. Therefore, it is seen that all of the writing has been completed.

Furthermore, connecting a current detecting circuit to signal line COMi makes it possible to count the number of data storage circuits now in the on state. For example, if the number of data storage circuits incompletely written into is small, terminating the write operation with a small number of cells not written into enables the writing speed to be improved. Although errors will occur in those cells when the data is read, they can be corrected by an error correction circuit.

(Program Operation, Refresh)

Since the DDCA to DDCD are capacitances as described above, a refresh operation is needed during a write operation or during a write recovery operation. The refresh operation is the same as a refresh operation after 1Ah is input as described above.

As shown in FIG. 26A, suppose data LPDC (a distinction between writing and unwriting) is stored in the PDC, LDDCQ (whether the rather low verify level has been exceeded) is stored in the DDCA, LDDC0 is stored in the DDCB, LDDC1 is stored in the DDCC, and LDDC2 is stored in the DDCD. After a fifth refresh operation, LPDC is stored in the PDC, LDDC2 is stored in the DDCA, LDDCQ is stored in the DDCB, LDDC0 is stored in the DDCC, and LDDC1 is stored in the DDCD.

(Program and Program Verify Read)

Figure 28:
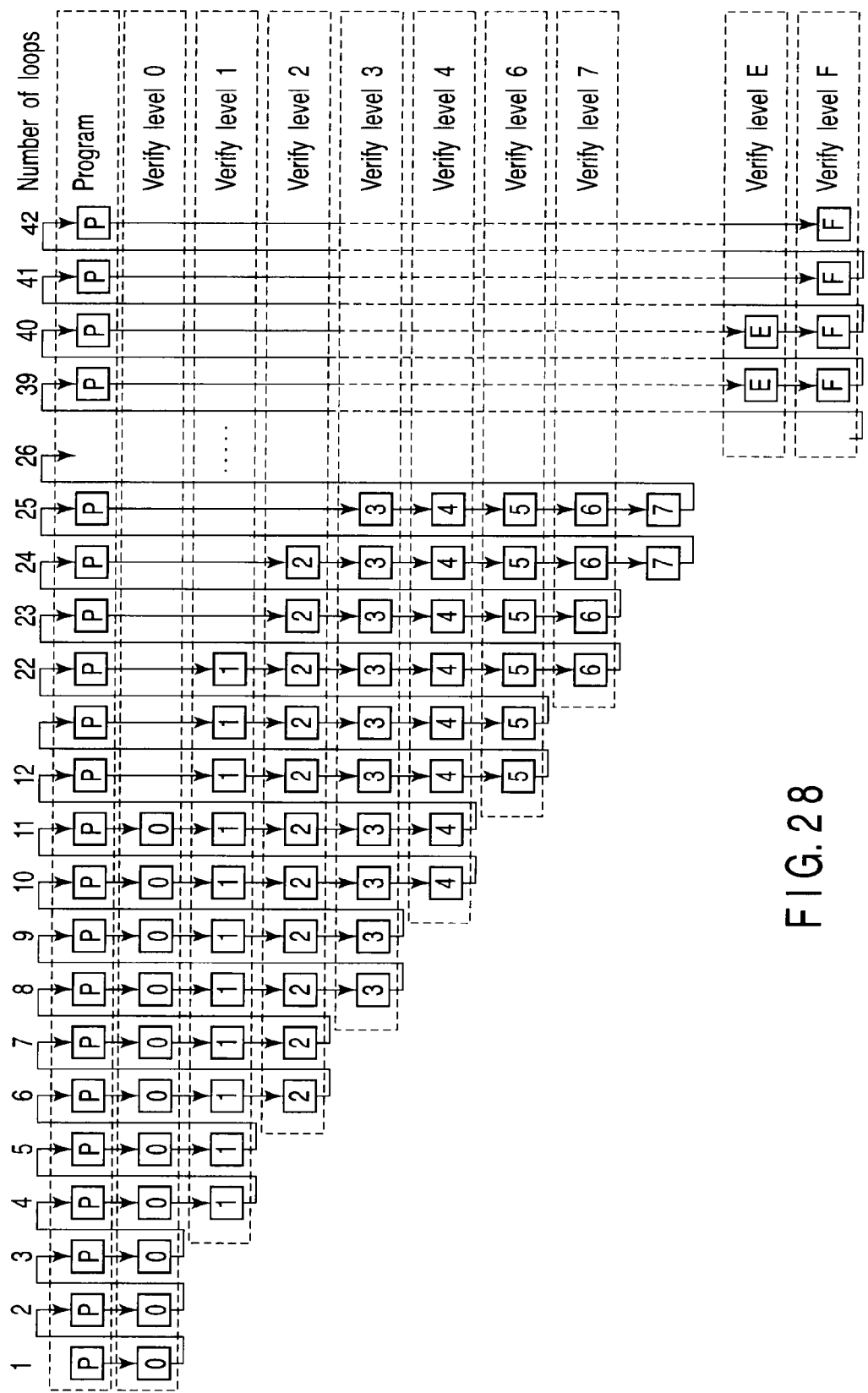
FIG. 28 is a diagram to help explain a program verify operation in a second stage.
Figure 29:
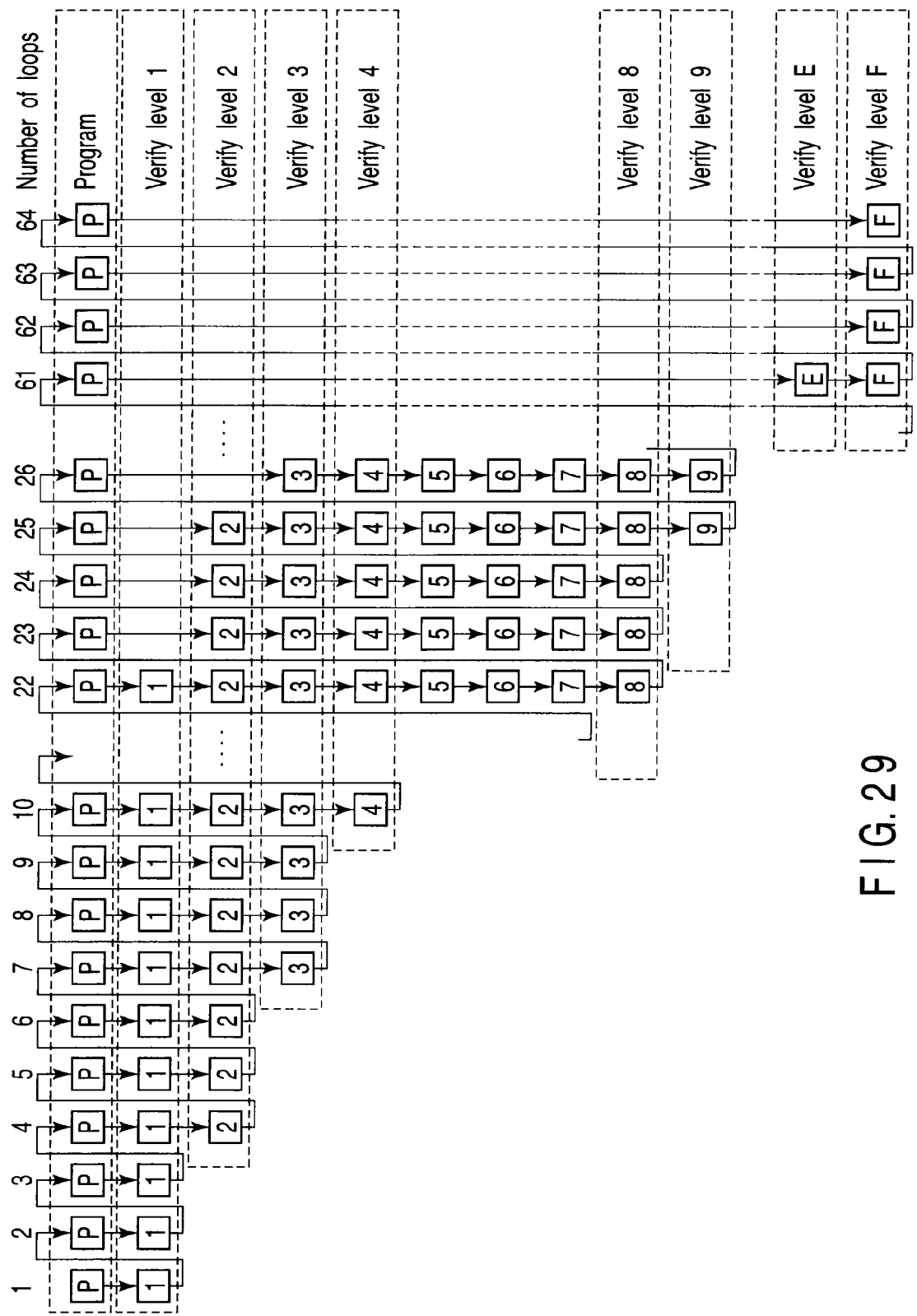
FIG. 29 is a diagram to help explain a program verify operation in a third stage.

FIGS. 27 to 29 show an example of the relationship between a program operation and a verify operation in a write sequence.

Figure 36:
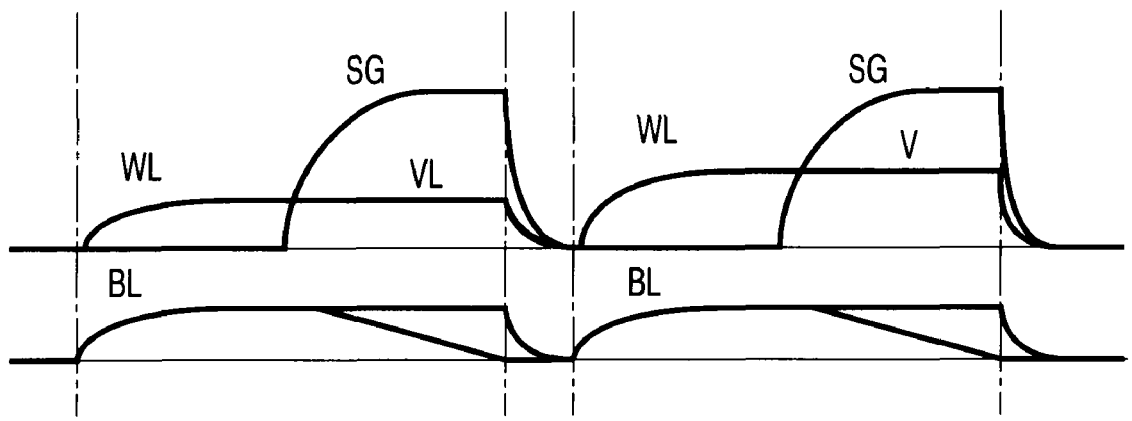
FIG. 36 is a waveform diagram showing potentials on a word line and a bit line at one level in a program verify operation.

FIG. 36 shows potentials on a word line and a bit line at one level in a program verify operation.

FIG. 36 shows the way a verify operation is carried out using two sequences: in one sequence, a verify operation is performed at a level (VL) lower than the original verify level, and in the other sequence, a verify operation is performed at the original verify level (V).

FIG. 27 shows an example of writing 3 levels in a first stage. FIG. 28 shows an example of writing 16 levels in a second stage. FIG. 29 shows an example of writing 15 levels in a third stage.

For example, in the third-stage write sequence shown in FIG. 29, since writing is done at a lower threshold level after the first write operation (program (P) whose number of loops is 1), a verify operation is carried out at level 1. Thereafter, a second write operation (program (P) whose number of loops is 2), a verify operation at level 1, a third write operation, and a verify operation at level 1 are carried out in that order. Then, after a fourth write operation, a verify operation at level 1 and a verify operation at level 2 are carried out. In this way, as the number of write loops increases, a verify operation at a higher level is started.

After a $22^{nd}$ write operation, a verify operation is carried out at level 1 to level 8. Then, after a $23^{rd}$ write operation, a verify operation is carried out at level 2 to level 8, omitting a verify operation at level 1. That is, even if there is a write bit to level 1 and a write operation is incomplete, a verify operation may not be performed in the $23^{rd}$ and later write operations. As described above, if the maximum number of verify operations is set in a verify operation at each level, an error will occur when the data is read from a cell in which writing has not been completed even after the maximum number has been reached. However, the error can be corrected at an error correction circuit. By doing this, the number of verify operations can be reduced, which enables the writing speed to be made faster. Moreover, since the SDC and DDC can be set free, the next write data can be input.

After a $61^{st}$ write operation, a verify operation is carried out at level E and level F. Then, a $62^{nd}$ write operation and a verify operation only at level F are performed. Then, a $63^{rd}$ operation and a $64^{th}$ operation, and a verify operation only at level F are carried out, which completes the operation. When write data detection during a write operation has shown that the writing of data into all of the data storage circuits 10 has been completed and the signal line COMi goes high, that is, when there is no cell to be written into, or when the number of cells to be written into becomes a specified value or less, a subsequent write operation and verify operation will not be carried out.

Furthermore, in a verify operation at each level, if there is no bit to be written at the present level, a verify operation will not be performed at this level and later. Whether there is a bit to be written at each level is detected during a verify operation at each level.

Figure 30:
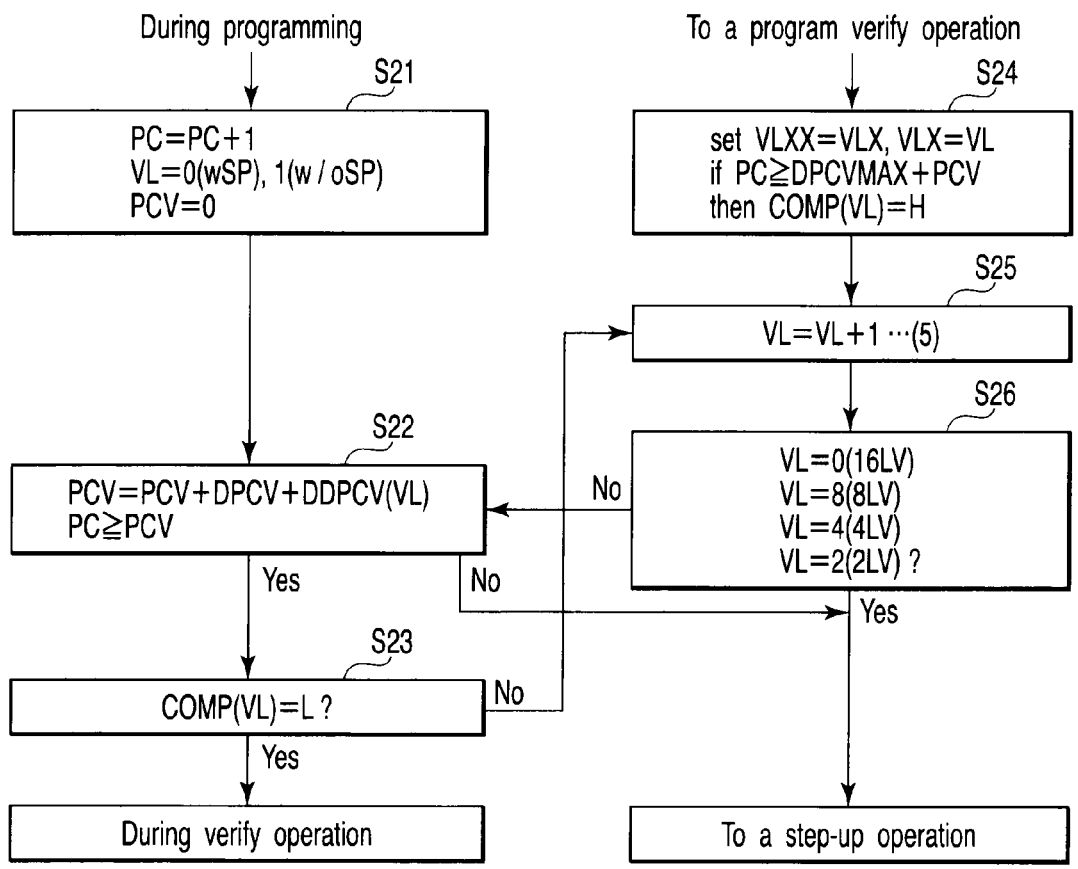
FIG. 30 shows a subroutine for detecting whether or not there is a bit to be written to each level.

FIG. 30 shows a sub-routine which determines whether to perform a program operation or a verify operation next in parallel with a program operation and a program verify operation. Moreover, when a program verify operation is carried out, it is determined at which level the operation is to be performed.

A PC is a program counter which counts the number of loops in a program and a PCV is a register which stores the number of times a program verify operation was started. The PCV is determined by PCV+DPCV+DDPCV (VL) (VL is a verify level) (PCV=PCV+DPCV+DDPCV). DPCV and DDPCV (0 V) to DDPCV (F) are the values stored in a ROM (not shown) in the chip. For example, in FIG. 29, DPCV=3 and DDPCV (0) to DDPCB (F)=0. In FIG. 28, DPCV=2, DDPCV(0)=1, and DDPCV (1) to DDPCV (F)=0. In FIG. 27, DPCV=4 and DDPCV (1) to DDPCV (3)=0.

In step S21, first, VL (the next verify level) is set at 0 (VL=0) and PCV is set at 0 (PCV=0). In step S22, it is determined whether the PC becomes equal to or larger than the PCV. If the result has shown that the PC has not reached the PCV, the program voltage is stepped up and the program is executed again.

If the PC has become equal to or larger than the PCV, it is determined in step S23 whether the writing of the next verify level has been completed. If the writing of the next verify level has not been completed, it follows that COMP (0)=L. Therefore, the program verify operation is carried out. At this time, since the program verify level is VL=0, a level-0 verify operation is carried out.

If the writing of the next verify level has been completed, it follows that COMP (0)=H. Therefore, in step S25, VL=VL+1 is executed and it is determined whether to perform the next program verify operation (S26). For example, if a level-0 verify operation is carried out, first, in step S24, VL is moved to the VLX (showing the present verify level) and the VLX is moved to VLXX (showing the preceding verify level).

Specifically, if VL=0, it follows that VLX=0. Here, it is determined whether the PC has reached the maximum number of loops set in each verify operation (PC≧DPCVMAX+PCV). If the PC has reached the maximum number, COMP (VL) is set at the high level (COMP(VL)=H). For example, the maximum number of loops is 8 in FIG. 27, 11 in FIGS. 28, and 22 in FIG. 23. Thereafter, in step S25, VL is set at VL+1 (VL=VL+1). Then, in step S26, it is determined whether VL is set at 0 (VL=0) in writing 16-valued data, VL is set at 8 (VL=8) in writing 8-valued data, VL is set at 4 (VL=4) in writing 4-valued data, or VL is set at 2 (VL=2) in writing 2-valued data. If these conditions are satisfied, the program voltage is stepped up, and the program is executed again. If the conditions are not satisfied, control goes to step S22, where it is determined where the next program verify operation is carried out.

(Program Verify: Bit Line Precharge)

FIGS. 31A, 31B, and 31C show level-1 and level-2 verify operations in the third stage shown in FIG. 29. FIGS. 32A and 32B show the relationship between write levels in a verify operation at level B in the third stage and data SDC, DDDC2 to LDDC0, and PDC stored in the corresponding data caches. After a first write operation, the data caches are as shown in FIGS. 31A and 32A.

For example, as shown in FIGS. 31A to 31C, when a level-1 verify operation is carried out, the control signal and control voltage generator circuit 7 supplies a voltage Vfix (e.g., 1.6 V) to the well of the selected cell, the source line, the unselected bit lines, and the select gates of the unselected blocks. A potential level 1' a little higher than potential level 1 in a read operation is supplied to the selected word line. Hereinafter, "'" indicates a verify potential a little higher than the read potential. Therefore, in a read operation and a verify operation, when the potential supplied to the selected word line is lower than Vfix, a negative potential seems to be supplied to the gate of the cell. At the same time, Vread (the potential in a read operation) is supplied to the unselected word lines of the selected block and a specific potential is supplied to the select gate SGD of the selected block.

Next, signal VPRE of the data storage circuit 10 of FIG. 1 is set at Vdd (e.g., 2.5 V), signal BLPRE is set at Vsg(Vdd+Vth), signal BLCLAMP is set at, for example, (0.6 V+Vth)+Vfix temporarily, and the bit line is precharged to, for example, 0.6 V+Vifx=2.2 V. Thereafter, after signal BLPRE is set at Vss (BLPRE=Vss) and signal BLCLAMP is set at Vss (BLCLAMP=Vss), a specific potential is supplied to the select gate SGS.

If the threshold value of the cell is higher than verify level 1', the cell goes off. Therefore, the bit line remains at the high level (H level) (e.g., 2.2 V). If the threshold value is lower than verify level 1', the cell goes on. As a result, the bit line is discharged and becomes equal to the same potential as that of the source, that is, Vfix (e.g., 1.6).

(Program Verify: Data Inverting/Noninverting Refresh)

During the time when the bit line is being discharged, the data caches are refreshed as shown in FIG. 26B. At this time, for example, as shown in FIG. 31B, a refresh operation is carried out in such a manner that only the data in the LDDC0 is inverted so as to make zero the data in the data storage circuit written into to level 1 in a level-1 verify operation. Moreover, a refresh operation is carried out in such a manner that the data in the LDDC1 and LDDC0 are inverted so as to make zero the data in the data storage circuit written into to level 2 in a level-2 verify operation of FIG. 31C after the level-1 verify operation of FIG. 31B. Therefore, as shown in FIG. 26B, if the XOR (exclusive OR) of the preceding verify VLXX (k) and the present verify VLX (k) is 1, an LDDC (k) carries out a refresh operation by inversion.

Here, when a verify operation is carried out at the rather low verify level, the operation is performed in such a manner that data LPDC is stored in the PDC and data LDDCQ is stored in the DDC. Moreover, when a verify operation is carried out at the original verify level, the operation is performed in such a manner that data LDDCQ is stored in the PDC and data LPDC is stored in the DDC.

(Program Verify: Bit Line Potential Reading)

As shown in FIG. 26C, when a verify operation is carried out at level 0 to level 7, the SDC is set at the high level (SDC=H) and node N3 of the TDC of the data storage circuit written into to level 0 to level 7 is precharged at Vdd. When a verify operation is carried out at level 8 to level F, signal BLPRE is set temporarily at Vsg(Vdd+Vth) and node N3 of the TDC is precharged at Vdd. After signal BOOST is changed from the L level to the H level, signal BLCLAMP is set at, for example, (0.45 V+Vth)+Vfix. When the TDC is precharged to Vdd and the potential on the bit line is lower than 0.45 V+Vifx, node N3 of the TDC goes to the L level (Vfix (e.g., 1.6 V)). When the potential on the bit line is higher than 0.45 V, node N3 remains at the H level ($\alpha$Vdd (e.g., 4.25 V)). After signal BLCLAMP is set at Vtr (e.g., 0.1 V+Vth) (BLCLAMP=Vtr), signal BOOST is changed from the H level to the L level.

Thereafter, signal VPRE is set at Vss. For example, in a verify operation at level 1 (VLX=1, 0001) shown in FIG. 31B, signal REG corresponding to LDDC2 and LDDC1 is made high. The data in each data storage circuit is as shown in FIG. 31B. Therefore, in the data storage circuit written into to level 1, only when the verify level has been reached, the TDC goes to the H level. When the verify level has not been reached, the TDC remains at the L level. Furthermore, when the data storage circuit has been written into to level 8 to level F, the data in the SDC is 0. Consequently, the TDC is at Vss from the beginning. Moreover, when the data storage circuit has been written to into level 2 to level 7, signal REG is made high, forcing the TEC to be set at Vss (TDC=Vss). For example, in a verify operation at level B (VLX=B, 1011) shown in FIGS. 32A and 32B, signal REG corresponding to data LDDC2 is made high. The data in each data storage circuit is as shown in FIG. 32B. Therefore, in a data storage circuit written into to level B, only when the verify level has been reached, the TDC goes to the high level. When the verify level has not been reached, the TDC remains at the L level. When the data storage circuit has been written into a level lower than level B, the cell goes on. As a result, the TDC is at the L level. Therefore, in a data storage circuit written into to level B, only when the verify level has been reached, the TDC goes to the H level. When the verify level has not been reached, the TDC remains at the L level. When the data storage circuit has been written into to level C to level F, making signal REG high forces the TDC to be set at Vss.

Specifically, suppose level n is VLX=VLX (3), VLX (2), VLX (1), or VLX (0). In a verify operation at level n, when VLX (3)=0, the TDC is precharged by data from the SDC. When VLX(3)=1, signal BLPRE is set temporarily to Vsg (Vdd+Vth) and node N3 of the TDC is precharged to Vdd. VLX(2), VLX(1), and VLX(0) correspond to LDDC2, LDDC1, and LDDC0. Signal REG in the LDDC for VLX (2)=0, VLX (1)=0, and VLX(0)=0 is made high, forcing the TDC to be set at Vss (TDC=Vss).

Here, signal VREG is set at the H level (VREG=H). When a verify operation is carried out at a rather low level, signal REG corresponding to the LDDCQ is made high. When a verify operation is carried out at the original level, signal REG corresponding to the LPDC is made high, forcing the TDC to be set at Vdd. Thereafter, signal BLC1 is set at Vsg(Vdd+ Vth), thereby reading the potential in the TDC into the PDC. As a result, when a verify operation is carried out at a rather low level, the data in LDDCQ is stored in the PDC. When a verify operation is passed, the PDC goes to the H level. Moreover, when the verify level has not been reached, the PDC is at the L level. When a verify operation is performed at the original verify level, the data in the LPDC is stored in the PDC. When a verify operation is passed, the PDC goes to the H level. When the verify level has not been reached, the PDC goes to the L level.

(Program Verify: Comp)

Thereafter, whether writing at the verify level has been completed is verified. This operation is carried out during the recovery of the verify sequence at the original verify level. The verification detects the presence or absence of verify data.

FIG. 26D shows the sequence of a verify operation. Specifically, in a verify operation at level 0 to level 7, signal BLC2 is set at the H level. In a verify operation at level 8 to level F, signal VPRE is set at Vdd. In this state, signal BLPRE is made high, thereby charging the TDC. Only in a data storage circuit written into to level 0 to level 7 in a verify operation at level 8 to level F and in a verify operation at level 0 to level 7, the TDC goes high. Thereafter, signal VPRE is made low and signal REG corresponding to the LDDC0, LDDC1, and LDDC2 is made high. Then, for example, in a level-1 verify operation shown in FIG. 31B, since the TDC of a data storage circuit written into to level 8 to level F is at the L level from the beginning and any one of the LDDC2 to LDDC0 of a data storage circuit written into to level 0 and to level 2 to level 7 is at the H level, the TDC is at the L level. Moreover, only the TDC of a data storage circuit written into to level 1 is at the H level.

For example, in the case of a verify operation at level B shown in FIG. 32B, any one of the LDDC2 to LDDC0 of a data storage circuit written into to level 3 and level B is at the H level. Therefore, the TDC is at the L level and only the TDC of the data storage circuit written into to level 3 and level B is at the H level.

Thereafter, just as data now being written is detected, the signal line COMi connected equally to all of the data storage circuits is charged temporarily and signal CHK2n is made low and signal CHK1 is made high. Then, the PDC of the data storage circuit now being written into is at the L level and, only when the TDC is at the H level, the transistor 61l goes on, lowering the potential of the signal line COMi. Therefore, while the level is being written, it can be determined whether there is a cell written into incompletely.

However, in the case of FIG. 32B, when a level-B verify operation is carried out, if a data storage circuit incompletely written into to level 3 is left, data detection at level B does not pass.

(Data Cache Setting)

As shown in each of FIGS. 27, 28, and 29, after a program operation and a program verify operation are repeated several times, a low-level writing operation should be completed. However, when there happens to be a cell containing several bits written into slow, the verify operation is repeated until the writing of data into the cell has been completed. Therefore, a verify operation is prevented from being repeated more than a specific number of times. However, for example, in the case of the example of FIG. 32B, when a verify operation at level B is carried out, if a data storage circuit incompletely written into to level 3 is left, the data detection at level B does not pass. Accordingly, in writing 16-valued data, when writing at level 0 to level 7 has been completed, or when a specific maximum number of loops has been reached, the SDC is set free. However, before this, a data storage circuit written into to level 0 to level 7 is written into to level F and then the SDC is set free.

Furthermore, when 16-valued data is written, when 8-valued data is written to level 8 to level B, when the writing of data to level 0 to level 3 is completed, or when a specific maximum number of loops has been reached, the LDDC2 is set free. However, before this, a data storage circuit in such a written state is written into to level F (16-valued data) and level 7 (8-value data) and then the LDDC2 is set free.

Moreover, when 16-valued data is written, when 8-valued data is written to level C and level D, when 4-value data is written to level 4 and level 5, when the writing of data to level 1 is completed, or when a specific maximum number of loops has been reached, the LDDC1 is set free. However, before this, a data storage circuit written into is written into to level F (16-valued data), level 7 (8-value data), and level 3 (4-valued data) and then the LDDC1 is set free.

In addition, when 16-valued data is written, when 8-valued data is written to level E, when 4-valued data is written to level 6, when the writing of data to level 2 is completed, or when a specific maximum number of loops has been reached, the LDDC0 is set free. However, before this, a data storage circuit written into is written into to level 15 (16-valued data), level 7 (8-value data), and level 3 (4-valued data) and then the LDDC0 is set free.

On the other hand, in writing data to level 0, the deep threshold voltage of a cell to be erased is only made shallower. Therefore, after the writing of data to level 0 is completed or the specific maximum number of loops has been reached, the PDC is forced to be at the H level (unwriting), thereby preventing the number of data storage circuits incompletely written into from being determined. In this case (OMITOPSPASS=H level: OMITOPSPASS is a parameter for forcing the PDC to be set at the H level after the specific maximum number of loops has been reached), too, after the writing of data to level 0 is completed or the specific maximum number of loops has been reached, the PDC is forced to be at the H level.

FIGS. 33A, 33B, and 33C show the sequence of setting data in the data caches. First, as shown in FIG. 33A, since the data in the LDDC0, LDDC1, and LDDC2 may be inverted, all of the data in the LDDC0, LDDC1, and LDDC2 are returned to the original state. When the LDDC2 is set free, the data in the LDDC2 is inverted. When the LDDC1 is set free, the data in the LDDC1 is inverted.

Next, as shown in FIG. 33B, in an ordinary refresh operation, first, VPRE is set at Vss (VPRE=Vss) and BLPRE is set at the H level (BLPRE=H level), thereby setting the TDC at Vss (TDC=Vss). However, when the SDC is set free, BLC2 is set at the H level, thereby charging the TDC, which refreshes the LDDC0, LDDC1, and LDDC2. Then, the SDC is set at the H level (SDC=H level), or the LDDC0, LDDC1, and DDC2 of a data storage circuit written into to level 0 to level 7 are set at "1". That is, the writing of data to level F can be done.

Moreover, when the LDDC2 is set free, since the LDDC2 is at "1", signal VPRE is set at Vss (VPRE=Vss) and signal BLPRE is set at the H level (BLPRE=H level), thereby setting the TDC at Vss (TDC=Vss). Then, signal VPRE is set at Vdd (VPRE=Vdd) and signal REG of the LDDC2 is set at the H level (REG=H level). In this way, the TDC is charged and the LDDC0 and LDDC1 are refreshed, which enables data to be written to level 15 (16-valued data) and level 7 (8-valued data).

Moreover, when the LDDC1 is set free, since the LDDC1 is at "1", signal VPRE is set at Vss (VPRE=Vss) and signal BLPRE is set at the H level (BLPRE=H level), thereby setting the TDC at Vss (TDC=Vss). Then, signal VPRE is set at Vdd (VPRE=Vdd) and signal REG of the LDDC1 is set at the H level (REG=H level). In this way, the TDC is charged and the LDDC0 is refreshed, which enables data to be written to level 15 (16-valued data), level 7 (8-valued data), and level 3 (4-valued data).

Thereafter, as shown in FIG. 33C, when OMITOPSPASS is high level and level 16, signal BLC2 is made high and the data in the SDC is copied into the TDC. Thereafter, signal VPRE is made low, making all the signals REG high, which sets the TDC at the high level only when the TDC has been written into to level 0.

When OMITOPSPASS is high level and 8 levels, signal VPRE is made high and signal BLPRE is made high, thereby precharging the TDC at Vdd temporarily. Then, signal VPRE is made low, making all the signals REG high, which sets the TDC at the high level only when the TDC has been written into to level 0. Thereafter, the LDDCQ is copied into the TDC and the PDC is transferred to the DDC and then the TDC is transferred to the PDC. Similarly, the TDC is set at the H level, the LDDCP is copied into the TDC, and the PDC is transferred to the DDC. Then, the TDC is transferred to the PDC.

In this way, the PDC of a data storage circuit to be written into to level 0 is forced to be at the H level, or unselected. In FIG. 26C, after the data on the bit line in a verify operation is loaded into the TDC, signal REG is made high. This forces the data storage circuits excluding those to be verified to fail. However, after the LDDC2 is set free, write data on the next page is to be input to the LDDC2. Therefore, the LDDC2 is not moved. Similarly, after the LDDC1 is set free, the LDDC1 is not moved. After LDDC0 is set free, the LDDC0 is not moved.

When the PDC is at the L level, the write operation is carried out again and the program operation and verify operation are repeated until the data in all the data storage circuits have become high.

In the embodiment, writing has been done to level 0 in the second stage and no writing has been done to level 0 in the third stage. That is, as shown in FIGS. 27, 28, and 29, writing has been done to level 3 in the third stage, writing has been done to level 16 in the second stage, and writing has been done to level 15 in the third stage. However, no writing may be done to level 0 in the second stage and writing may be done to level 0 in the third stage. In this case, writing is done to 3-valued level in the first stage, writing is done to 15-valued level in the second stage, and writing is done to 16-valued level in the third stage. Moreover, writing may be done to level 0 in the first stage.

In a verify operation at each level, a verify level lower than the corresponding original verify level may be set. When the lower level is exceeded, writing may be done at a decreased writing speed, which makes it possible to write data in a narrower threshold voltage distribution width.

In FIGS. 13A to 13F, FIG. 15, and FIG. 17, a verify operation where the voltage of the word line becomes the lowest is a level-0 verify operation. In a verify operation at a rather low verify level 0, the voltage of the word line becomes the lowest, that is, 0 V. However, only a level-0 verify operation is carried out at another verify level. A level-0 verify operation may be carried out at 0 V without providing a rather low verify level. When the rather low level has been exceeded, the writing speed may be made slower and the writing may be stopped. This makes it possible to lower the level-0 verify level. Since the rather low level verify operation is eliminated, the writing speed can be increased.

Of course, when not only level 0 but also only arbitrary several levels have exceeded the rather low verify level, the writing speed may be made slower and the writing operation may be stopped.

When the rather low verify level has been exceeded, the operation of decreasing the writing speed and slowing down the write operation is stopped at the time of writing at a high level (e.g., level F, level F and level E, level F, level E, level D, and level C). Then, the writing speed does not get slower. Therefore, the number of loops of a program operation and a program verify operation decreases, enabling the write voltage to be made lower. Accordingly, it is possible to prevent erroneous writing due to a high write voltage.

Furthermore, as shown in FIG. 26B, after refresh operations of PDC↔LDDC0, PDC↔LDDC1, and PDC↔LDDC2, a refresh operation of PDC↔LDDCQ or PDC↔LDDCP never fails to be carried out, setting the data in PDC as LDDCQ or LDDCP. The reason is that the potential of the bit line read out is to be manipulated on the basis of the data stored in the DDCA to DDCD and SDC. Specifically, in a verify operation at a certain level, to prevent a cell written into to a level higher than the level from having been written, it is necessary to make signals REGA to REGD high and force the potential of the bit line read into the TDC to be at the low level, or unwritten.

In contrast, as shown by a broken line in FIG. 1, connecting a discharging circuit for the TDC enables the number of refresh operations to be decreased. The discharging circuit is composed of n-channel MOS transistors 62a, 62b connected in series between the node to which power supply VPRE or Vss is supplied and node N3. The gate of the transistor 62a is connected to node N1a. Signal REGP is supplied to the gate of the transistor 62b. Making node N1a of the PDC high and signal REGP high enables the charge in the TDC to be discharged.

With this configuration, even if the data in the LDDC0, LDDC1, and LDDC2 is in the PDC, making signal REGP high enables the TDC to be discharged. Thereafter, signal VPRE is made high and signal REG of the LPDC or LDDCQ is made high. This forces the TDC to be at the H level when the TDC is originally unwritten. After the data in the PDC is transferred to one of the DDCA and DDCB, the data in the TDC is transferred to the PDC. Therefore, when the PDC is originally unwritten, PDC goes to the H level. Moreover, when writing is done to a level higher than the verify level, the PDC goes to the L level, which makes it possible to prevent the verify operation from being forced to end. Instead of setting the data in the PDC as LDDCQ or LDDCP, making signal REGP high enables the PDC to be set in a state where the verify operation is not forced to end. Consequently, the number of refresh operations can be decreased.

When the rather low verify level is not used in a write operation, one of the DDCA to DDCD can be eliminated.

Furthermore, in the embodiment, while adjacent cells are written into in the writing sequence shown in FIGS. 12, 14, and 16, writing is done in a first stage, a second stage, and a third stage, or by three data inputs. However, when the coupling capacitance between the floating gates of adjacent cells is low, it is possible to write data into the selected cell in the first stage, second stage, and third stage consecutively without writing data into the adjacent cells. In this case, to write data consecutively, for example, the 16-valued levels are written in the second stage so as to be lower than the original verify level. Although all of the PDCs have been written into, if the data in DDC0, DDC1, DDC2, and SDC are left, the write data in the next third stage can be reproduced. By doing this, the data load in the third stage can be omitted. Furthermore, wiring in the first stage or the second stage may be omitted, wiring in the first stage and second stage may be omitted, and only writing in the third stage may be done.

Figures 46, 47:
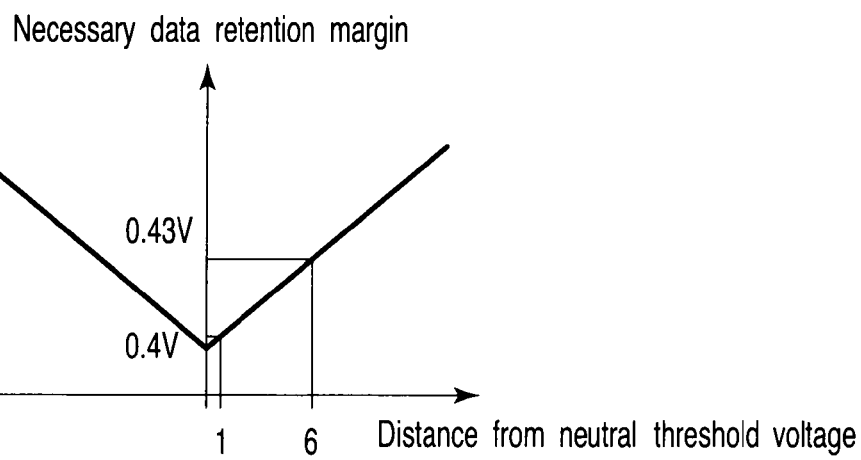
FIG. 46 is a table of differences in verify levels in the first embodiment.
FIG. 47 shows the relationship between a neutral threshold voltage and a necessary data retention margin in the first embodiment.

FIG. 46 shows the differences in verify levels shown in FIGS. 13F, 15, and 17. As shown in FIG. 47, as the distance from a neutral threshold voltage increases, the necessary data retention margin increases. Therefore, the difference shown in FIG. 46 increases as the distance from the neutral threshold voltage increases. The difference between level 0 and level 1 is greater than the difference between other levels. The reason is that the distribution of level 0 is obtained by writing data in the second stage with a large step size of, for example, dvpgm 0.3 V shown in FIG. 13C. Even if the distribution of level 0 threshold voltages becomes wider due to erroneous writing in writing data to another level, a margin is set so as to prevent the distribution from reaching the level 1 threshold voltage distribution.

However, in a normal write sequence, writing at a lower threshold level is completed earlier than an upper threshold level. Therefore, while writing is being done at the upper level, the threshold distribution of the lower level already written can spread due to erroneous writing. When the expansion of the threshold distribution is large, as shown in FIG. 46, a correction value is added to the difference, producing a corrected difference. Since erroneous writing is more liable to occur in the lower threshold level, a correction value corresponding to the lower threshold level may be made larger.

In the embodiment, to suppress this problem, data is written at 16 to 15 levels at the same time. However, of 16 to 15 levels, data may be written first at the upper levels 8 to F, or levels C to F, or levels E and F, or only level F, and then data may be written at the remaining levels.

In the embodiment, as shown in FIGS. 12, 14, and 16, writing is done in a NAND cell, starting with the cell on the source side toward the cell on the drain side. However, as shown by a solid line (a) in FIG. 48A, after writing is done to the verify level of the source-side cell (e.g., the cell connected to WL0), the cells on the drain side (WL1 to WL31) are written into, which causes a cell on the drain side (e.g., the cell connected to WL31 shown by solid line (c) in FIG. 48A) to be written into to the verify level. However, the threshold distribution of a source-side cell (e.g., the cell connected to WL0 shown by broken line (c) in FIG. 48A) becomes high. This causes a problem: the threshold distribution gets closer to the next read level, making it impossible to read correctly.

Figure 48A:
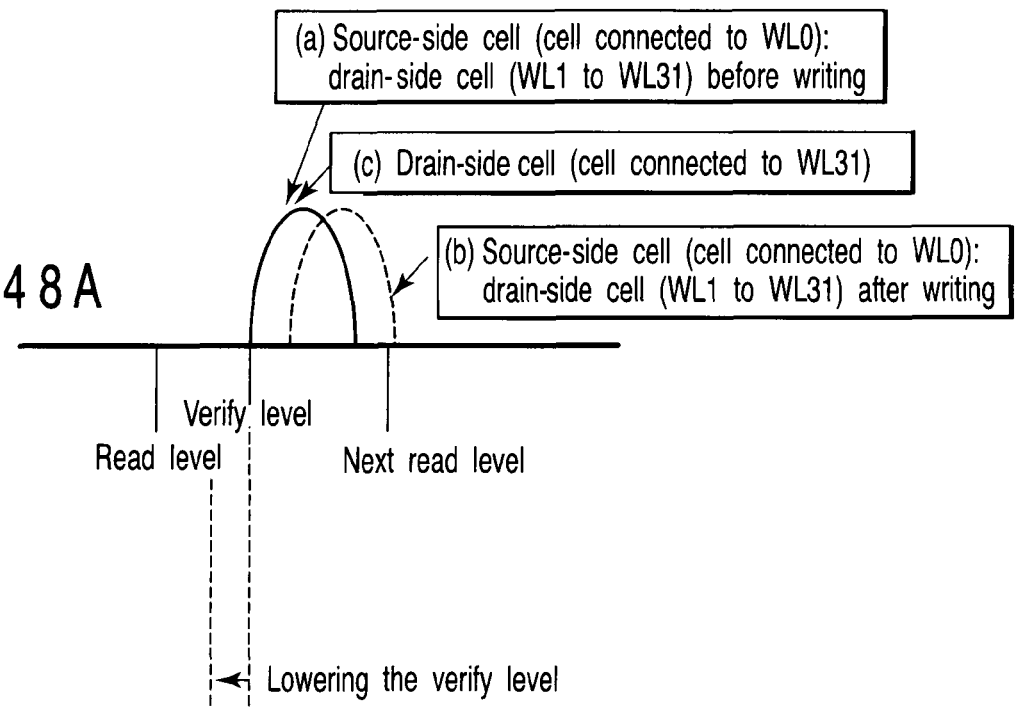
FIGS. 48A and 48B show a modification of the first embodiment.
Figure 48B:
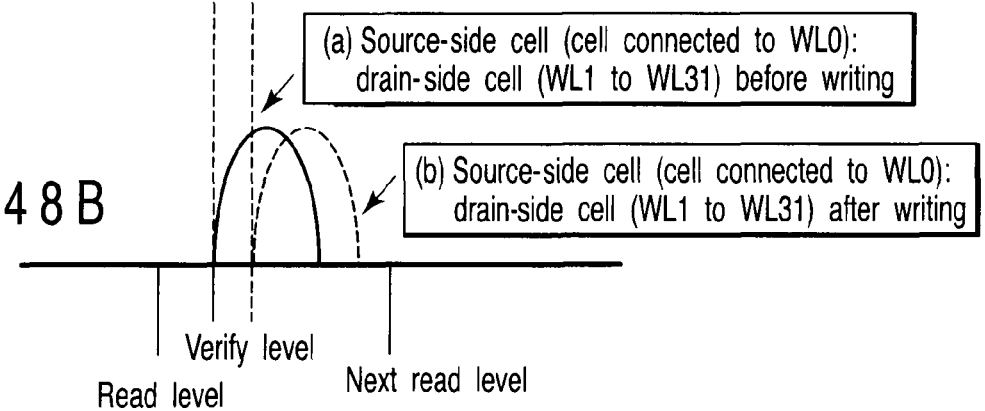

To overcome this problem, when cells on the source side are written into, the verify level is made lower than the verify level shown in FIG. 48A in advance as shown by solid line (a) in FIG. 48B. Thereafter, when cells on the drain side (WL1 to WL31) are written into, the threshold distribution of a cell on the source side (e.g., the cell connected to WL0 shown by broken line (b) in FIG. 48B) becomes lower than the next read level.

By doing this, the threshold distribution of the source-side cell (shown by broken line (b) in FIG. 48B) and the threshold distribution of the drain-side cell (shown by solid line (c) in FIG. 48A) can be set to almost the same level. The amount of shift in the threshold value of the source-side cell becomes smaller from the source-side cell toward the drain-side cell. The amount of reduction in the verify level is made smaller gradually from the source side toward the drain side. When it is difficult to decrease the amount gradually, the verify level may be lowered in units of the following set: for example, a set of WL0 to WL7, a set of WL8 to WL15, a set of WL16 to WL23, and a set of WL24 to WL31 (without lowering the verify level).

(Erase Operation)

An erase operation is carried out in blocks shown by a broken line in FIG. 3. Erasing is done simultaneously on two bit lines (BLie, BLio) connected to a data storage circuit. After the erase operation, threshold value of the cell goes to level 0 (negative potential) as shown in FIG. 10 and FIGS. 13A to 13F. In an EASB (Erase Area Self Boost) writing method, the threshold voltage of a cell to be erased from has to be made shallow.

Figure 34A:
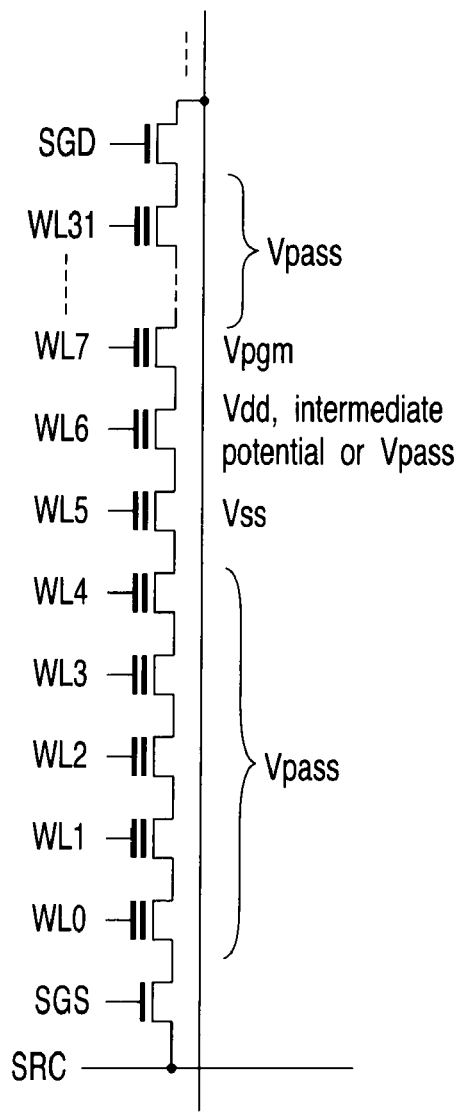
FIG. 34A is a diagram to help explain an EASB (Erased Area Self Boost) writing method and FIG. 34B shows a modification of FIG. 34A.

FIG. 34A shows the EASB writing method. In the writing method, writing is done, always starting with the memory cell on the source side. First, in the case of writing, the bit line is set at Vss. In the case of unwriting, the bit line is set at Vdd. Next, for example, when the cell connected to word line WL7 is to be written into, word lines WL0 to WL4 are set at Vpass, word line WL5 is set at Vss, word line WL6 is set at Vdd, an intermediate voltage, or Vpass, word line WL7 is set at Vpgm, and word lines WL8 to WL31 are set at Vpass. At this time, in the case of writing, the gate of word line WL7 goes to Vpgm and the channel goes to Vss, which causes writing to be done.

In the case of unwriting, the channel is generally boosted to, for example, Vpass/2. However, when the number of cells written into is large, the channel becomes hard to boost, making erroneous writing liable to occur. In the case of the EASB writing method, however, writing is done, always starting with the source side. Therefore, when word line WL5 is set at 0 V and boosting is done, since the cell connected to word lines WL4 to WL31 have been erased from, the channel is boosted, which prevents writing.

As described above, the boosted charge has to be prevented from moving to the cells already written into. When the cell connected to word line WL5 has been erased from and the threshold voltage is deep, the cell cannot be turned off. Therefore, the threshold voltage of the erased cell has to be made shallow.

In the embodiment, when writing is done in the second stage, the cells at level 0 are written into, thereby making the threshold voltage shallower. Therefore, as described below, it is not necessary to do writing to make shallower in blocks the threshold voltage of the cells whose threshold voltage is deep. However, in writing in the first stage, the threshold voltage of an adjacent cell moves from a lower level to a higher level, the threshold voltage fluctuates greatly. This causes a problem: the threshold voltage of a memory cell already written into fluctuates due to coupling capacitance. Therefore, after the erase operation, all of the word lines in the block may be selected and a program operation and a program verify operation may be carried out, thereby writing the threshold voltage of each cell after the erasure to a specific level as shown in FIGS. 13A to 13F. At this time, the program operation and program verify read operation have only to be carried out by bringing all the word lines into the selected state, in the same manner as an ordinary program operation and program verify read operation.

Figure 34B:
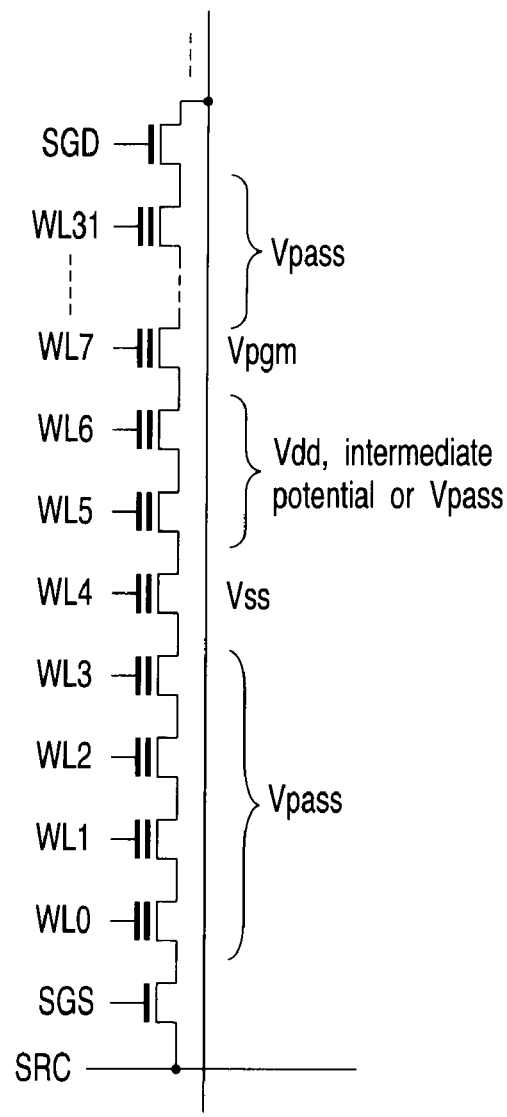

FIG. 34B is a modification of FIG. 34A. Word lines WL6 and WL5 of the two memory cells closer to the source side than the selected word line WL7 are set at Vdd, the intermediate potential, or Vpass and a third word line WL4 is set at Vss and turned off. The other word lines are set at Vpass or the intermediate potential. In this case, the cells at level 0 are not written into in the second stage, but are written into in the third stage.

(Read Operation)

Figure 35:
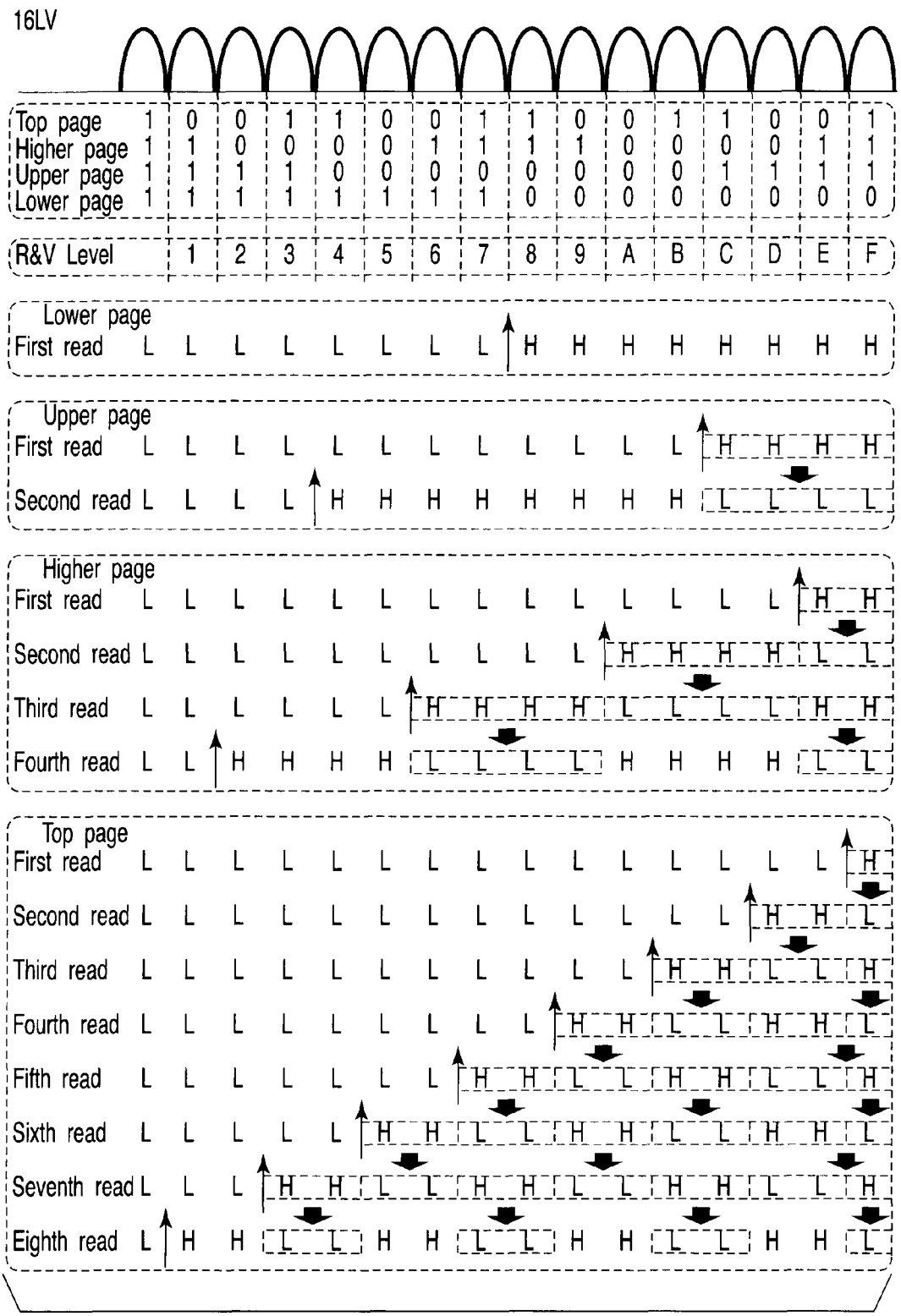
FIG. 35 is a diagram to help explain the distribution of threshold voltages after 16-level writing and data allocation on each page.

FIG. 35 shows the distribution of threshold voltages after 16-level writing and data allocation on each page.

In reading the data on a lower page, a read operation is carried out at level 8 in the read and verify level (R & V Level). Then, when the cell goes on and the potential of the bit line goes to the L level, the output data is at the H level ("1"). When the cell goes off and the potential of the bit line goes to the H level, the output data is at the L level ("0").

To read the data on an upper page, a read operation is carried out at level C and at level 4. Therefore, 2-sequence reading is needed.

To read the data on a higher page, a read operation is carried out at level E, level A, level 6 and at level 2. Therefore, 4-sequence reading is needed.

To read the data on a top page, a read operation is carried out at level F, level D, level B, level 9, level 7, level 5, level 3, and at level 1. Therefore, 8-sequence reading is needed.

Figure 37:
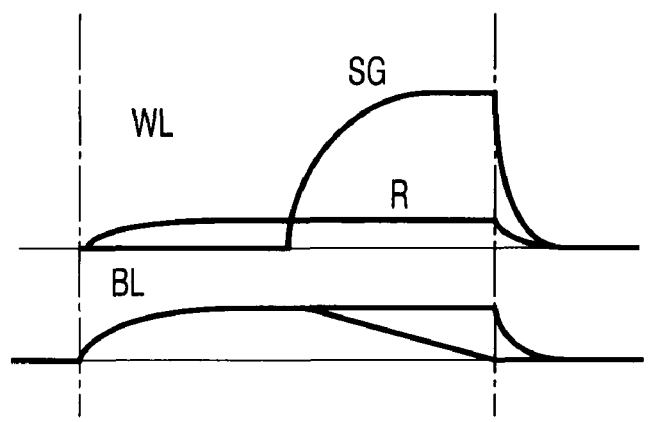
FIG. 37 is a waveform diagram showing potentials on a word line and a bit line in a read operation in one sequence.
Figure 38:
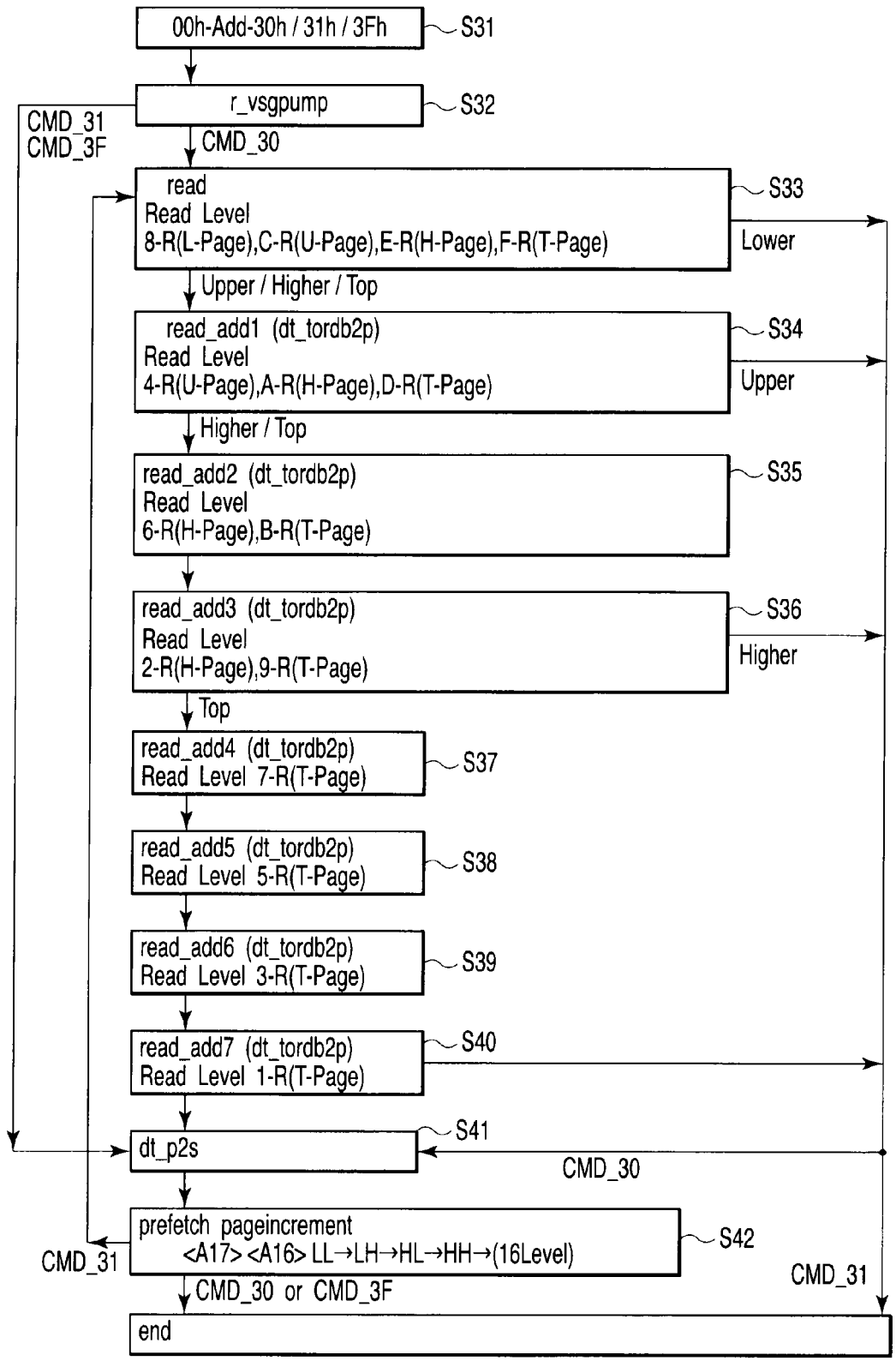
FIG. 38 shows an algorithm for a read operation.

FIG. 37 shows waveforms of a word line and a bit line in a 1-sequence read operation. FIG. 38 shows an algorithm for a read operation.

A first read operation will be explained. When a read address and a read command are input (S31), the control signal and control voltage generator circuit 7 supplies a voltage Vfix (e.g., 1.6 V) is supplied to the well of the selected memory cell, the source line, the unselected bit lines, and the select gates of the unselected blocks (S32). In the case of the lower page, a level-8 potential is supplied to the selected word line; in the case of the upper page, a level-C potential is supplied to the selected word line; in the case of the higher page, a level-E potential is supplied to the selected word line; and in the case of the top page, a level-F potential is supplied to the selected word line (S33). If the potentials of these word lines are lower than the potential Vifx of the well and source line, a negative potential is seemingly applied to the gate of the cell. At the same time, Vread is supplied to the unselected word lines of the selected block and a specific voltage is supplied to the selected gate SGD of the selected block.

Next, signal VPRE of the data storage circuit 10 shown in FIG. 1 is set at Vdd (e.g., 2.5 V), signal BLPRE is set at Vsg(Vdd+Vth), signal BLCLAMP is set at, for example, (0.6V+Vth)+Vfix temporarily, and the bit line is precharged to, for example, 0.6 V+Vfix=2.2 V. Next, a specific voltage is supplied to the select line SGS on the source side of the cell. Since the well and source are at Vfix, when the cell is turned off, the potential of the bit line remains at the H level (e.g., 2.2 V), and when the cell is turned on, the potential of the bit line is discharged and becomes equal to the same potential as that of the source, that is, Vfix (e.g., 1.6 V).

Thereafter, Vsg(Vdd+Vth) is supplied to signal BLPRE temporarily, thereby precharging node N3 of the TDC to Vdd. Then, signal BOOST is raised from the L level to the H level, thereby setting the potential at node N3 of the TDC at αVdd (e.g., α=1.7, αVdd=4.25 V).

Here, signal BLCLAMP is set at, for example, (0.45+Vth)+Vfix. Node N3 of the TDC goes to the L level (Vifx (e.g., 1.6 V)) if the potential of the bit line is lower than 0.45 V+Vfix, and remains at the H level (αVdd (e.g., 4.25 V)) if the potential of the bit line is higher than 0.45 V. Then, after signal BLCLAMP is set at Vtr (e.g., 0.1 V+Vth), signal BOOST is lowered from the H level to the L level. When the TDC is at the L level, the potential at node N3 drops from Vfix (e.g., 1.6 V) but does not go below 0.1 V since signal BLCLAMP is set at Vtr (e.g., 0.1 V+Vth). If the TDC is at the H level, the potential at node N3 changes from (αVdd (e.g., 4.25 V)) to Vdd.

Here, signal BLC1 is set at Vsg(Vdd+Vth), thereby reading the potential of the TDC into the PDC. Therefore, if the threshold voltage of the cell is lower than level 8, the PDC goes to the L level. If the threshold voltage of the cell is higher than level 8, the PDC goes to the H level, which causes reading to be done.

Reading the lower page requires only one read sequence. Therefore, after the read sequence, control is passed to step S41 (dt_p2S sequence). In step S41, the data in the PDC is moved to the SDC. The data in the SDC is transferred close to the output buffer.

Reading the upper page (S34) requires two read sequences. Reading the higher page requires four read sequences (S33 to S36). Reading the top page requires eight read sequences (S33 to S40). Therefore, after a read sequence, one sequence (or read add sequence explained later) is executed in the case of the upper page, three read sequences are executed in the case of the higher page, and seven sequence are executed in the case of the top page (S34 to S40). Thereafter, control is passed to step S41. In step S41, the data in the PDC is transferred to the SDC. The data in the SDC is transferred close to the output buffer.

(Read Add)

A second and later read operations are the same as the first read operation. The following potentials are supplied to the selected word line:

A second read operation of the upper page: level-4 potential

A second read operation of the higher page: level-A potential

A third read operation of the higher page: level-6 potential

A fourth read operation of the higher page: level-2 potential

A second read operation of the top page: level-D potential

A third read operation of the top page: level-B potential

A fourth read operation of the top page: level-9 potential

A fifth read operation of the top page: level-7 potential

A sixth read operation of the top page: level-5 potential

A seventh read operation of the top page: level-3 potential

An eighth read operation of the top page: level-1 potential

As described above, after the potential of the selected word line is set as described above, the bit line is precharged and discharged and the potential of the bit line is transferred to the TDC. In the first read operation, signal BLC1 is set at Vsg (Vdd+Vth), thereby reading the potential of the TDC into the PDC. In contrast, in the second read operation, before the potential of the TDC is read into the PDC, one of the signals DTGA to DTGD is set at the H level, thereby causing signal VPRE to be at the L level. If the data in the PDC is at the H level, after the TDC is forced to be at the L level, signal BLC1 is set at Vsg(Vdd+Vth), thereby reading the potential of the TDC into the PDC. In a read add operation, the same operation is performed three times on the higher page and the same operation is performed seven times on the top page. The data shown in FIG. 35 shows the data read into the PDC.

In the first embodiment, when 4-bit, 16-valued data are stored in a memory cell, these data can be written into the memory cell by providing a DDCA, a DDCB, a DDCC, a DDCD each composed of four dynamic data caches, and a PDC and an SDC each composed of a static data cache, in a data storage circuit. Therefore, 16-valued data can be written with latch circuits smaller in number than the threshold voltages set in the memory cells. Accordingly, the area of the data storage circuit can be reduced.

Furthermore, four data items are stored in four DDCA to DDCD. Since each of the DDCA to DDCD is composed of three transistors, its circuit configuration is simpler than that of an SDC or PDC composed of a flip-flop circuit. Therefore, use of many dynamic data caches enables the area of the data storage circuit to be reduced.

Moreover, in the middle of writing, the writing of a value with a lower threshold voltage is completed. In this case, any one of the PDC, SDC, DDCA to DDCD is set free one after another, enabling the next data to be input. Accordingly, since the input data can be prefetched, high-speed writing can be done.

When a plurality of DDCs are used, the data stored in these DDCs have to be refreshed. In general, as many refresh operations as there are DDCs are needed. A refresh operation for one DDC requires two operations: DDC→PDC and PDC→DDC. In the case of a data storage circuit using four DDCs, eight refresh operations are usually required. In the first embodiment, however, the DDC control circuit 7-1 is provided and the definition of the data stored in each DDC is changed each time the DDC is refreshed, thereby suppressing the number of refresh operations to 5. Therefore, according to the first embodiment, the writing time can be shortened.

Furthermore, the DDC control circuit 7-1 transfers data input in an arbitrary order to the DDCA to DDCD in a predetermined order and then changes the definition of the data in the DDCA to DDCD according to the input page addresses. This makes it possible to accurately control the relationship between the data input in an arbitrary order and the DDCA to DDCD and PDC.

Second Embodiment

In the first embodiment, a verify operation at one level is carried out by two read operations as shown in FIGS. 36 and 37. The invention is not limited to this.

Figure 39:
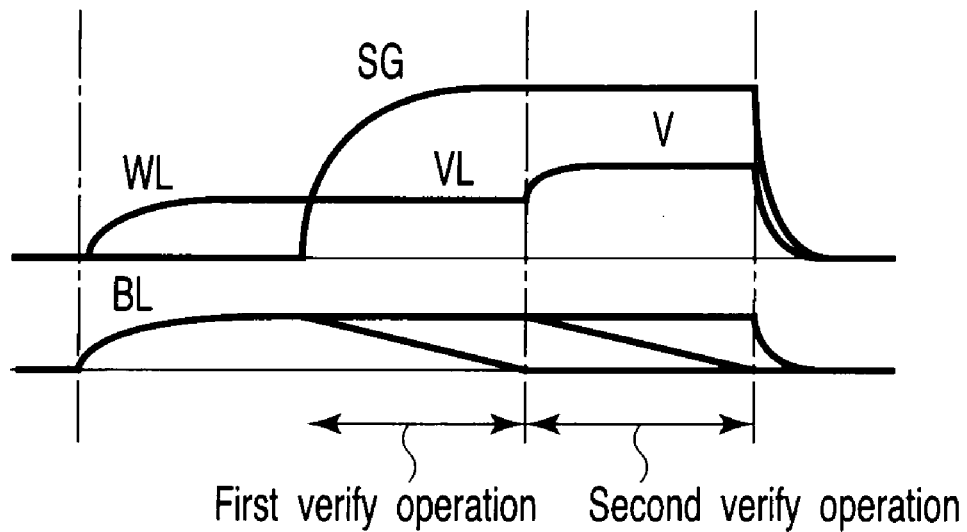
FIG. 39 is a waveform diagram showing potentials in a verify operation according to a second embodiment of the present invention.

FIG. 39 shows a second embodiment of the present invention. As shown in FIG. 39, after a bit line BL is precharged, a rather low verify voltage VL is set on a word line WL and a first verify operation is carried out. Then, the original verify voltage V is set on the word line WL and a second verify operation is carried out.

According to the second embodiment, the bit line BL is precharged once. In this state, the first verify operation at the rather low verify voltage and the second verify operation at the original verify voltage are carried out consecutively. Therefore, the charging time of the bit line can be shortened and the program operation can be made faster than when the bit line is precharged in each of the first and second verify operations.

Figure 40:
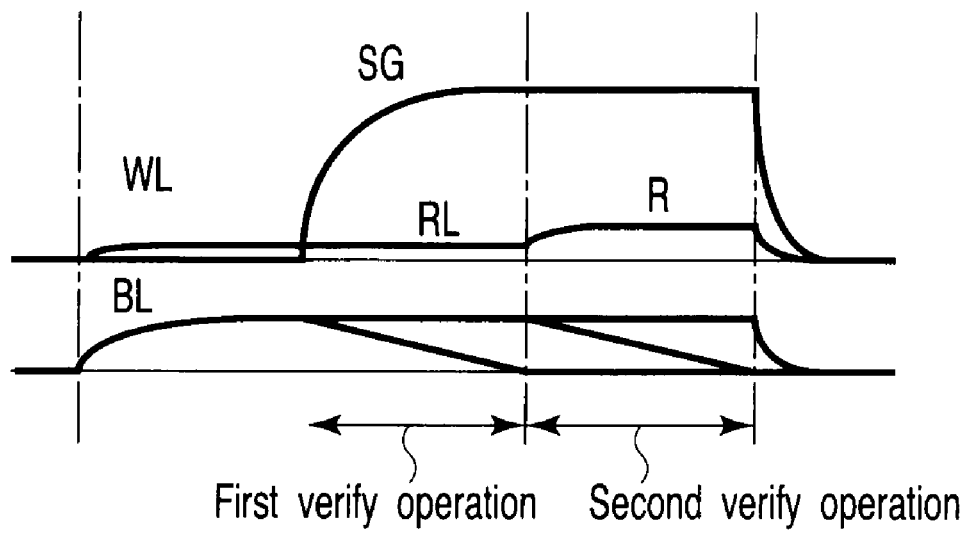
FIG. 40 is a waveform diagram showing potentials in a read operation according to the second embodiment.

FIG. 40 shows an example of a read operation in the second embodiment. As shown in FIG. 40, after the bit line is precharged, a rather low read voltage RL is supplied to the word line WL and a first read operation is performed as a dummy read. Then, the original read voltage R is supplied to the word line WL and a second read operation may be carried out at the original read voltage R. Use of a dummy read produces a similar operation to a verify operation.

Third Embodiment

Figure 41:
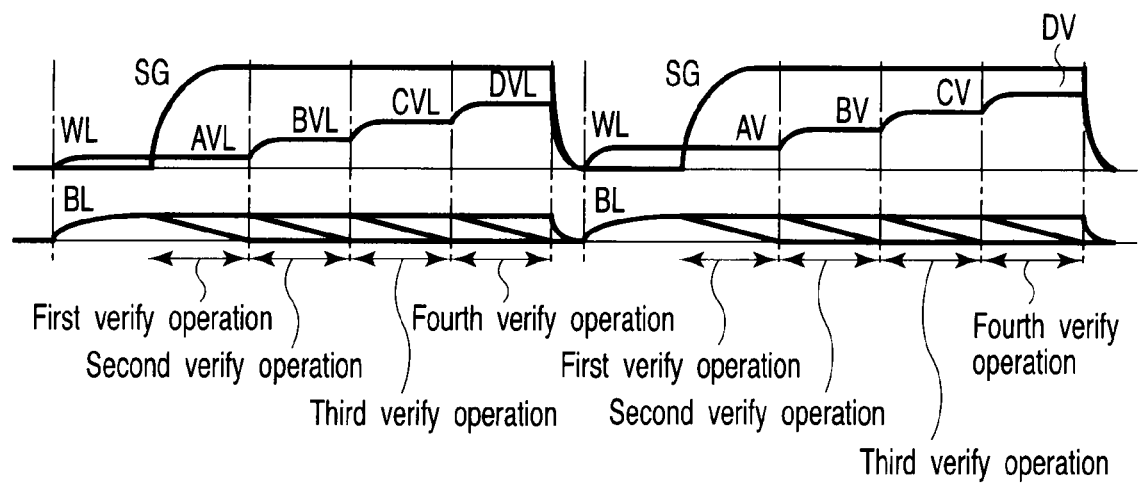
FIG. 41 is a waveform diagram showing potentials in a verify operation according to a third embodiment of the present invention.

FIG. 41 shows a third embodiment of the present invention. FIG. 41 shows a case where, after a bit line is precharged, for example, four levels are read consecutively. Specifically, after a bit line BL is precharged, a plurality of different rather low verify voltages AVL, BVL, CVL, and DVL are supplied sequentially to a word line WL. Using these verify voltages AVL, BVL, CVL, and DVL, a first to a fourth rather low verify operation are carried out consecutively. Then, after the bit line BL is precharged again, a plurality of different original verify voltages AV, BV, CV, and DV are supplied sequentially to the word line WL. Using these original verify voltages AV, BV, CV, and DV, a first to a fourth original verify operation are carried out consecutively.

In the third embodiment, four verify operations are carried out for one bit-line precharge operation. Accordingly, the number of times the bit line is precharged can be decreased, which makes it possible to make the 4-valued data writing speed faster.

Figure 42:
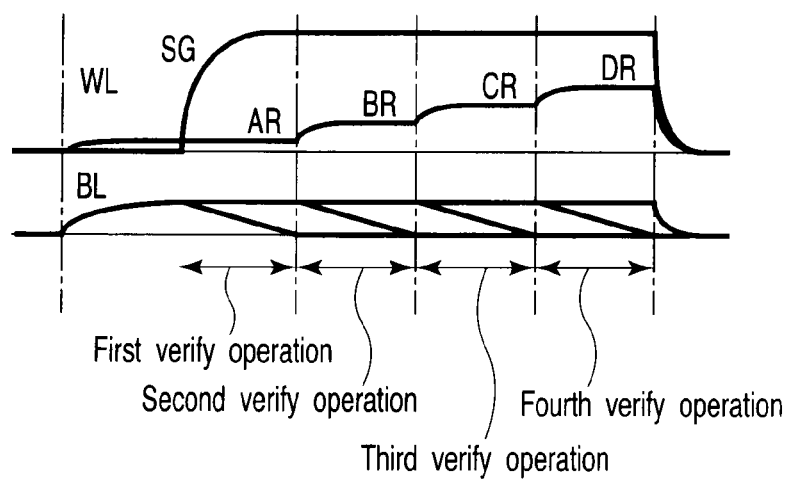
FIG. 42 is a waveform diagram showing potentials in a read operation according to the third embodiment.

Furthermore, FIG. 42 shows an example of a read operation in the third embodiment. In a read operation, levels are grouped in the same manner as in a verify operation. Specifically, in the second stage, a verify operation is carried out at 16 levels ranging from level 0 to level F. In the third state, a verify operation is carried out at 15 levels ranging from level 1 to level F. Therefore, for example, at level 0, a verify and a read operation are carried out only one level as shown in FIG. 39. At level 1 to level 3, a verify and a read operation are carried out at three levels consecutively. Moreover, at level 4 to level 7, a verify and a read operation are carried out at three levels consecutively. At level 8 to level B, a verify and a read operation are carried out at four levels consecutively. In addition, at level C to level F, a verify and a read operation are carried out at four levels consecutively.

In this way, a verify and a read operation are carried out at a plurality of levels consecutively, which makes it possible to speed up a verify and a read operation.

Fourth Embodiment

In the first to third embodiments, signal BLC1=Vsg is set on the unwritten bit lines and signal BLCRL=Vdd is set on the unselected bit lines in a program operation, thereby charging the bit lines to Vdd. However, signal BIASo (or BIASe) may be set to VLIMIT (VLIMIT≦Vdd+Vth) and signal BLSo (or BLSe) to VLIMIT, thereby setting the potential of the bit lines lower than Vdd.

As described above, setting the potential of the unselected bit lines lower than Vdd in a program operation makes it possible to suppress the amount of charge on the bit lines and further the peak current in charging, which enables the drawn current to be reduced.

Fifth Embodiment

In the first embodiment, as shown in FIG. 25E, 16-level writing requires a total of six data caches in one data storage circuit. Specifically, a PDC for distinguishing between writing and unwriting, an LDDCQ for determining whether a rather low verify level has been exceeded, and an SDC, LDDC2, LDDC1, LDDC0 for differentiating 16-bit data are needed. Level 0 indicates an erased cell from the beginning. When the level-0 program is not needed, whether the rather low verify level has been exceeded is determined on the basis of the PDC, and 15-bit data are differentiated using the SDC, LDDC2, LDDC1, and LDDC0. At the time of unwriting, all of the SDC, LLDC2, LDDC1, and LDDC0 are set at "0".

FIG. 43 shows the relationship between the data caches and data in a fifth embodiment of the present invention.

Data is set as shown in FIG. 43. In a program operation, signal BIASo (or BIASe) corresponding to the unselected bit lines is set at Vdd+Vth (or <Vdd+Vth), thereby supplying Vdd to the bit lines. In this state, only the selected bit line is brought into the floating state. If any one of the LDDC2, LDDC1, and LDDC0 is at "1", signal VPRE is set at Vss and signal REG is set at Vdd. Suppose SDC is at the L level. Then, the bit lines other than the unwritten bit lines go to Vss, going into the written state.

On the other hand, if the SDC is at the H level and all of the LDDC2, LDDC1, and LDDC0 are at "0", the bit lines remain in the floating state. However, charging the unselected bit lines to Vdd makes the potential of the bit lines close to Vdd by coupling, which makes writing unselected. Then, after signal BLCLAMP is set at Vss, signal VPRE is set at Vss, signal BLPRE is set at Vdd, signal TDC is set at Vss, signal VPRE is set at Vdd, signal REGi is set at the H level, the data in the LDDCi (i is any one of 0 to 2) is moved to the TDC, signal DTGi is set at the H level, and the data (indicating whether the rather low verify level has been exceeded) is copied into the LDDCi. In this state, after signal BLC1 is made high and the data in the TDC is moved to the PDC, signal VPRE is set at Vdd and signal REGi is set at the intermediate potential. Then, if the rather low verify level has been passed, the intermediate potential is supplied to the bit lines, which does writing a little.

In the fifth embodiment, when a level-0 program operation is not needed, whether the rather low verify level has been exceeded is determined on the basis of the PDC and 15-bit data are differentiated using the SDC, LDDC2, LDDC1, and LDDC0. Accordingly, the number of data caches can be reduced by one.

FIG. 44 shows a modification of the fifth embodiment. FIG. 44 shows a case where 7-level writing is done. In the case of 7-level writing, four data caches are required. Specifically, whether the rather low verify level has been exceeded is determined on the basis of the PDC and 7-bit data are differentiated using the SDC, LDDC1, and LDDC0. In unwriting, the SDC is set at the H level, all of the LDDC1 and LDDC0 are set at "0", and the PDC is set at "1".

FIG. 45 shows another modification of the fifth embodiment. FIG. 45 shows a case where 3-level writing is done. In the case of 3-level writing, three data caches are required. Specifically, whether the rather low verify level has been exceeded is determined on the basis of the PDC and 3-bit data are differentiated using the SDC, and LDDC0. In unwriting, the SDC is set at the H level, all of the LDDC1 and LDDC0 are set at "0", and the PDC is set at "1".

Furthermore, after the rather low verify level has been passed, the intermediate potential is supplied to the bit lines. If writing a little is not done, there is no need to store data for determining whether the rather low verify level has been exceeded. In this case, it is possible to further eliminate one data cache from the example of each of FIGS. 43, 44, and 45.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
 a memory cell array in which a plurality of memory cells connected to word lines and bit lines are arranged in a matrix;
 a first control circuit which controls the potentials of the word lines and bit lines; and
 a second control circuit which sets one of $2^k$ threshold voltages (k is a natural number of 4 or more) in the memory cells by a plurality of bits of data which correspond to first to k-th pages and, wherein the second control circuit writes to $2^k$ levels when an externally input address is an address for the k-th page.

2. The semiconductor memory device according to claim 1, further comprising a data storage circuit connected to the bit lines which includes a static latch circuit and a plurality of dynamic latch circuits.

3. The semiconductor memory device according to claim 2, wherein the second control circuit changes data stored in one of said plurality of dynamic latch circuits and data stored in the static latch circuit.

4. The semiconductor memory device according to claim 2, wherein the second control circuit includes as many converters as there are said plurality of dynamic latch circuits and static latch circuit, the converters controlling the position of the data stored in said plurality of dynamic latch circuits and the static latch circuit.

5. The semiconductor memory device according to claim 1, wherein the first control circuit precharges the bit lines and controls the voltages of the word lines, thereby carrying out a plurality of verify operations consecutively.

6. The semiconductor memory device according to claim 1, wherein the first control circuit raises the potentials of the word lines sequentially in a plurality of verify operations.

7. The semiconductor memory device according to claim 3, wherein a latch 1, a latch 2, a latch 3, . . . , and a latch k are configured by said plurality of dynamic latch circuits and said static latch circuit, and the second control circuit changes each of data stored in the latch 1, the latch 2, the latch 3, . . . , and the latch k, and stores data to the latch 2, the latch 3, . . . the latch k, and the latch 1.

8. The semiconductor memory device according to claim 2, wherein the second control circuit returns data stored in said plurality of dynamic latch circuits and said static latch circuit to an initial state by repeating change the data stored in said plurality of dynamic latch circuits and said static latch circuit a plurality of times.

* * * * *